(12) United States Patent
Masuda et al.

(10) Patent No.: US 7,053,387 B2
(45) Date of Patent: May 30, 2006

(54) PATTERN DRAWING METHOD BY SCANNING BEAM AND PATTERN DRAWING APPARATUS

(75) Inventors: Osamu Masuda, Hino (JP); Kazumi Furuta, Akishima (JP)

(73) Assignee: Konica Corporation, Tokyo (JP)

( * ) Notice: Subject to any disclaimer, the term of this patent is extended or adjusted under 35 U.S.C. 154(b) by 115 days.

(21) Appl. No.: 10/639,165

(22) Filed: Aug. 11, 2003

(65) Prior Publication Data

US 2004/0135101 A1   Jul. 15, 2004

(30) Foreign Application Priority Data

Aug. 19, 2002 (JP) ............................. 2002-238298
Aug. 28, 2002 (JP) ............................. 2002-249614

(51) Int. Cl.
*G21K 5/10* (2006.01)
(52) U.S. Cl. ................... 250/492.22; 250/492.23; 250/492.3
(58) Field of Classification Search ........... 250/492.22, 250/492.23, 492.3
See application file for complete search history.

(56) References Cited

U.S. PATENT DOCUMENTS

| | | | |
|---|---|---|---|
| 4,743,766 A * | 5/1988 | Nakasuji et al. ......... | 250/492.2 |
| 5,278,419 A * | 1/1994 | Takahashi et al. ....... | 250/492.2 |
| 6,001,513 A * | 12/1999 | Hector ........................... | 430/5 |
| 6,117,600 A * | 9/2000 | Nakasuji ....................... | 430/30 |
| 6,313,476 B1 * | 11/2001 | Shimizu et al. ......... | 250/492.22 |
| 6,333,138 B1 * | 12/2001 | Higashikawa et al. ...... | 430/296 |
| 6,472,673 B1 * | 10/2002 | Chalupka et al. ....... | 250/492.22 |
| 6,524,756 B1 * | 2/2003 | Wu ............................... | 430/5 |
| 6,646,275 B1 * | 11/2003 | Oae et al. ................ | 250/492.2 |
| 2002/0170887 A1 * | 11/2002 | Furuta et al. .......... | 219/121.19 |

FOREIGN PATENT DOCUMENTS

| JP | 53-035332 | * | 4/1978 |
|---|---|---|---|
| JP | 53-045933 | * | 4/1978 |

* cited by examiner

*Primary Examiner*—Nikita Wells
*Assistant Examiner*—Anthony Quash
(74) *Attorney, Agent, or Firm*—Frishauf, Holtz, Goodman & Chick, P.C.

(57) ABSTRACT

A pattern drawing method of drawing a desired pattern on a base material by irradiating an electronic beam and scanning the base material with the electronic beam with a predetermined dose amount, comprising: a first step of drawing a first region on the base material by scanning with the electronic beam with a first dose amount; a second step of drawing a second region on the base material by scanning with the electronic beam with a second dose amount; and a inclining step of inclining a boundary between the first region and the second region to form an inclined surface by conducting a first scanning to scan with the electronic beam with the first dose amount and a second scanning to scan with the electronic beam with the second does amount in a mixed arrangement.

17 Claims, 40 Drawing Sheets

DIFFERENT DOSE AMOUNT MIXED-REGION

FIG. 21

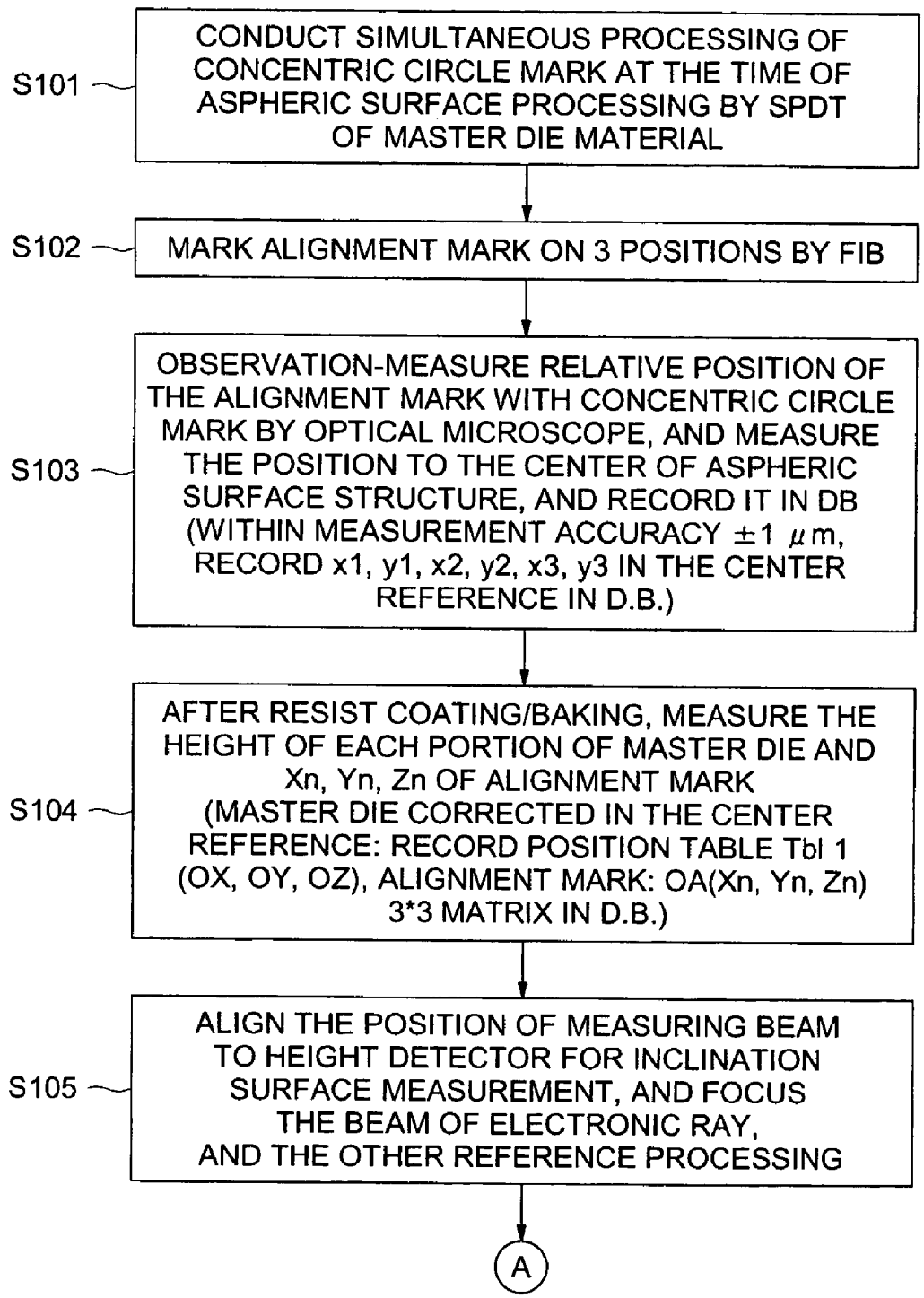

S101 — CONDUCT SIMULTANEOUS PROCESSING OF CONCENTRIC CIRCLE MARK AT THE TIME OF ASPHERIC SURFACE PROCESSING BY SPDT OF MASTER DIE MATERIAL

S102 — MARK ALIGNMENT MARK ON 3 POSITIONS BY FIB

S103 — OBSERVATION-MEASURE RELATIVE POSITION OF THE ALIGNMENT MARK WITH CONCENTRIC CIRCLE MARK BY OPTICAL MICROSCOPE, AND MEASURE THE POSITION TO THE CENTER OF ASPHERIC SURFACE STRUCTURE, AND RECORD IT IN DB (WITHIN MEASUREMENT ACCURACY ±1 μm, RECORD x1, y1, x2, y2, x3, y3 IN THE CENTER REFERENCE IN D.B.)

S104 — AFTER RESIST COATING/BAKING, MEASURE THE HEIGHT OF EACH PORTION OF MASTER DIE AND Xn, Yn, Zn OF ALIGNMENT MARK (MASTER DIE CORRECTED IN THE CENTER REFERENCE: RECORD POSITION TABLE Tbl 1 (OX, OY, OZ), ALIGNMENT MARK: OA(Xn, Yn, Zn) 3*3 MATRIX IN D.B.)

S105 — ALIGN THE POSITION OF MEASURING BEAM TO HEIGHT DETECTOR FOR INCLINATION SURFACE MEASUREMENT, AND FOCUS THE BEAM OF ELECTRONIC RAY, AND THE OTHER REFERENCE PROCESSING (A)

FIG. 26
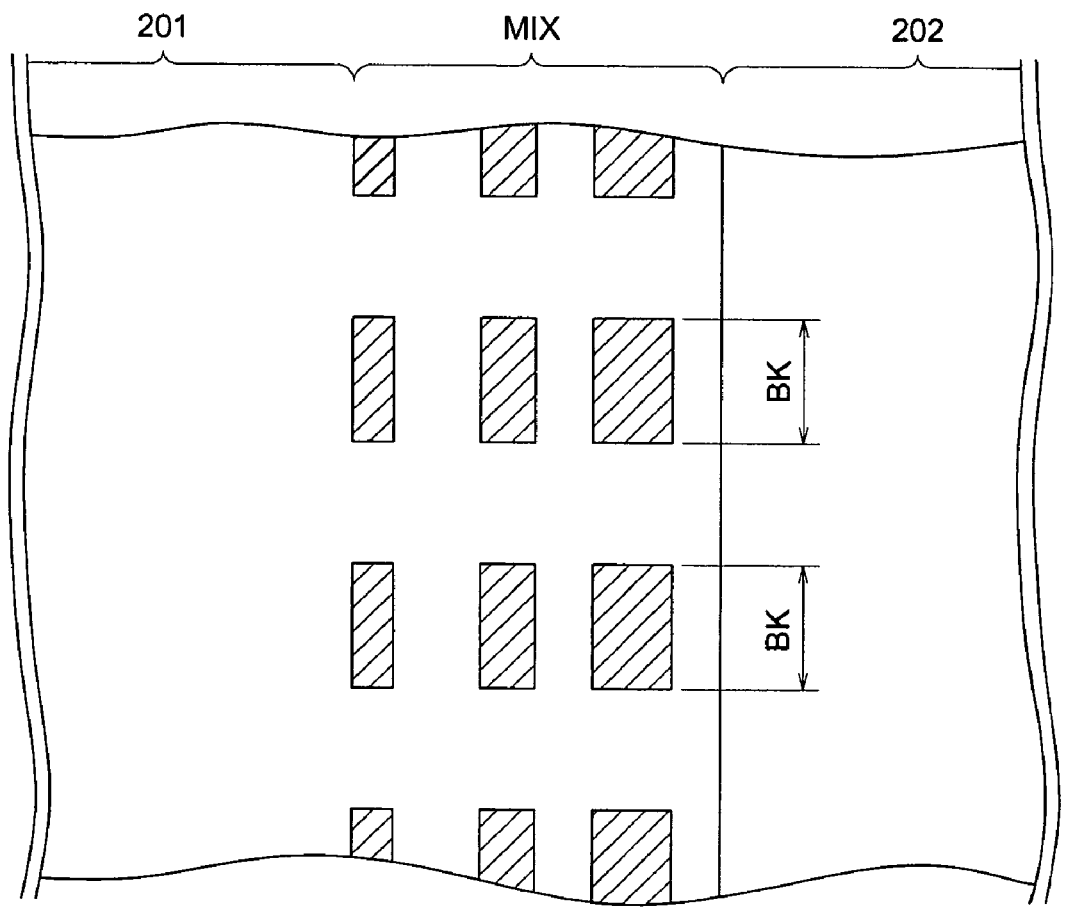
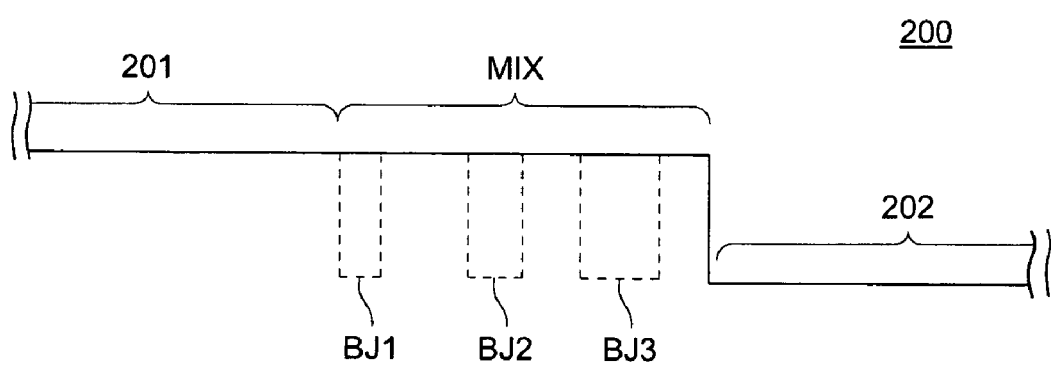

FIG. 28
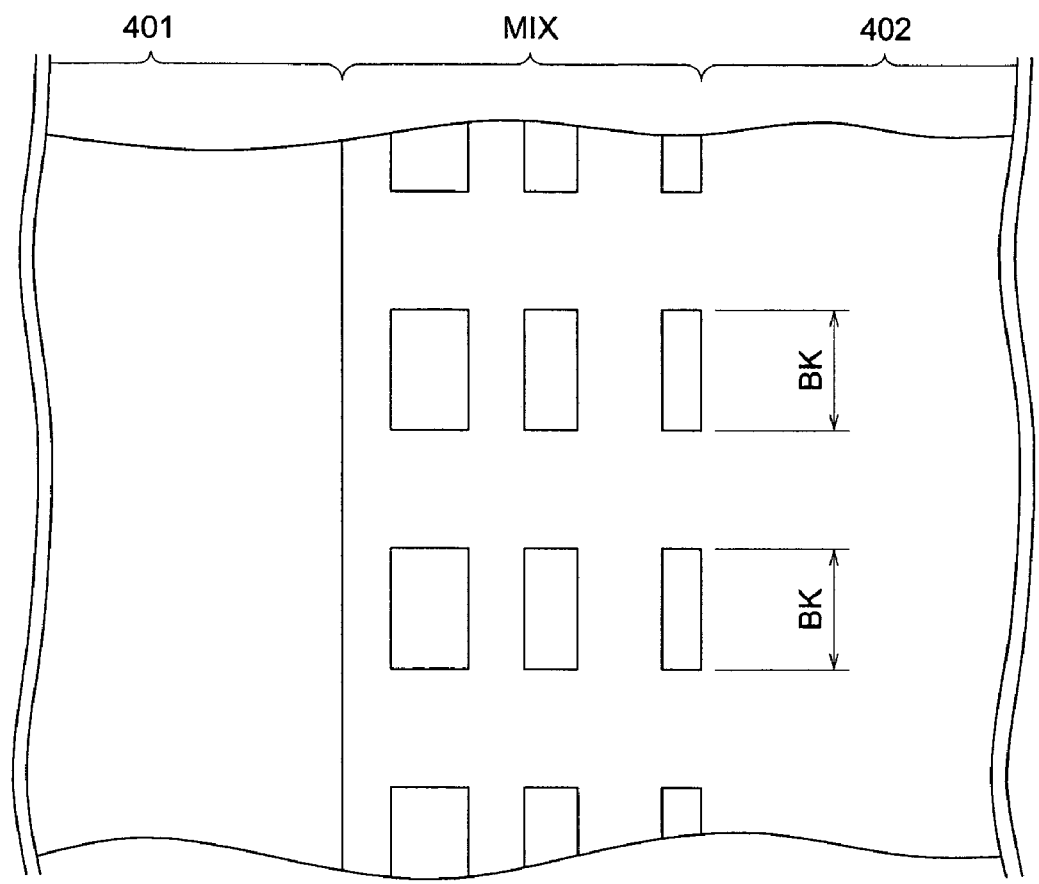
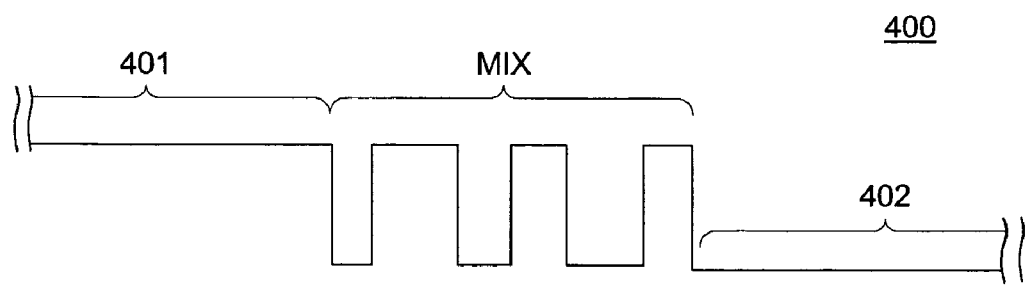

A PART OF THE POLYGON APPROXIMATED BY ANGLE NUMBER Nt

PATTERN DRAWING METHOD BY SCANNING BEAM AND PATTERN DRAWING APPARATUS

BACKGROUND OF THE INVENTION

The present invention relates to an electronic beam pattern drawing method, a production method of a molding die, a production method of moldings (molded product), and an electronic beam pattern drawing apparatus.

Conventionally, as an information recording medium, for example, CDs and DVDs are widely used. Then, many optical elements are used for a precision equipment such as a reading apparatus for reading these recording media. There are many cases where, for optical elements used for these equipments, for example, optical lenses, from a viewpoint of the cost reduction and size reduction, resin optical lenses rather than glass optical lenses are used. Such a resin optical lens is produced by a general injection molding, and also the molding die for the injection molding is formed by a general cutting processing.

In this connection, in the optical lenses, for example, an optical lens used for the reading apparatus having the interchangeability, in order to conduct the aberration correction, a fine structure of a diffractive grating structure such as a binary pattern or a blaze shape is formed.

When such a fine structure is formed, the fine structure is formed by cutting the molding die for the injection molding.

On the one hand, like as a recent pick-up lens for DVD, when the high density recording medium is read, there is a necessity to make the pattern of the diffractive grating more fine, therefore, it is necessary that the diffractive gratings of the binary pattern or blaze is made fine in a sub-micron order. As a method for drawing processing such a material, there is a limitation in the conventional cutting processing or laser processing. Therefore, the present inventor considers to use a method of optical exposure by the electronic beam.

In such a method, the electronic beam is irradiated by the electronic beam drawing apparatus onto the surface of the base material which is an original mold of the optical lens, and by scanning the beam in a predetermined drawing time period in a predetermined dose amount, the diffractive gratings of the binary pattern or blaze shape are drawn.

However, because the minimum dose resolving power of the dose amount of the electronic beam pattern drawing apparatus is determined by the minimum time resolving power of a D/A converter, the adjustment of the dose amount in such a electronic beam pattern drawing apparatus is conspicuously step-wise, when the drawing is conducted so as not to take a long period of time particularly by a high current value, and for example, when the diffractive structure such as the blaze shape is drawn, even when it is tried to form a smooth blaze inclination surface, by the difference of the resolving power of the minimum dose amount, the shape of the blaze inclination surface obtained after the drawing/development becomes step-wise.

The step-wise shape of the blaze inclination surface becomes a factor of the lowering of the optical characteristic of the optical lens, particularly a factor causing the lowering the diffraction efficiency, and further, when the quality of the products is considered, becomes a factor causing the lowering of the product value, therefore, in order together to increase the diffraction efficiency of the optical lens, with to increase also the product value, the necessity to form a smoother shape as possible is generated.

In view of the above problem, the present invention is made, and the first object is to provide an electronic beam drawing method, production method of the moldings, molding die to form moldings, and an electronic beam drawing apparatus which can suppress the step difference due to the minimum dose resolving power of the electronic beam drawing apparatus determined by the minimum time resolving power of the D/A converter and can form the smooth inclination surface.

Further, as an another problem, when the diffractive ring-shaped zonal structure of the binary pattern or blaze shape, is approximated by a polygon and drawn, as compared to a case where the diffractive ring-shaped zonal structure of the binary pattern or blaze shape is formed by an ideal circular pattern drawing, the lowering of optical characteristic of the optical lens, particularly, lowering of the diffraction efficiency are caused, further, because the portion of the joint of the drawing line in the apex of the polygon is conspicuous, when the quality of the products is considered, there is a problem that the products value is lowered from its appearance.

Accordingly, when the diffractive ring-shaped zonal structure of a binary pattern or a blaze shape, is approximated by a polygon and drawn, in order to avoid the problem of the lowering of diffraction efficiency of the optical lens generated due to this, or the problem of lowering of the product value, this is made close to an ideal circular pattern drawing as possible, and a necessity to contrive that the joint of the drawing line is made not conspicuous is generated.

In view of the above problems, the present invention is made, and the second object of the present invention is to provide an electronic beam drawing method, a production method of moldings, molding die to form the moldings, and an electronic beam drawing apparatus which can make close to a more ideal circular drawing, when the circular pattern is approximated by polygon and drawn.

SUMMARY OF THE INVENTION

The above first object can be attained by the following method and structure.

(1-1) An electronic beam drawing method by which the electronic beam is irradiated onto the base material, and by scanning the electronic beam by a predetermined dose amount, a desired drawing pattern is drawn on the base material, and which includes the first step by which, in order to draw the desired drawing pattern on the base material, the electronic beam is scanned by the first dose amount, and the first region of the base material is drawn, and the second step by which the electronic beam is scanned by the second dose amount and the second region of the base material is drawn, and inclination step by which the first scanning by which the electronic beam is scanned by the first dose amount, and the second scanning by which the electronic beam is scanned by the second dose amount, are mixed, and the boundary surface between the first region and the second region is made an inclination surface.

(1-2) The electronic beam drawing method written in (1-1), and a groove portion is formed every predetermined pitch on the curved surface portion formed on at least one surface of the base material and in at least 1 pitch of this groove portion, and in order to form a side wall portion rising from the segmentation position of the groove portion and an inclination portion which connects the apex of the side wall portion to the lowest point of the side wall portion of adjoining another groove portion, which includes the first step by which the electronic beam is scanned by the first dose amount, and the first region of the base material is drawn, and the second step by which the electronic beam is scanned by the second dose amount and the second region of the base material is drawn, and inclination step by which the first scanning by which the electronic beam is scanned by the first dose amount, and the second scanning by which the electronic beam is scanned by the second dose amount, are mixed, and the boundary surface between the first region and the second region is made an inclination surface.

(1-3) The electronic beam drawing method written in (1-1) or (1-2), and the difference between the first dose amount and the second dose amount is a dose amount of the minimum adjustment unit based on the minimum clock of the D/A converter by which an electronic gun to irradiate the electronic beam of the electronic beam drawing apparatus is driven.

(1-4) The electronic beam drawing method written in any one of (1-1) to (1-3), and in the inclination step, the first scanning for scanning the electronic beam by the first dose amount, and the second scanning for scanning the electronic beam by the second dose amount, are alternately conducted in the secondary scanning direction.

(1-5) The electronic beam drawing method written in (1-4), and the respective number of scanning of the first scanning and second scanning are adjusted corresponding to a desired inclination angle.

(1-6) The electronic beam drawing method written in (1-4) or (1-5), and a duty ratio of the first scanning in 1 pitch of the first scanning and the second scanning is adjusted corresponding to a desired inclination angle.

(1-7) The electronic beam drawing method written in any one of (1-4) to (1-6), and the respective number of scanning of the first scanning and the second scanning and the duty ratio of the first scanning in 1 pitch of the first scanning and the second scanning are adjusted corresponding to a desired inclination angle.

(1-8) The electronic beam drawing method by which the electronic beam is irradiated onto the base material and by scanning the electronic beam by a predetermined dose amount, a desired drawing pattern is drawn on the base material, and onto the curved surface portion formed on at least one surface of the base material, a groove portion is formed every predetermined pitch and in order to form a side wall portion rising from a segment position of the groove portion and an inclination portion which connects the lowest point of the side wall portion of adjoining another groove portion from the apex of the side wall portion, which includes the first step by which the electronic beam is scanned by the first dose amount and the first region of the base material is drawn, and the second step by which the electronic beam is scanned by the second dose amount and the second region of the base material is drawn, and an inclination step by which the first scanning by which the electronic beam is scanned by the first dose amount, and the second scanning by which electronic beam is scanned by the second dose amount, are mixed in the primary scanning direction, and by which a boundary surface between the first region and the second region is made an inclination surface.

(1-9) The electronic beam drawing method written in (1-8), and in the inclination step, the first scanning by which the electronic beam is scanned by the first dose amount and the second scanning by which the electronic beam is scanned by the second dose amount are alternately conducted on the same scanning line.

(1-10) The electronic beam drawing method written in (1-9), and in the inclination step, between respective adjoining scanning lines, the second scanning is conducted at a position at which they almost coincide with each other.

(1-11) The electronic beam drawing method written in (1-9), and in the inclination step, between respective adjoining scanning lines, the second scanning is conducted at a position at which they are different from each other.

(1-12) The electronic beam drawing method written in (1-9), and in the inclination step, between respective adjoining scanning lines, the second scanning is conducted zigzag.

(1-13) The electronic beam drawing method written in any one of (1-4) to (1-7), and (1-9) to (1-12), and in the intermediate step, the width between the first scanning and second scanning is made smaller than a beam diameter of the electronic beam.

(1-14) A production method of a molding die by which the molding die is produced from the base material drawn by using the electronic beam drawing method written in any one of (1-1) to (1-13), and which includes a step by which the base material onto which the electronic beam is irradiated is developed and the electric casting is conducted on the surface of the developed base material, and the molding die for the molding is formed.

(1-15) A production method of a molding die by which the molding die is produced from the base material drawn by using the electronic beam drawing method written in any one of (1-1) to (1-13), and which includes a step by which the base material onto which the electronic beam is irradiated is developed and the electric casting is conducted on the base material which is etching-processed, and the molding die for the molding is formed.

(1-16) It has a step by which an optical element is formed by using the molding die written in (1-14) or (1-15).

(1-17) It is the electronic beam drawing apparatus, and which includes a drawing means for irradiating the electronic beam onto the base material and by scanning the electronic beam by a predetermined dose amount, the base material is drawn, a storing means for storing the information relating to a dose distribution having a dose amount mixing region in which the first dose amount and the second dose amount are mixed so that a portion which is drawn by the first dose amount and a portion which is drawn by the second dose amount are mixed between a portion which is drawn by the first dose amount and a portion which is drawn by the second dose amount, when the predetermined dose amount is changed from the first dose amount to the second dose amount in order to draw a desired drawing pattern on the base material, and a control means by which the drawing means is controlled according to the dose amount mixing region of the dose distribution of the storing means.

(1-18) It is the electronic beam drawing apparatus written in (1-17), and the storing means includes a memory in which the information relating to the first dose distribution corresponding to the shape of the base material is stored, and further has a calculation means for conducting a calculation for correcting the first dose distribution to the second dose distribution corresponding to the dose amount mixing region.

(1-19) It is an electronic beam drawing apparatus, and which includes an electronic beam irradiation means for irradiating the electronic beam and an electronic lens for making the focal position of the electronic beam irradiated by the electronic beam irradiation means variable, and a placing table to place the base material having the drawing pattern drawn by irradiating the electronic beam, and a measuring means for measuring the drawing position drawn on the base material, and a storing means for storing, in order to draw a desired drawing pattern on the base material, when the dose amount of the electronic beam is changed from the first dose amount to the second dose amount, so that a portion drawn by the first dose amount and a portion drawn by the second dose amount are mixed between a portion drawn by the first dose amount and a portion drawn by the second dose amount, the information relating to the dose distribution having the dose amount mixing region in which the first dose amount and the second dose amount are mixed, and according to the drawing position measured by the measuring means, a current value of the electronic lens is adjusted, and together the focal position of the electronic beam is variably controlled corresponding to the drawing position, and for the focal position, a control means for controlling the electronic beam irradiation means so that the mixing region is drawn while the dose amount is calculated according to the dose distribution of the storing means.

(1-20) It is the electronic beam drawing apparatus written in any one of (1-17) to (1-19), and the difference between the first dose amount and the second dose amount is a dose amount of the minimum adjustment unit according to the minimum clock of the D/A converter to drive an electronic gun of the electronic beam drawing apparatus to irradiate the electronic beam.

The above second object can be attained by the following methods and structures.

(2-1) It is an electronic beam drawing method to draw a predetermined drawing pattern composed of circular pattern on the base material by scanning the electronic beam by a predetermined dose amount, and in order to draw the circular pattern on the base material, the circular pattern is approximated by a polygon and the polygon is drawn by a dose amount of one-several number-th of the predetermined dose amount to the circular pattern, and the polygon on which the predetermined number of patterns mutually shifted in the circumferential direction of the circular pattern are superimposed, is drawn.

(2-2) In the electronic beam drawing method written in (2-1), the number of angles of the polygon is determined so that the difference between the radia of the inscribed circle and the circumscribed circle of the polygon is not larger than the minimum moving distance unit of the electronic beam.

(2-3) In the electronic beam drawing method written in (2-1) or (2-2), the segments of a plurality of fields are provided in positions which pass through each of apexes of the polygon.

(2-4) It is a production method of the base material by which the molding is produced by using the electronic beam drawing method written in any one of (2-1) to (2-3), and is characterized in that it includes a process by which the base material onto which the electronic beam is irradiated is developed, and the electrocasting is conducted on the surface of the developed base material, and the molding die for molding is formed.

(2-5) It is a production method of the base material by which the molding is produced by using the electronic beam drawing method written in any one of (2-1) to (2-3), and is characterized in that it includes a process by which the base material onto which the electronic beam is irradiated is developed, subjected to an etching process and the electrocasting is conducted on the surface of the etched base material, and the molding die for molding is formed.

(2-6) It is a production method of the molding written in (2-4) or (2-5), and it has a process by which the molding is formed by using the molding die for molding.

(2-7) It is a production method of the molding written in (2-4) or (2-5), and the molding is formed of optical element.

(2-8) It structures the molding die for forming the molding written in any one of (2-1) to (2-7).

(2-9) The electronic beam drawing apparatus by which the drawing region to the base material is divided into a plurality of fields and the electronic beam is irradiated for each field, and by scanning the electronic beam by a predetermined dose amount, a predetermined drawing pattern formed of the circular pattern is drawn on the base material, and which includes an electronic beam irradiation means for irradiating the electronic beam, an electronic beam deflection means for scanning the electronic beam irradiated by the electronic beam irradiation means, a placing table for placing the base material, a measuring means for measuring the drawing position on the base material by the electronic beam, a storing means for storing the information relating to the dose distribution of the base material composed of the predetermined dose amount, and the information relating to the predetermined number for making the predetermined dose amount a value of a predetermined one-several-th, a dose amount setting means for setting the predetermined dose amount to a value of a predetermined one-several-th, according to the dose distribution and the predetermined number, and a control means by which, in order to draw the circular pattern onto the base material, the circular pattern is approximated by the polygon, and by the dose amount set by the dose amount setting means, according to the drawing position measured by the measuring means, the electronic beam is scanned by the electronic beam deflection means and the polygon is drawn, and together with it, the polygon on which the predetermined number of patterns which are mutually sifted in the circumferential direction of the circular pattern are superimposed, is controlled so that the polygon is drawn by the dose amount set by the dose amount setting means.

(2-10) It is the electronic beam drawing apparatus written in (2-9), and which further has a number of angles setting means for determining the number of angles of the polygon so that the difference between the radii of the inscribed circle and the circumscribed circle is not larger than the minimum moving distance unit of the electronic beam.

(2-11) It is the electronic beam drawing apparatus written in (2-9) or (2-10), and which further has a field position setting means for setting the segments of a plurality of fields to positions which pass through each of apexes of the polygon.

(2-12) It is the electronic beam drawing apparatus written in any one of (2-9) to (2-11), and which further has a predetermined number setting means by which the predetermined number can be arbitrarily set.

Incidentally, the first object can also be attained by the following method and structure.

(3-1) An electronic beam drawing method by which, when electronic beam is irradiated onto a base material and the electronic beam is scanned by a predetermined dose amount, a desired drawing pattern is drawn on the base material, wherein it includes the first step by which, in order to draw a desired drawing pattern on the base material, the electronic beam is scanned by the first dose amount and the base material is drawn, the second step by which the electronic beam is scanned by the second dose amount and the base material is drawn, and the third step by which, in order to provide a specific structural portion in which a portion which is drawn by the first dose amount and a portion which is drawn by the second dose amount are mixed, the base material is drawn by scanning the electronic beam by the first dose amount and the second dose amount, between the first step and the second step.

(3-2) An electronic beam drawing method written in (3-1), by which, when the electronic beam is irradiated onto the base material and the electronic beam is scanned by a predetermined dose amount, the desired drawing pattern is drawn on the base material, wherein on a curved surface portion formed at least on one surface of the base material, the diffraction grating is formed for each predetermined pitch, and in at least one pitch of this diffraction grating, in order to form a side wall portion rising from a divided position of the diffraction grating, and an inclination portion which connects the lowest point of the side wall portion of another diffraction grating adjoining from the apex of the side wall portion, the first step which scans the electronic beam by the first dose amount and draws the base material, the second step which scans the electronic beam by the second dose amount and draws the base material, and in order to provide a specific structural portion in which, between a scanning line which is drawn by the first dose amount and a scanning line which is drawn by the second dose amount, they are mixed, between the first step and the second step, the third step which scans the electronic beam by the first dose amount and the second dose amount and draws the base material, are included.

(3-3) An electronic beam drawing method according to (3-1) or (3-2), wherein the difference between the first dose amount and the second dose amount is a dose amount of the minimum adjustment unit according to the minimum clock of a D/A converter to drive an electron gun of an electronic beam drawing apparatus which irradiates the electronic beam.

(3-4) An electronic beam drawing method according to any one of (3-1) to (3-3), wherein the specific structural portion is drawn as a concave convex part formation portion in which a convex part formation portion drawn by the first dose amount and the concave part formation portion drawn by the second dose amount alternately range.

(3-5) An electronic beam drawing method according to (3-4), wherein it is drawn by adjusting the number of the scanning line which is drawn by the first dose amount and the number of the scanning line which is drawn by the second dose amount, so that the duty ratio of the concave part formation portion to one pitch of the concave convex part formation portion is decreased stepwise as the height of the inclination portion faces toward a side to be decreased.

(3-6) An electronic beam drawing method according to (3-4) or (3-5), wherein it is drawn by adjusting the number of the scanning line which is drawn by the first dose amount and the number of the scanning line which is drawn by the second dose amount, so that a pitch of the convex part formation portion constituting the concave convex part formation portion has a shape which is decreased stepwise as the height of the inclination portion faces toward a side to be decreased.

(3-7) An electronic beam drawing method according to any one of (3-4) to (3-6), wherein it is drawn by adjusting the total number of the scanning lines which are drawn by the first dose amount and the scanning lines which are drawn by the second dose amount, constituting the concave convex part formation portion of the specific structural portion corresponding to the inclination angle of the inclination portion.

(3-8) An electronic beam drawing method by which the electronic beam is irradiated onto the base material, and a desired drawing pattern is drawn on the base material by scanning the electronic beam by a predetermined dose amount, in which, to the curved surface portion formed on at least one surface of the base material, the diffraction grating is formed for each predetermined pitch, and in order to form a side wall portion rising from a divided position of the diffraction grating corresponding to at least one pitch of this diffraction grating and an inclination portion connecting the lowest point of the side wall portion of another diffraction grating adjoining from the apex of the side wall portion, the first step by which the base material is drawn by scanning the electronic beam by the first dose amount, the second step by which the base material is drawn by scanning the electronic beam by the second dose amount, and in order to provide a specific structural portion in which a portion drawn by the first dose amount and a portion drawn by the second dose amount are cyclic and repeatedly provided between the scanning line drawn by the first dose amount and the scanning line drawn by the second dose amount, between the first step and the second step, the third step by which the electronic beam is scanned by the first dose amount and the second dose amount, and the base material is drawn, are included.

(3-9) An electronic beam drawing method according to (3-8), wherein the specific structural portion is drawn as a concave convex part formation portion in which the convex part formation portion drawn by the first dose amount and the concave part formation portion drawn by the second dose amount alternately range.

(3-10) An electronic beam drawing method according to (3-9), wherein the convex part formation portion constituting the concave convex part formation portion is drawn by providing at a position which almost coincides between each of adjoining scanning lines.

(3-11) An electronic beam drawing method according to (3-9), wherein the convex part formation portion constituting the concave convex part formation portion is drawn by providing at a different position between each of adjoining scanning lines.

(3-12) An electronic beam drawing method according to (3-9), wherein the convex part formation portion constituting the concave convex part formation portion is drawn by providing at a position which is zigzag between each of adjoining scanning lines.

(3-13) An electronic beam drawing method according to any one of (3-4) to (3-7), (3-9) to (3-12), wherein the width of the convex part formation portion and the concave part formation portion constituting the concave convex part formation portion is structured not larger than the beam diameter of the electronic beam.

(3-14) A production method of a molding die to produce a molding die from the base material drawn by using the electronic beam drawing method according to any one of (3-1) to (3-13), wherein it includes a step by which the base material on which the electronic beam is irradiated, is developed, and the electro-casting is conducted on the surface of the developed base material, and the molding die for molding is formed.

(3-15) A production method of the molding die to produce the molding die from the base material drawn by using the electronic beam drawing method according to any one of (3-1) to (3-13), wherein it includes a step by which the base material on which the electronic beam is irradiated, is developed, and the electro-casting is conducted on the etching processed base material, and the molding die for molding is formed.

(3-16) It has a step for forming an optical element by using the molding die according to (3-14) or (3-15).

(3-17) A base material according to (3-16), wherein a drawing means for drawing the base material when the electronic beam is irradiated on the base material, and the electronic beam is scanned by a predetermined dose amount, in order to draw a desired drawing pattern on the base material, when the predetermined dose amount is changed from the first dose amount to the second dose amount, between the a portion drawn by the first dose amount and a portion drawn by the second dose amount, in order to draw a concave convex part formation portion as a specific structural portion in which a portion drawn by the first dose amount and a portion drawn by the second dose amount are mixed, a storing means in which the information relating to the dose distribution structured by the first dose amount and the second dose amount to draw the concave convex part formation portion is stored, and a control means for controlling the drawing means so that the specific structure is drawn according to the dose distribution of the storing means, are included.

(3-18) An electronic beam drawing apparatus according to (3-17), wherein the storing means includes a memory in which the information relating to the first dose distribution corresponding to the shape of the base material is stored, and further has a calculation means for calculating so that the first dose distribution is corrected to the second dose distribution corresponding to the concave convex part formation portion as the specific structural portion.

(3-19) An electronic beam drawing apparatus, and it includes an electronic beam irradiation means for irradiating the electronic beam, an electronic lens by which the focal position of the electronic beam irradiated by the electronic beam irradiation means is made variable, a placement table for placing the base material having the drawing pattern drawn when the electronic beam is irradiated, a measuring means for measuring the drawing position drawn on the base material, and in order to draw a desired drawing pattern on the base material, when the dose amount of the electronic beam is changed from the first dose amount to the second dose amount, between a portion drawn by the first dose amount and a portion drawn by the second dose amount, in order to draw a concave convex part formation portion as a specific structural portion in which a portion drawn by the first dose amount and a portion drawn by the second dose amount are mixed, a storing means in which an information relating to the dose distribution structured by the first dose amount and the second dose amount to draw the concave convex part formation portion, is stored, and a control means for controlling the electronic beam irradiation means so that, according to the drawing position measured by the measuring means, the current value of the electronic lens is adjusted, and the focal position of the electronic beam is variably controlled corresponding to the drawing position, and together with it, relating to the focal position, so that the concave convex part formation portion is drawn, while the dose amount is calculated according to the dose distribution of the storing means, are included.

(3-20) An electronic beam drawing apparatus according to any one of (3-17) to (3-19), wherein the difference between the first dose amount and the second dose amount is a dose amount of the minimum adjustment unit according to the minimum clock of the D/A converter which drives the electron gun of the electronic beam drawing apparatus by which the electronic beam is irradiated.

BRIEF DESCRIPTION OF THE DRAWINGS

FIG. 21 is a flow chart showing an example of the processing sequence when the base material is drawn in the electronic beam drawing apparatus according to the present invention.

FIG. 26 is an explanatory drawing showing a dose amount distribution for drawing a pattern on an inclination portion of a groove portion of the base material in the second example.

FIG. 28 is an explanatory drawing showing the dose distribution for drawing the pattern on the inclination portion of the groove portion of the base material in the third example.

DETAILED DESCRIPTION OF THE PREFERRED EMBODIMENT

Figure 1:
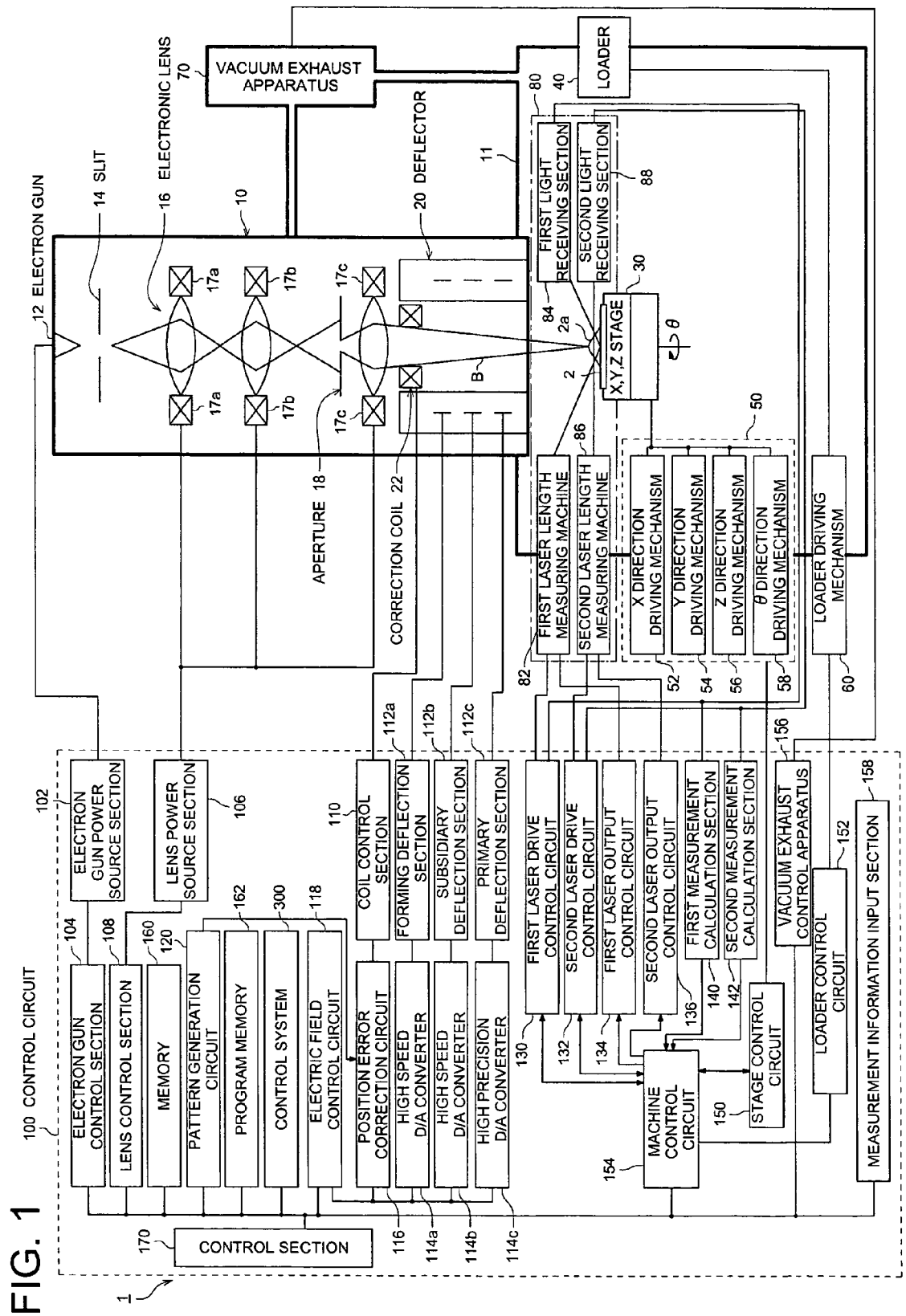
FIG. 1 is an explanatory drawing showing an example of an outline structure of an electronic beam drawing apparatus according to the present invention.

Referring to the drawings, an embodiment of the electronic beam drawing method, production method of a molding die, production method of the molding, and electronic beam drawing apparatus according to the present invention will be specifically described below.

(Structure of the Electronic Beam Drawing Apparatus)

In FIG. 1, an explanatory drawing showing the overall structure of an electronic beam drawing apparatus in the present embodiment will be shown. As shown in FIG. 1, the electronic beam drawing apparatus 1 forms an electronic line probe of the large current and high resolving power, and scans this at high speed on the base material 2 which is a drawing object, and is structured by including an electronic gun 12 which is an electronic beam generating means and forms an electronic line probe of the high resolving power, and generates the electronic beam and irradiates the beam onto a target, and a slit 14 which makes pass the electronic beam from this electronic gun 12, an electronic lens 16 for controlling a focal position of the electronic beam passing through the slit 14, to the base material 2, aperture 18 placed on a path on which the electronic beam is out-gone, and a deflector 20 which, by deflecting the electronic beam, controls so that the electronic beam scans in the X direction and Y direction on the base material 2 which is a target, and a correction coil 22 for correcting the deflection. Hereupon, each of these parts is arranged in a barrel 10, and it is maintained in a vacuum condition when the electronic beam is out-gone.

Further, the electronic beam drawing apparatus 1 is structured by including an XYZ stage 30 which is a placing table for placing the base material 2 which is a drawing object, a loader 40 which is a conveying means for conveying the base material 2 onto the placing position on this XYZ stage 30, a measuring apparatus 80 which is measuring means for measuring the reference point of the surface of the base material on the XYZ stage 30, a stage driving means 50 which is a driving means for driving the XYZ stage 30, a loader driving apparatus 60 for driving the loader, a vacuum exhausting apparatus 70 for exhausting so that the inside of the casing 11 including the barrel 10 and XYZ stage 30 is vacuum, and a control circuit 100 which is a control means for controlling them.

Hereupon, the electronic lens 16 is controlled in such a manner that each of them is controlled when a plurality of electronic lenses are generated by each of current values of each of coils 17a, 17b, 17c which are separately arranged in a plurality of positions along the height direction, and the focal position of the electronic beam is controlled.

The measuring apparatus 80 is structured by including the first laser length measuring machine 82, and the laser light (the first irradiation light) emitted by the first laser length measuring machine 82, is reflected on the base material 2, and the first light receiving section 84 which receives the reflected light, the second laser length measuring machine 86 which irradiates from the irradiation angle different from the first laser length measuring machine 82, and the laser light (the second irradiation light) emitted by the second laser length measuring machine 86, is reflected on the base material 2, and the second light receiving section 88 which receives the reflected light. In this connection, the first laser length measuring machine 82 and the first light receiving section 84 structure "the first optical system", and the second laser length measuring machine 86 and the second light receiving section 88 structure "the second optical system".

The stage driving means 50 is structured by including an X direction driving mechanism 52, which drives the XYZ stage 30 in the X direction, Y direction driving mechanism 54, which drives the XYZ stage 30 in the Y direction, Z direction driving mechanism 56, which drives the XYZ stage 30 in the Z direction, and θ direction driving mechanism 58, which drives the XYZ stage 30 in the θ direction. Hereupon, besides that, an α direction driving mechanism which can rotate and drive in the α direction centering around Y axis, and a β direction driving mechanism which can rotate and drive in the β direction centering around Y axis, are provided, and the stage may also be structured so that it can conduct pitching, yawing, rolling. Thereby, the XYZ stage 30 can be moved 3-dimensionally, or the alignment can be made.

The control circuit 100 is structured by including an electron gun power section 102, electron gun control section 104 for adjustment controlling the current, voltage in this electron gun power section 102, lens power section 106 for operating the electronic lens 16 (respective of a plurality of each of electronic lenses), and lens control section 108 for adjustment controlling each current corresponding to each electronic lens in this lens power section 106. Hereupon, the electron gun power section 102 has the D/A converter, not shown, for supplying the power to the electron gun 12, and when the electron gun control section 104 adjustment controls the current, voltage in this D/A converter, not shown, the dose amount of the electronic beam irradiated from the electron gun 12 is adjusted. Accordingly, according to the minimum clock of this D/A converter, the dose amount of the minimum adjustment unit of the electronic beam drawing apparatus is determined.

Further, the control section 100 is structured by including a coil control section 110 for controlling the correction coil 22, molding deflection section 112a to deflect for conducting the beam molding including the correction such as distortion by the deflector 20, sub-deflection section 112b to deflect for positioning the electronic beam by the deflector 20, primary deflection section 112c to conduct the deflection of X direction and Y direction by the deflector 20, high speed D/A converter 114a for conversion controlling the digital signal to the analog signal for controlling the sub-deflection section 112b, and high accuracy D/A converter 114c for conversion controlling the digital signal to the analog signal for controlling the primary deflection section 112c.

Further, the control circuit 100 is structured by including a position error correcting circuit 116 for correcting the position error in the deflector 20, that is, the position error correcting signal is supplied to each of high speed D/A converters 114a and 114b, and the high accuracy D/A converter 114c and accelerates the position error correction, or in which, when the signal is supplied to the coil control section 110, the position error correction is conducted by the correction coil 22, an electric field control circuit 118 which is an electric field control means for controlling the electric field of the electronic beam by controlling these position error correction circuit 116 and each of high speed D/A converters 114a and 114b, and the high accuracy D/A converter 114c, and a pattern generating circuit 120 for generating the drawing pattern onto the base material 2.

Further, the control circuit 100 is structured by including the first laser drive control circuit 130 for drive controlling the movement of the laser irradiation position by moving the first laser length measuring machine 82 up and down, left and right, and the angle of a laser irradiation angle, the second laser drive control circuit 132 for drive controlling the movement of the laser irradiation position by moving the second laser length measuring machine 86 up and down, left and right, and the angle of a laser irradiation angle, the first laser output control circuit 134 for adjustment controlling the output of the laser irradiation light (the light intensity of the laser) in the first laser length measuring machine 82, the second laser output control circuit 136 for adjustment controlling the output of the laser irradiation light in the second laser length measuring machine 86, the first measurement calculating section 140 for calculating the measurement result according to the light receiving result in the first light receiving section 84, and the second measurement calculating section 142 for calculating the measurement result according to the light receiving result in the second light receiving section 88.

Further, the control circuit 100 is structured by including a stage control circuit 150 for controlling the stage drive means 50, loader control circuit 152 for controlling the loader drive apparatus 60, mechanism control circuit 154 for controlling the above first, second laser drive circuits 130, 132, the first, second laser output control circuits 134, 136, the first, second measurement calculating sections 140, 142, the stage control circuit 150, loader control circuit 152, the vacuum exhausting control circuit 156 for controlling the vacuum exhaust of the vacuum exhausting apparatus 70, the measurement information input section 158 for inputting the measurement information, the memory 160 which is a storing means for storing the inputted information or the other plurality of information, a program memory 162 in which the control program for conducting each kind control is stored, a control system 300 which will be described later (the detail will be described later), and a control section 170 formed of, for example, a CPU which controls each of these sections.

Further, in the electronic beam drawing apparatus 1 of the present embodiment, in the so-called "operation system" to "operation means", each kind of command operation such as the selection of the analog scan system/digital scan system, or the selection from a plurality of drawing patterns of the basic shape can be conducted.

In the electronic beam drawing apparatus 1 having the structure as described above, when the base material conveyed by the loader 40 is placed on the XYZ stage 30, after the air or dust in the barrel 10 and casing 11 is exhausted, the electronic beam is irradiated from the electron gun 12.

The electronic beam irradiated from the electron gun 12, is deflected by the deflector 20 through the electronic lens 16, and the drawing is conducted when the deflected electronic beam B (hereinafter, there is a case where, only relating to the electronic beam deflection controlled after transmitted this electronic lens 16, a symbol "electronic beam B" is given), is irradiated onto the surface of the base material on the XYZ stage 30, for example, onto the drawing position on the curved surface portion (curved surface) 2a.

At this time, by the measuring apparatus 80, the drawing position (Z direction position which is at least the height position in the drawing positions of X direction position, Y direction position, and Z direction position) on the base material 2 or the position of the reference point as will be described later is measured, and the control circuit 100, according to the measurement result, adjustment controls each current value flowing in the coil 17a, 17b, 17c of the electronic lens 16, and controls the position of the focal depth of the electronic beam B, that is, the focal position, and movement-controls the focal potion so that it is the drawing position.

Alternatively, according to the measurement result, when the control circuit 100 controls the stage drive means 50, the control circuit 100 moves the XYZ stage 30 so that the focal position of the electronic beam B is the drawing position.

Further, in the present example, the control of the focal position may also conduct according to either one of the control of the electronic beam, or the control of the XYZ stage 30, or conduct by using both of them.

(Measuring Apparatus)

Next, referring to FIG. 6, a measuring apparatus 80 will be described. In more details, as shown in FIG. 6, the measuring apparatus 80 has the first laser length measuring machine 82, first light receiving section 84, the second laser length measuring machine 86, and second light receiving section 88.

The first light beam S1 is irradiated onto the base material 2 from the direction crossing the electronic beam by the first laser length measuring machine 82, and by the light reception of the first light beam S1 transmitting the base material 2, the first light intensity distribution is detected.

Figure 2:
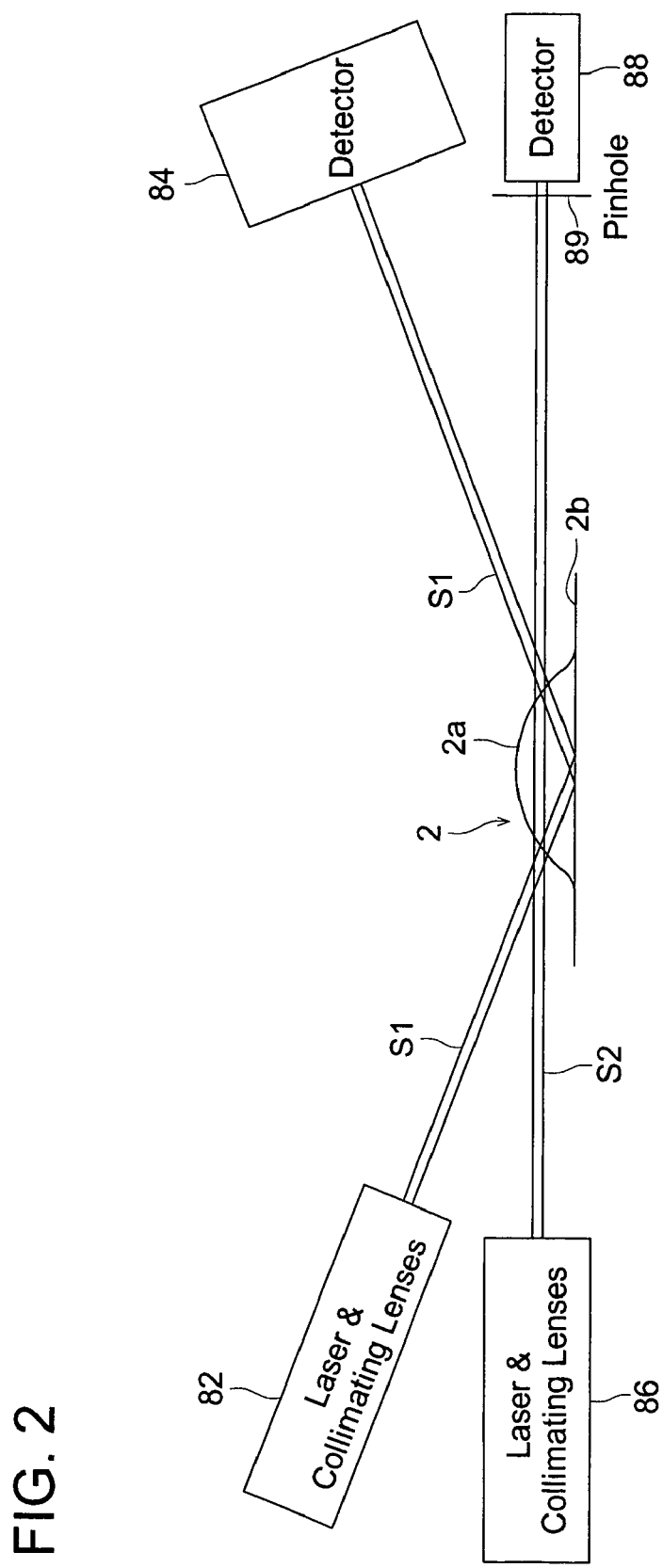
FIG. 2 is an explanatory drawing for explaining the principle of a measuring apparatus.

In this case, as shown in FIG. 2, because the first light beam S1 is reflected on the flat portion 2b of the base material 2, according to the first intensity distribution, the (height) position on the flat portion 2b of the base material 2 is measured and calculated. However, in this case, the (height) position on the curved surface portion 2a of the base material can not be measured.

Then, in the present example, the second laser length measuring machine 86 is further provided. That is, by the second laser length measuring machine 86, the second light beam S2 is irradiated onto the base material 2 from an almost orthogonal direction to the electronic beam different from the first light beam S1, and when the second light beam S2 transmitting the base material 2 is received through a pin hole 84 including in the second light receiving section 88, the second light intensity distribution is detected.

In this case, as shown in FIG. 3(A) to (C), because the second light beam S2 transmits on the curved surface portion 2a, according to the second intensity distribution, the (height) position on the curved surface portion 2a protruding from the flat portion 2b of the base material 2 can be measured and calculated.

Specifically, when the second light beam S2 transmits a specific height of a certain position (x, y) on the curved surface portion 2a in the XY reference coordinate system, in this position (x, y), as shown in FIG. 7(A) to (C), when the second light beam S2 hits the curved surface of the curved surface portion 2a, the scattered light SS1, SS2 are generated, and the light intensity for an amount of these scattered light is reduced. As described above, as shown in FIG. 4, according to the second light intensity distribution detected in the second light receiving section 88, the position is measured and calculated.

Figure 4:
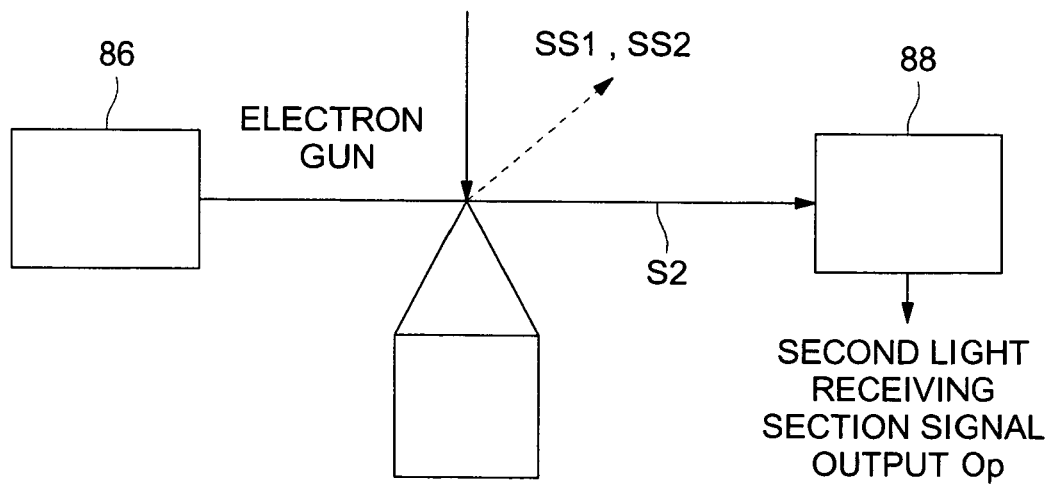
FIG. 4 is an explanatory drawing showing the relationship of the floodlight and acceptance of a measuring apparatus.
Figure 5:
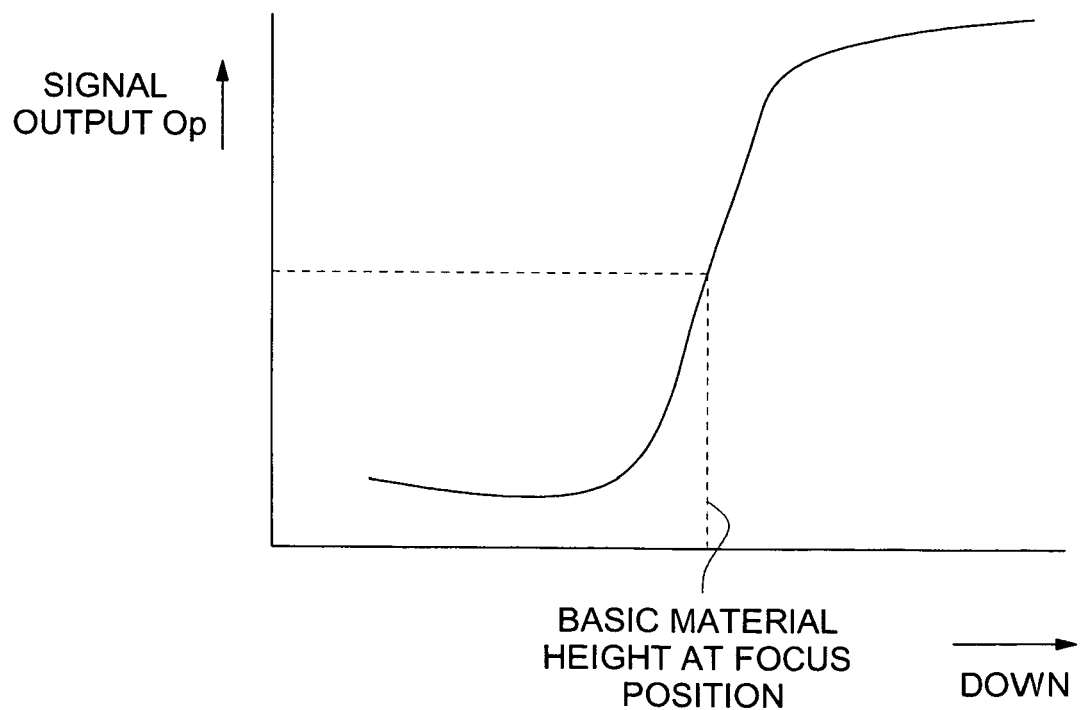
FIG. 5 is a characteristic view showing the relationship between a signal output and the height of the base material.

At the time of this calculation, as shown in FIG. 4, because the signal output Op of the second light receiving section 88 has the correlation with the signal output Op and the height of the base material 2, as shown in the characteristic view in FIG. 5, when the correlation table showing this characteristic, that is, the correlation, is previously accommodated in the memory 160 of the control circuit 100, according to the signal output Op in the second light receiving section 88, the height position of the base material can be calculated.

Then, this height position of the base material is made, for example, the drawing position, and the focal position of the electronic beam is adjusted and drawn.

(The Outline of the Principle of the Drawing Position Calculation)

Next, in the electronic beam drawing apparatus 1, the outline of the principle of the drawing position calculation when the pattern is drawn will be described.

Figure 6A:
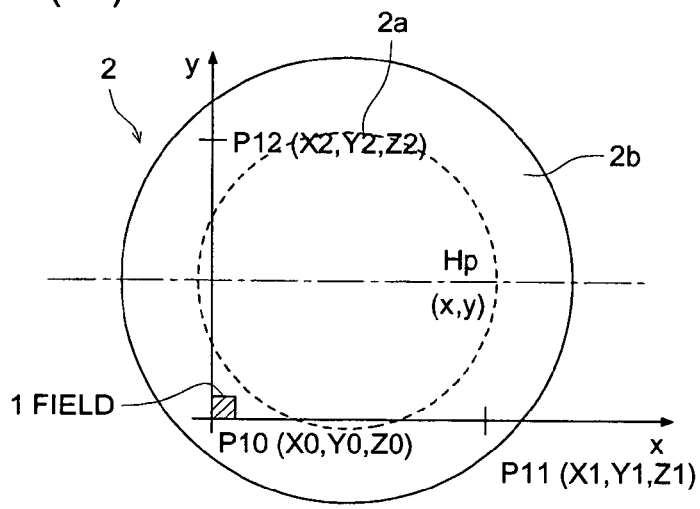
FIGS. 6(a), 6(b), 6(c) are explanatory drawings showing the base material drawn by an electronic beam drawing apparatus according to the present invention and an explanatory drawing for explaining its drawing principle.
Figure 6B:
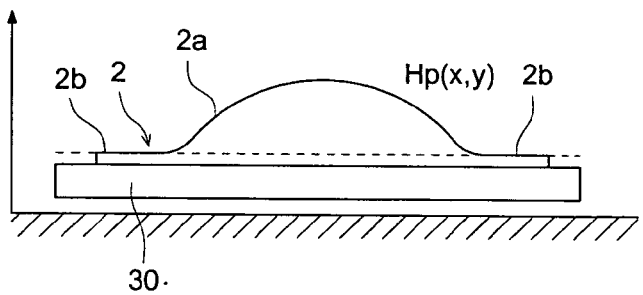

Initially, as shown in FIG. 6(A), (B), it is preferable that the base material 2 is formed of, for example, an optical element of resin, for example, an optical lens, and is structured by including the flat portion 2b of the cross section which is almost plane-like, and the curved portion 2a forming the curved surface which is formed protrusively from this flat portion 2b. The curved surface of this curved portion 2a is not limited to the spherical surface, but may be the free curved surface such as an aspheric surface, having the change in other all height directions.

In such a base material 2, before the base material is previously placed on the XYZ stage 30, a plurality of, for example, 3 reference points P00, P01, P02 on the base material 2 are determined, and this position is measured (the first measurement). Thereby, the X axis is defined by, for example, the reference points P00 and P01, the Y axis is defined by the reference points P00 and P02, and the first reference coordinate system in the 3 dimensional coordinate system is calculated. Herein, the height position in the first reference coordinate system is defined as $H_0$ (x, y) (the first height position). Thereby, the thickness distribution of the base material 2 can be calculated.

On the one hand, also after the base material 2 is placed on the XYZ stage 30, the same processing is conducted. That is, as shown in FIG. 6(A), a plurality of, for example, 3 reference points P10, P11, P12 on the base material 2 are determined, and this position is measured (second measurement). Thereby, for example, the X axis is defined by the reference points P10 and P11, and Y axis is defined by the reference points P10 and P12, and the second coordinate system in the 3 dimensional coordinate system is calculated.

Further, the coordinate conversion matrix for converting the first reference coordinate system into the second reference coordinate system by these reference points P00, P01, P02, P10, P11, P12 is calculated, and by using this coordinate conversion matrix, the height position $H_P$ (x, y) (the second height position) corresponding to the $H_0$ (x, y) in the second reference coordinate system is calculated, and this position is made the optimum focal position, that is, the drawing position, and a position onto which the focal position of the of the electronic beam is to be focused. Thereby, the thickness distribution of the above base material 2 can be corrected.

Hereupon, the above second measurement is can be conducted by using the measuring apparatus 80 which is the first measuring means of the electronic beam drawing apparatus 1.

Then, it is necessary that the first measurement is previously conducted by using an another measuring apparatus at an another place. As such a measuring apparatus for previously measuring the reference point before the base material 2 is placed on the XYZ stage 30, the measuring apparatus 200 (the second measuring means) of the entirely same structure as the above-described measuring apparatus 80 can be adopted.

In this case, the measurement result from the measuring apparatus is inputted into the measurement information input section 158 shown in, for example, FIG. 1, or data-transferred through a network, not shown, connected to the control circuit 100, and stored in the memory 160. Of course, a case is also considered where this measuring apparatus becomes unnecessary.

In the manner as described above, the drawing position is calculated, and the focal position of the electronic beam is controlled and the drawing is conducted.

Figure 6C:
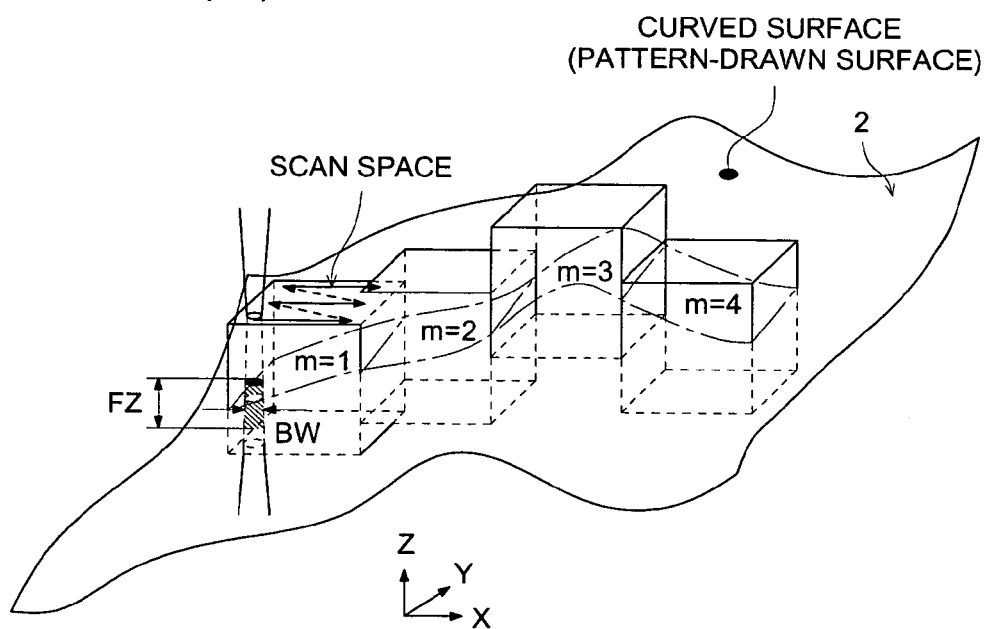
Figure 7:
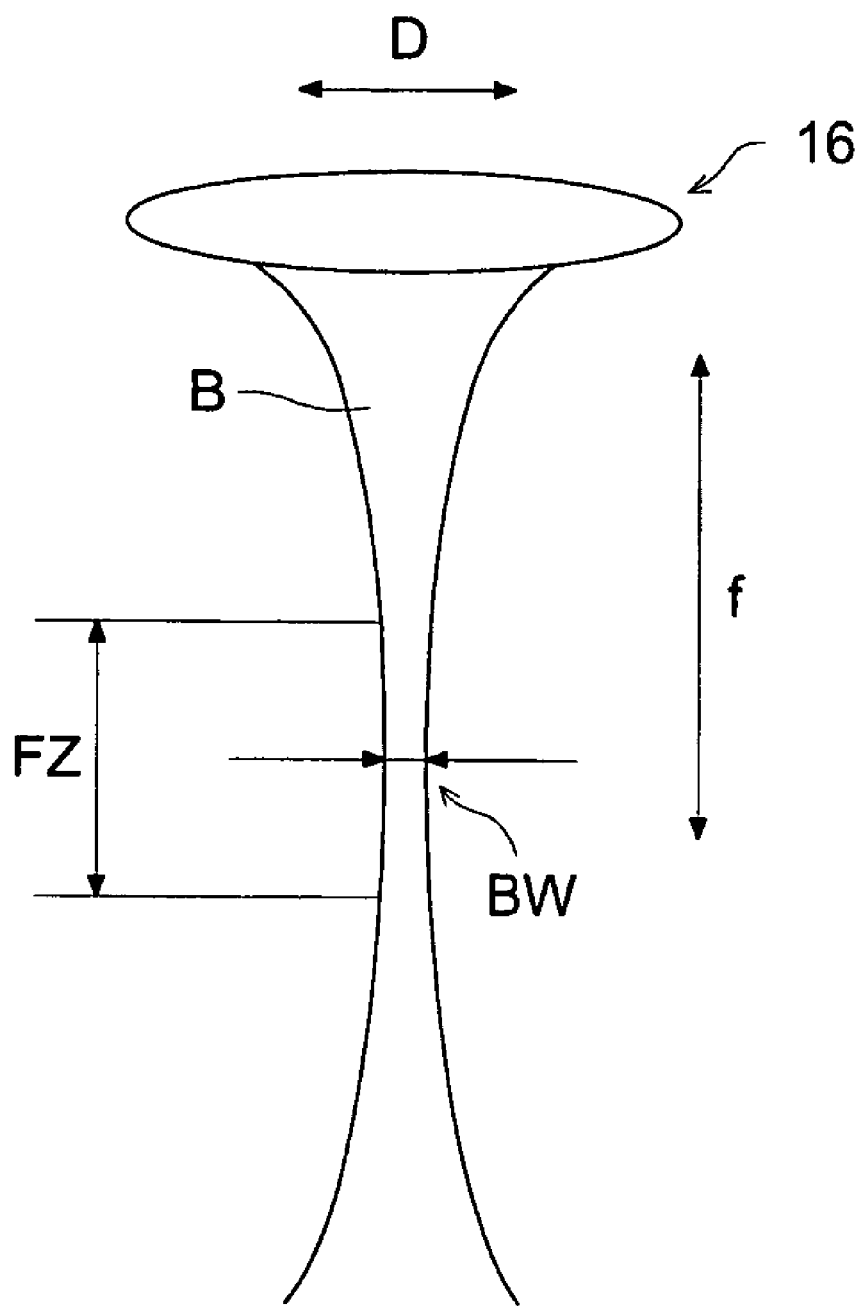
FIG. 7 is an explanatory drawing for explaining the beam waist in the electronic beam drawing apparatus.

Specifically, as shown in FIG. 6(C), the focal position of the focal depth FZ (beam waist BW) of the electronic beam is adjustment-controlled at the drawing position in the scan space (m=1) which is a unit space in the 3 dimensional reference coordinate system on the maximum possible scan region of the electronic beam. (The control of this focal position is, as described above, conducted by either one or both of the adjustment of the current value by the electronic lens 16 or the drive control of the XYZ stage 30). Hereupon, in the present example, the amount of the height of the scan space is set so that it is longer than the focal depth FZ, however, it is not limited to this. Herein, the focal depth FZ is, as shown in FIG. 7, in the electronic beam B irradiated through the electronic lens 16, the beam waist BW shows the height of the effective area. Hereupon, in the case of the electronic beam B, as shown in FIG. 7, when the width of the electronic lens 16 is D, and the depth from the electronic lens 16 to the beam waist BW (the narrowest portion of the beam diameter) is f, D/f is about 0.01, and for example, has the resolving power of about 50 nm, and the focal depth is, for example, about several tens µm.

Then, as shown in FIG. 6(C), for example, when the electronic beam is successively scanned in the X direction while shifting in the Y direction in the scan space, the drawing on the target field (drawn area) is conducted. Further, in the scan space, when there is a not drawn-field, the field is made the next target field, and the electronic beam moves in the Z direction while the above-described control of the focal position is being conducted, and the drawing processing by the same scanning is conducted.

Next, after the drawing in the scan space is conducted, for example, while the drawn-space of m=2, and the drawn-space of m=3, as the next scan spaces, are successively, in the same manner as above, conducting the measurement, or the calculation of the drawing position, the drawing processing is conducted in the real time. In this manner, when all drawing are completed for the drawing area to be drawn, the drawing processing on the surface of the base material 2 is completed.

Hereupon, in the present example, this drawing area is made the drawn-layer, and a portion corresponding to the curved surface of the surface of the curved surface portion 2a is made a drawn surface.

Further, a processing program which conducts the processing as described above of each kind of calculation processing, measurement processing, and control processing, is previously accommodated in the program memory 162 as the control program.

(Drawing Sequence)

Figure 8A:
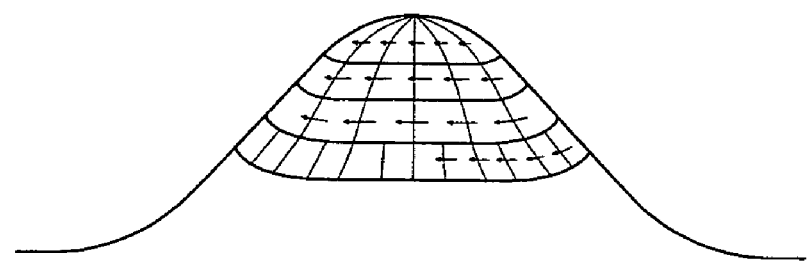
FIGS. 8(a) and 8(b) are explanatory drawings showing the drawing order.
Figure 8B:
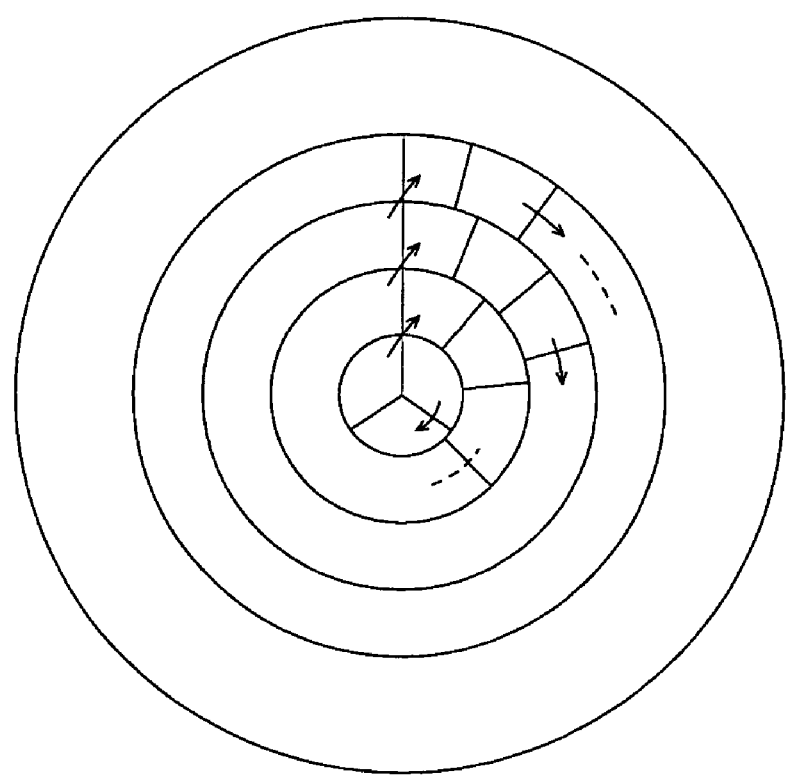

The curved surface portion of the base material 2 placed on the XYZ stage 30 in FIG. 1, is divided into a plurality of fields (drawn-areas) as shown in FIG. 8(a) and 8(b), and each field is conveyed into the possible-maximum scan region in the scan space in which the electronic beam in FIG. 1 is scanned, in a predetermined sequence. The drawing pattern allotted to the field (called target field) conveyed to the scan area is drawn in such a manner that the electronic beam is scanned in X direction and Y direction. When the drawing of the drawing pattern allotted to this target field is completed, the adjoining field is made the next target field, and the next drawing is started. As described above, the drawing method of the present embodiment is a step and repeat system by which the drawing is conducted for each field.

In the example of the field arrangement of FIG. 8(a) and FIG. 8(b), each field is concentrically arranged and each field has the sector-shape. As described above, as the drawing sequence of the plurality of fields concentrically arranged, for example, there is a method by which the drawing is conducted successively in the lower direction in such a manner that the drawing is conducted for the field of the first group which positions at the top portion of the center of the concentric circle, and next, the drawing is conducted for the field of the second group on the same circumference which positions at the lower portion of the field of the first group, and further, next, the drawing is conducted for the field of the third group on the same circumference which positions at the lower portion of the field of the second group, but the drawing sequence of the present invention is not limited to this method.

(Drawing Pattern)

Figure 9:
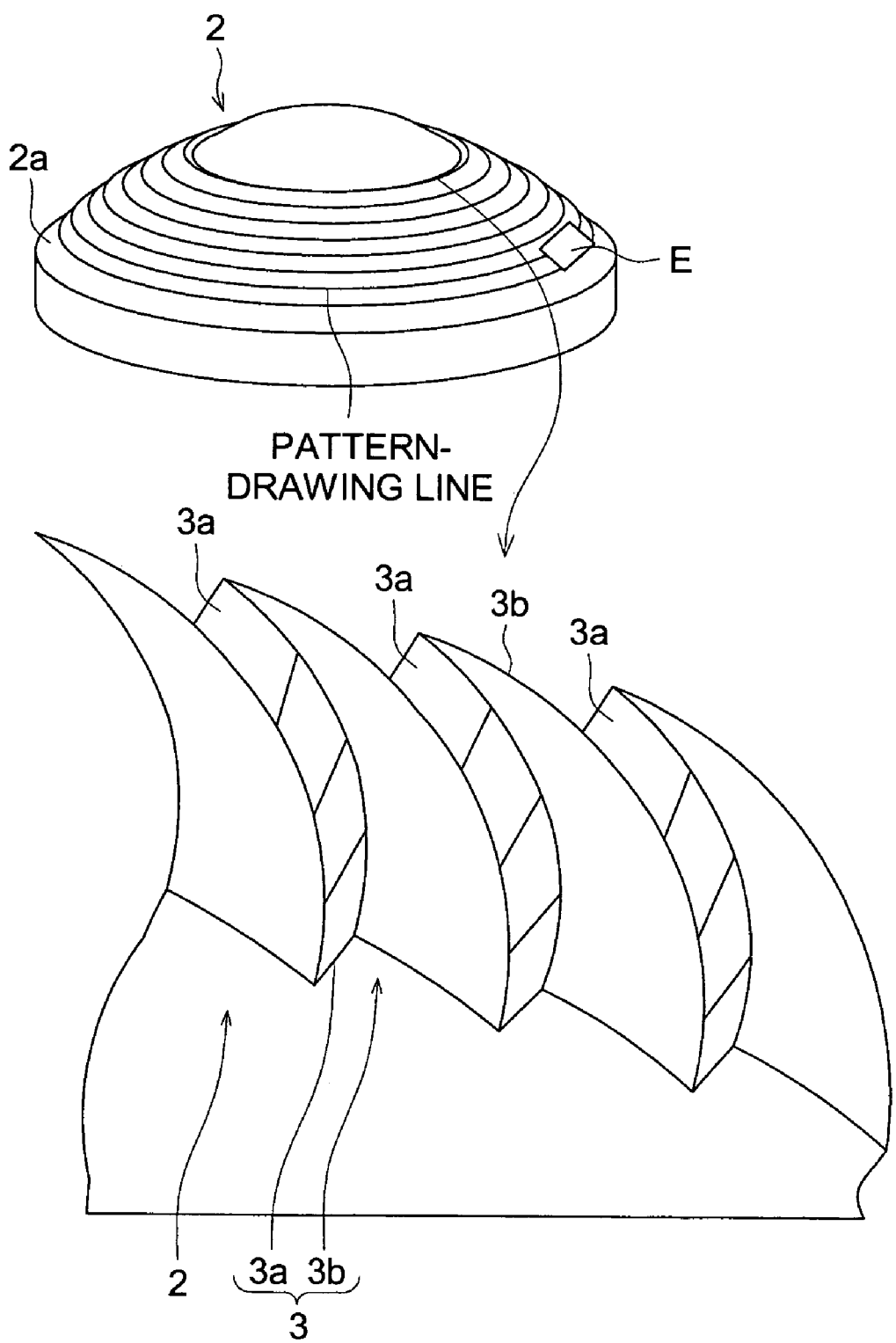
FIG. 9 is a view showing an example of the drawing.

After the development processing of the base material 2, as an example of the drawing pattern drawn on its one surface, the circle drawing and the drawing shape of its detail are shown in FIG. 9. As shown in FIG. 9, on one surface of the base material 2, as an example of the drawing pattern, the circle drawing is conducted, and further, when E portion which is a portion of this circle drawing is enlarged, on the base material 2, a plurality of groove portions 3 which can be applied on the diffractive structure of the blaze shape are formed. The groove portion 3 is formed by the inclination portion 3b and a side wall portion 3a, and a plurality of stages of the side wall portion 3b are formed along the peripheral direction plane-likely.

The First Embodiment

Initially, the present embodiment to attain the first object is characterized in that: when the electronic beam drawing is conducted in order to form the groove portion on one surface of the base material, particularly, in order to draw the inclined surface of the groove portion, when the dose distribution is changed, for example, from the first dose amount to the second dose amount, on a boundary portion of them, when the dose amount mixing area in which the first dose amount and the second dose amount are mixed, is provided, a gentle groove portion inclination portion in which the step difference due to the minimum dose resolving power of the electronic beam drawing apparatus which is determined by the minimum time resolving power of the D/A converter after the development processing, is suppressed, can be obtained.

Further, in the present embodiment, a case where the groove portion of the groove portion shape is formed while the circle drawing is conducted on one surface of the base material forming the curved surface shape, is taken as an example, and the description will be continued below, but the present invention is not limited to the circle drawing, and one surface of the base material may also be, for example, a plane.

THE FIRST EXAMPLE

Figure 10:
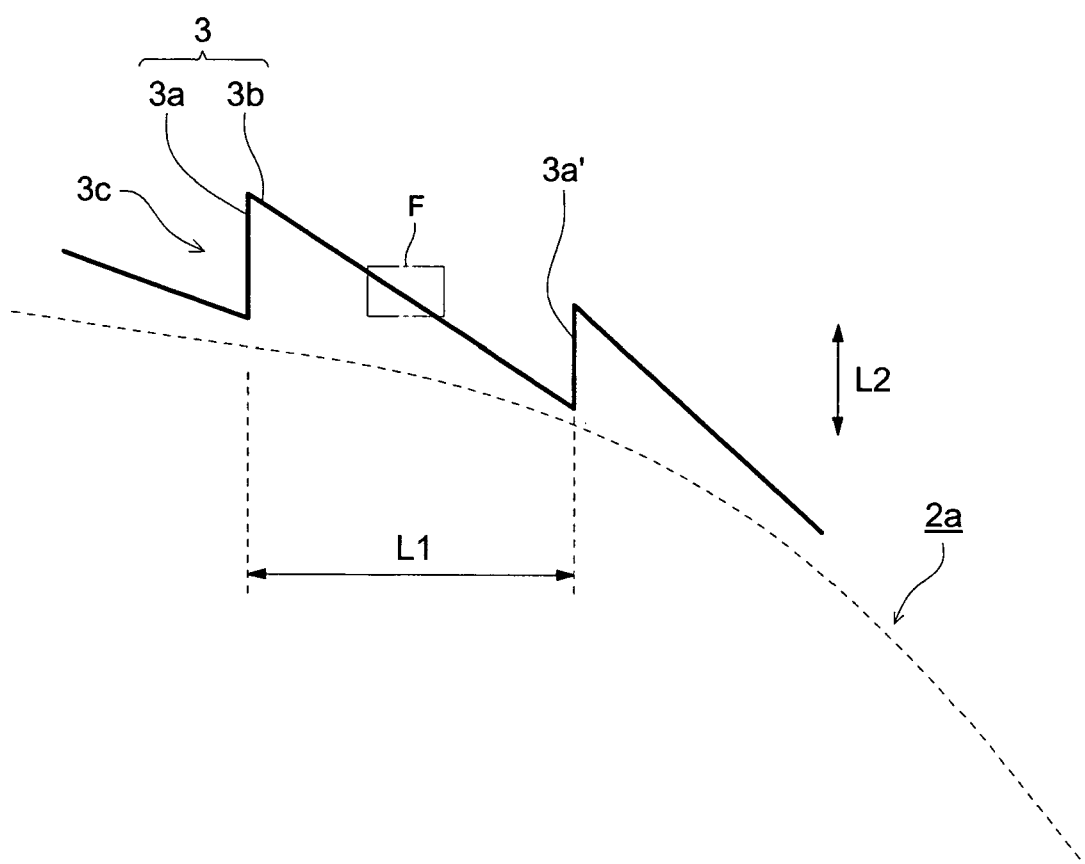
FIG. 10 is an explanatory drawing showing in detail a portion of the groove portion of the base material.

As shown in FIG. 10, the base material 2 has a curved surface portion 2a which is formed on at least one surface, and a groove portion 3 is inclined and formed every each pitch L1, and a side wall portion 3a rising from the curved surface portion 2a at the division position of the pitch, an inclination portion 3b formed between the adjoining each of side wall portions 3a, 3a, and a valley portion 3c formed on a boundary area between the side wall portion 3a and the inclination portion 3b are formed.

In the inclination portion 3b, an inclination surface in which its one end contacts with a base end of the one hand side wall portion 3a, and the other end contacts with a tip of the other hand side wall portion 3a, is structured. Hereupon, these plurality of groove portions 3, as will be described later, are formed when the coating agent (resist) coated on the curved surface portion 2a is drawn by the electronic beam drawing apparatus and this is development processed, and the inclination portion 3b of the groove portion 3 forms a gentle inclination surface by the drawing of the electronic beam drawing apparatus which will be described later.

Figure 11:
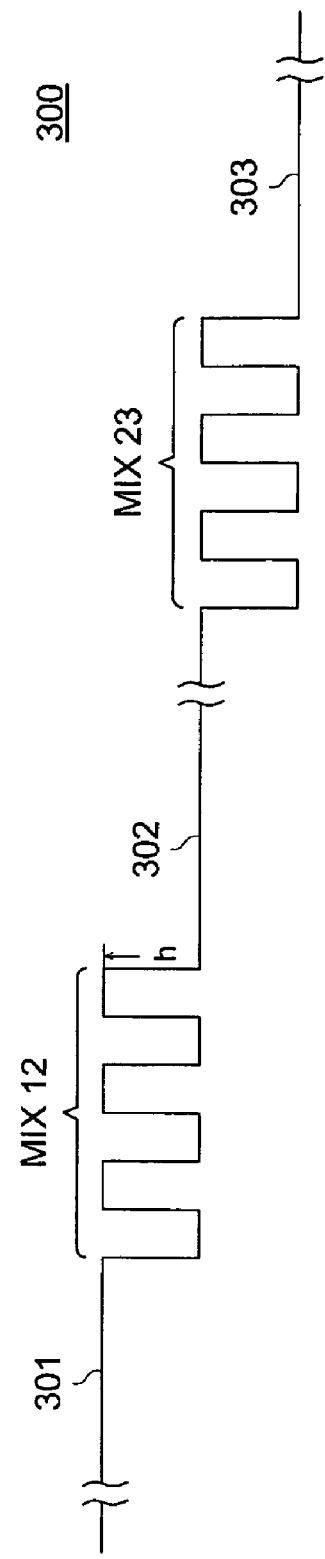
FIGS. 11(a), 11(b) are explanatory drawings showing the dose distribution for drawing an inclination portion of the groove portion in the first example.
Figure 11:
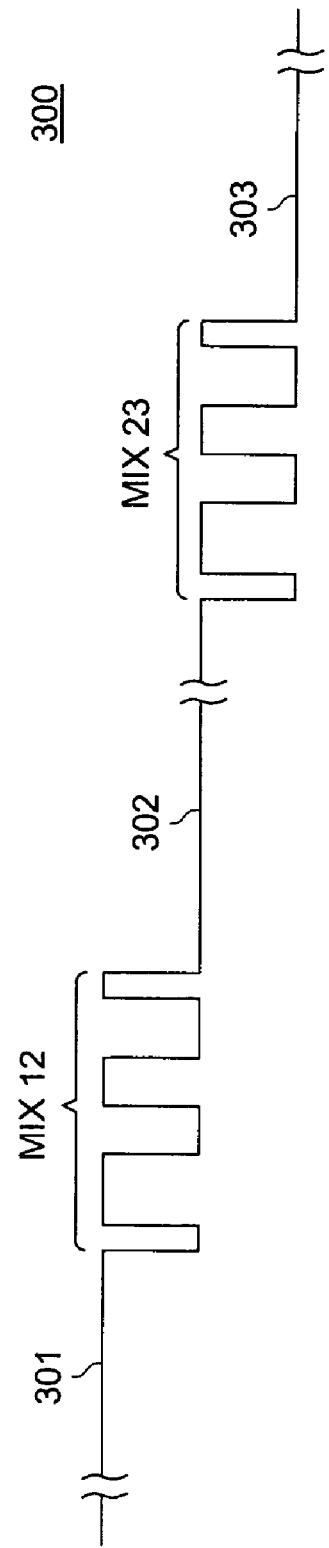

FIGS. 11(a), (b) are views in which a dose distribution 300 for drawing a F potion which is a part of this inclination portion 3b is enlarged. In this example, 3-stage dose amount division areas 301, 302, and 303 are shown, and the difference h of each stage of dose amount is the dose minimum unit adjustable according to the minimum clock of the D/A converter of the electronic beam drawing apparatus. In adjoining dose amount division areas 301, 302, for example, when the dose amount of the upper dose amount division area 301 is made the first dose amount, the first step which scans the electronic beam of the electronic beam drawing apparatus in the first dose amount is conducted in the upper dose amount division area 301. In the same manner, when the dose amount of its lower dose amount division area 302 is made the second dose amount, the second step which is scanned by this second dose amount is conducted in the lower dose amount division area 302. Then, a dose amount mix area MIX which is a characteristic of the present invention is provided between these upper dose amount division area 301 and lower dose amount division area 302. That is, in the dose amount mix area MIX, the first dose amount and the second dose amount are mixed, and the first scan by the first dose amount, and the second scan by the second dose amount are alternately conducted according to a predetermined mixing pattern. As described above, a dose amount mix area MIX 12 is provided between adjoining dose division area 301 and dose amount division area 302, and in the same manner, a next dose amount mix area MIX 23 is provided between adjoining dose division area 302 and dose amount division area 303. According to this dose amount mix area, an inclination step by which the step difference due to the difference of the dose amount between adjoining dose division areas is made the inclination surface, is conducted.

In this dose amount mix area, it is preferable that respective widths of the second scan section (a concave portion) which scans by the second dose amount and the first scan section (a convex portion) which scans by the first dose amount are structured in such a manner that, as shown in FIG. 11(a), they are constant or, as shown in FIG. 11(b), corresponding to the drawing pattern, for example, as the height of the inclination portion 3b is reduced, the width of the second scan section is increased. However, an important point in this case is that it is structured so that the width of each of the first scan section and the second scan section is smaller than the expected spread by the proximity effect of the electronic beam of the drawn line width, and more preferably, it is smaller than the diameter of the electronic beam.

Figure 12:
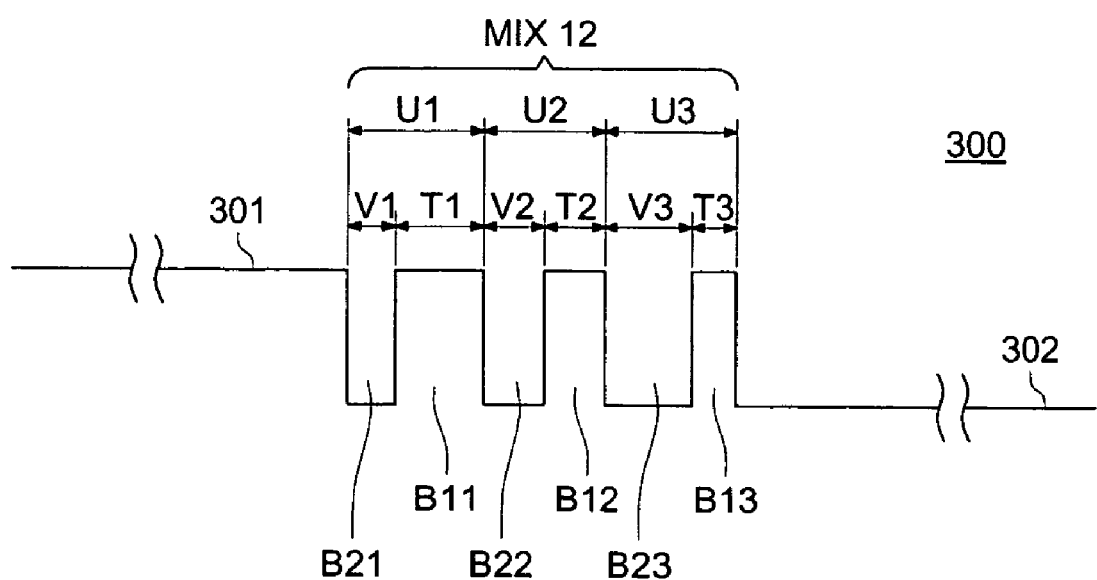
FIG. 12 is an explanatory drawing showing in detail the dose distribution for drawing the inclination portion.

More specifically, the dose amount mix area MIX is structured by a combination of a plurality of the first scan section and the second scan section, and in an example shown in FIG. 12, structured by 3 sets (B21: B11, B22: B12, B23: B13), and this combination is set to an adequate number corresponding to the inclination angle of the inclination surface.

Herein, when the pitch of the first scan section and the second scan section is U1=U2=U3, the width of each of the first scan sections B11, B12, B13 is T1, T2, T3, and the width of each of the second scan sections B21, B22, B23 is V1, V2, V3, and U1=T1+V1, U2=T2+V2, U3=T3+V3, for example, in this case, when T1>T2>T3, V1<V2<V3, by reducing the duty ratio as advancing to the lower dose amount division area 302 side in the manner such as (T1/V1)>(T2/V2)>(T3/V3), it can be structured in such a manner that the widths T1, T2, T3 of each of the first scan sections B11, B12, B13, are reduced stepwise as they advance to the lower dose amount division area 302 side.

Hereupon, as described above, when the distance between the first scan section and the second scan section of the dose amount mix area MIX is made constant, the duty ratio is (T1/V1)=(T2/V2)=(T3/V3). Further, the number of scan of the first scan section and the second scan section provided in the dose amount mix area MIX may also be made changeable corresponding to the magnitude or inclination angle. Accordingly, it may also be structured in such a manner that, for example, in the groove portion of the central area of the curved surface portion 2a, the number of scan of the first scan section and the second scan section is small, and as it goes to the groove portion of the peripheral portion side, the number of scan of the first scan section and the second scan section is increased. However, in either case, the range (U1+U2+U3) in which the first scan section and the second scan section of this dose amount mix area MIX are conducted, is determined corresponding to the inclination angle (in more detail, a displacement amount of the dose amount when the groove portion is drawn) of the groove portion.

(Dose Distribution)

Figure 13:
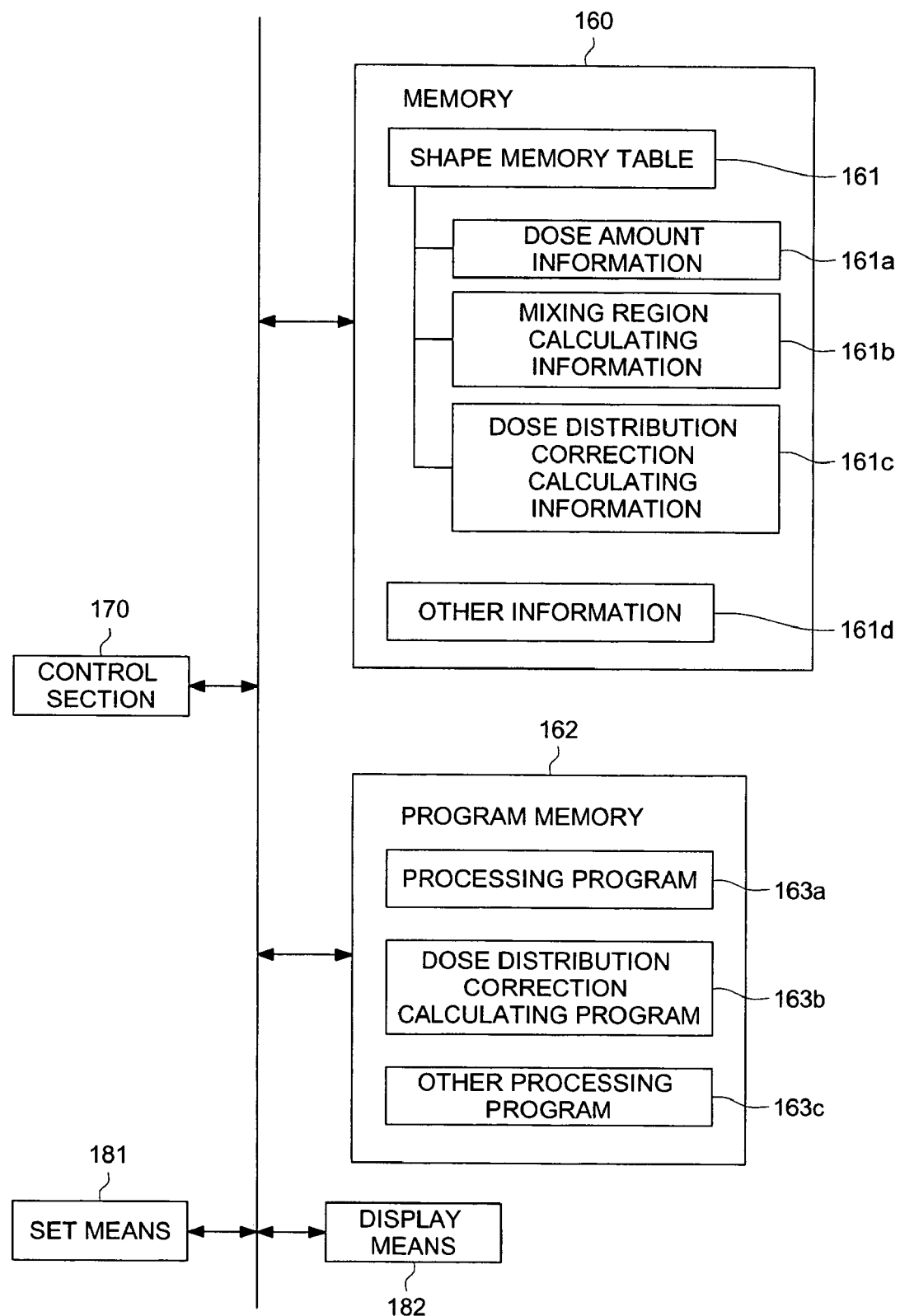
FIG. 13 is a functional block diagram showing a detail of a control system for controlling the dose amount for conducting the drawing in a predetermined dose distribution in the electronic beam drawing apparatus according to the present invention.

In FIG. 13, the function block diagram of the control system which is the characteristic structural component of the electronic beam drawing apparatus, is disclosed.

The memory 160 of the electronic beam drawing apparatus 1 shown in FIG. 1, has the shape storage table 161 as shown in FIG. 13, and in this shape storage table 161, for example, the dose distribution information 161a in which an ideal dose distribution corresponding to the drawing position when the inclination portion 3b and side wall portion 3a of the groove portion 3 is formed every each pitch L on the curved surface portion 2a of the base material 2 as desired, a set dose distribution in which this ideal dose distribution is approximated by the dose minimum unit of the electronic beam drawing apparatus, and the dose distribution relating to the first scan section and the second scan section when the dose amount mix area MIX is formed (the dose distribution relating to the width of the first scan section or the second scan section, or each pitch of the first scan section or the second scan section) are previously defined, is accommodated.

Figure 14:
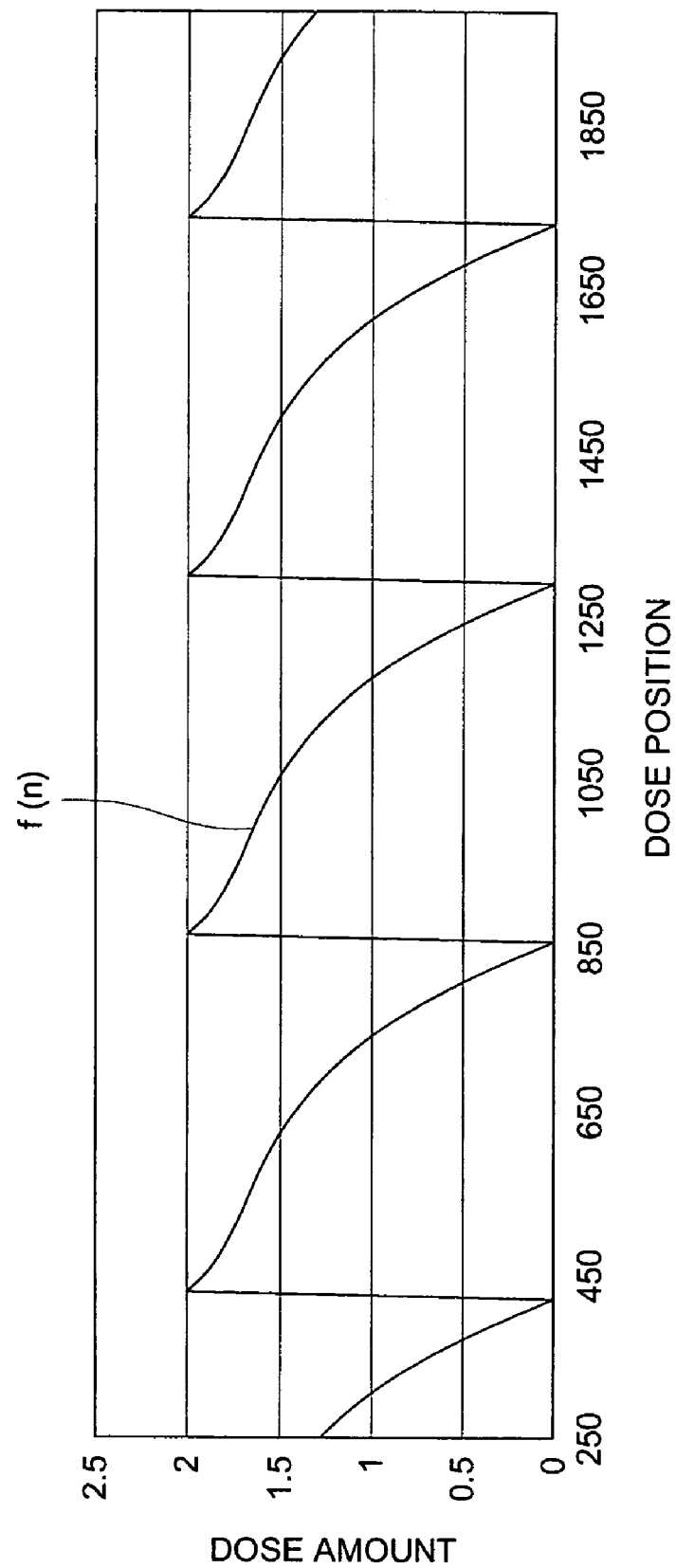
FIG. 14 is an explanatory drawing for explaining an ideal dose function expressing an ideal dose distribution for obtaining a desired groove portion shape.
Figure 15:
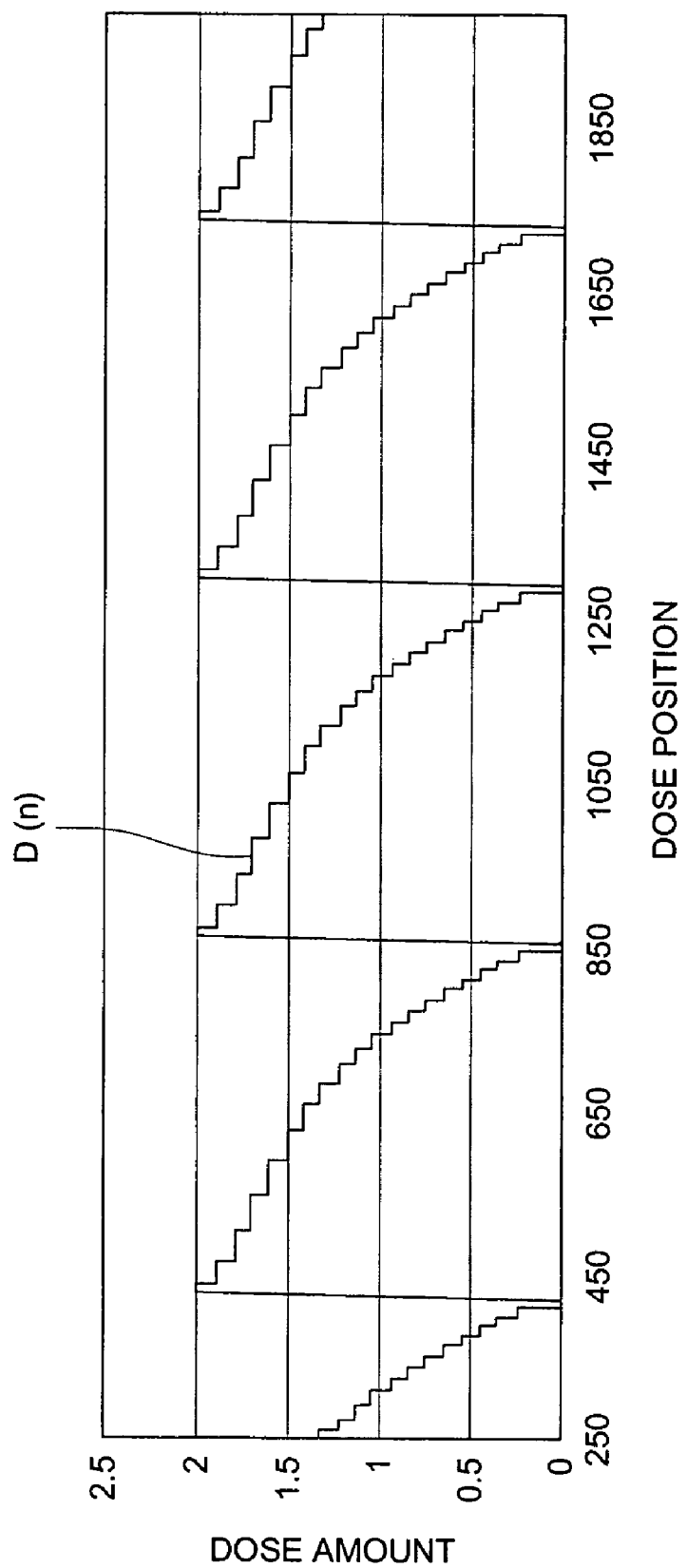
FIG. 15 is an explanatory drawing for explaining the setting dose function expressing the dose distribution set in the conventional electric beam drawing apparatus for obtaining a desired groove portion shape.
Figure 16:
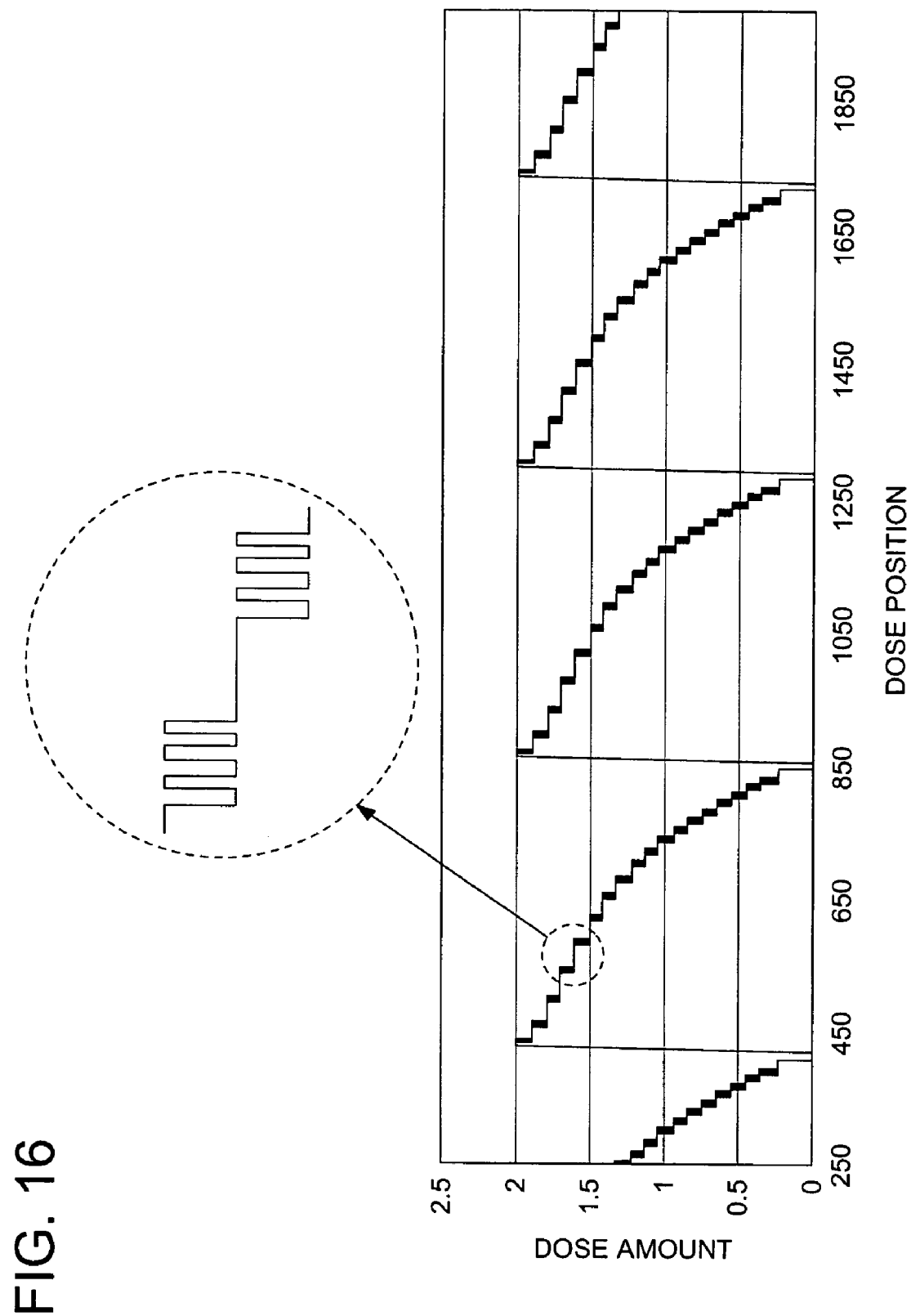
FIG. 16 is an explanatory drawing for explaining the setting dose function expressing the dose distribution set in the electric beam drawing apparatus according to the present invention for obtaining the desired groove portion shape.

Further, in the memory 160, the ideal dose function f(n) which expresses the ideal dose distribution, and the set dose function D(n) which expresses the set dose distribution and a dose amount mix area calculation information 161b which defines the correlation with the mixing constant w [%] which sets an extent forming the dose amount mix area, a dose distribution correction calculation information 161c which correction-calculates the set dose function D(n) according to the dose amount mix area calculation information 161b, and the other information 161d, are accommodated. Hereupon, the ideal dose function f(n) here which expresses the ideal dose distribution, is, for example, as shown in FIG. 14, a function which expresses an ideal dose distribution for obtaining the shape of a desired groove portion 3, and the set dose function D(n) which expresses the set dose distribution here is obtained, for example, as shown in FIG. 15, when the ideal dose distribution is approximated by the dose minimum unit of the electronic beam drawing apparatus. Further, the dose distribution correction calculation information 161c here is, for example, as shown in FIG. 16, a dose distribution information which shows the dose function after the correction calculation which will be described later, is conducted to the set dose function D(n), according to the dose amount mix area calculation information 161b, and a function which expresses the dose distribution when it is actually set by the electronic beam drawing apparatus. In this connection, all of these dose functions (dose distribution) shown in FIG. 14 to FIG. 16, are dose functions for forming the same groove portion. Further, these dose functions (dose distribution) show a case where one surface on which the groove portion 3 of the base material is formed, is a plane, and its dose amount and dose position are shown as an example absolutely.

Figure 17:
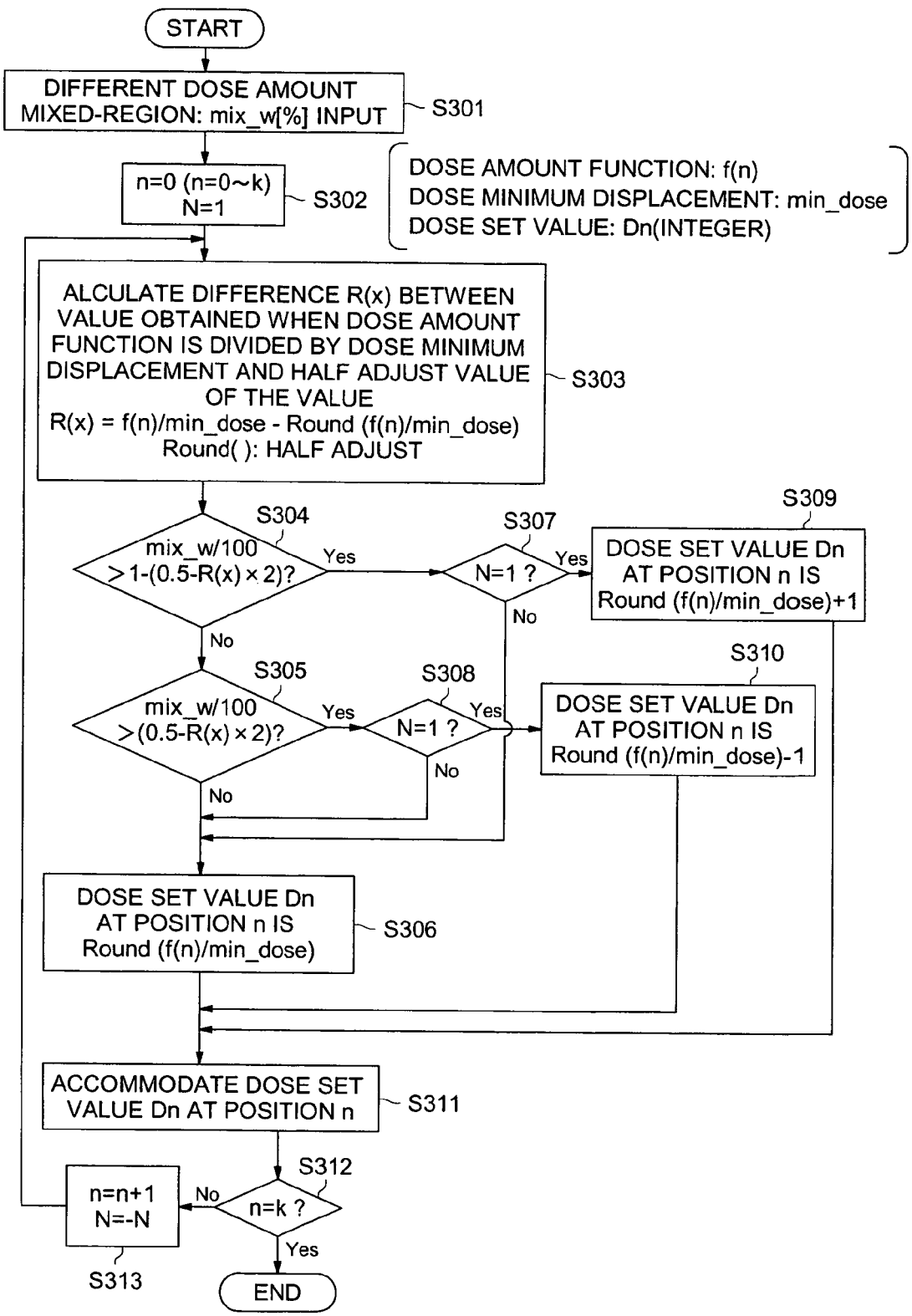
FIG. 17 is a flowchart showing an example of the processing sequence when the pattern is drawn according to a dose mount mixing region on the base material in the electronic beam drawing apparatus according to the present invention.

Herein, by using the flow chart shown in FIG. 17, a determination method of the dose amount of each drawing line which is the characteristic part of the present invention will be described below. Hereupon, in the following, as shown in FIG. 11(a), a case where the dose amount mix area in which the distance between each first scan section and the second scan section is constant, is formed on the inclination section 3b, will be described.

Herein, each kind of parameter is defined as follows.
The ideal dose function: f(n)
The dose minimum unit: min_dose
The dose set value: Dn (integer)
The value of a round-off of n: Round (n)

Figure 18:
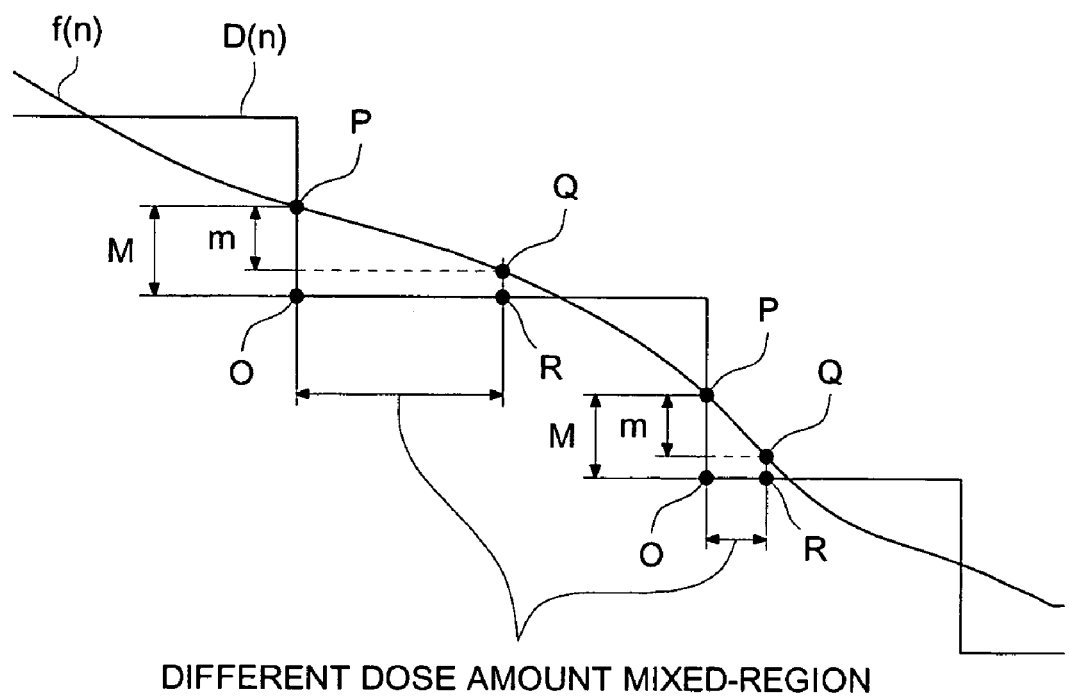
FIG. 18 is an explanatory drawing for explaining a method for determining the dose mount mixing region coinciding with the shape of an inclination portion.

Initially, by a set means 181 shown in FIG. 13, the dose amount mix area: mix_w[%] is inputted (S301). Hereupon, the mix_w[%] here indicates a value of m/M in FIG. 18, and further, the dose amount mix area: mix_w[%] here indicates, for example, the dose amount mix area of U1+U2+U3 in FIG. 12. Specifically, as shown in FIG. 12, when the ideal dose function f(n) and the set dose function D(n) are superimposed at the same drawing position, the intersecting point of the ideal dose function f(n) and the set dose function D(n), for example, the horizontal line is drawn from the position on the vertical line corresponding to the distance of m from the high order intersecting point P, a point Q intersecting with the ideal dose function f(n), is obtained. Further, in the case where the vertical line is drawn from the point Q, when a point R intersecting with set dose function D(n) is obtained, the dose amount mix area indicates the area between the lowest point O of each dose set value and the intersection R.

As described above, because when the dose amount mix area: the mix_w[%] is defined, the dose amount mix area can be determined corresponding to the inclination of the ideal dose function f(n), for example, even a case where the angle of the inclination surface of the groove portion changes corresponding to the drawing position, it can adequately cope with this.

The control section 170 in FIG. 13 conducts a dose distribution correction calculation program 163b while a predetermined drawing algorithm is conducted by a processing program 163a, when it goes to a routine to calculate the dose amount mix area dose amount, and the second dose distribution corrected for forming the dose amount mix area is calculated for the original dose distribution (the first dose distribution).

Specifically, initially, it is made in such a manner that the drawing position n=0 (n=0 to k, k: the outmost drawing position), and the initial set value N=1 (S302), and a value in which the ideal dose function f(n) corresponding to the drawing position n is divided by the dose minimum unit (minimum dose resolving power), and the difference R(x) between the value and the round-off value of below the decimal point of the value is calculated (S303).

$$R(x) = f(n)/\text{min\_dose} - \text{Round}(f(n) \text{ min\_dose}) \quad [\text{Ex. 1}]$$

$$\text{Next, mix\_w}/100 > 1 - (0.5 - R(x) \times 2) \quad [\text{Ex. 2}]$$

is judged (S304)

Herein, when it is judged as Yes, next, N=1 is judged (S307).

Naturally, because the initial set value is made N=1, the dose set value (set dose amount) D(n) is made $$D(n) = \text{Round}(f(n)/\text{min\_dose}) + 1 \quad (S309).$$

Hereupon, in S304, when it is judged No, next, mix_w/100<(0.5−R(x)×2) is judged (S305).

Herein, when it is judged Yes, next, N=1 is judged (S308).
Naturally, because the initial set value is made N=1, the dose set value (set dose amount) D(n) is made as $$D(n) = \text{Round}(f(n)/\text{min\_dose}) - 1 \quad (S310).$$

Hereupon, when it is judged No in S305, the dose set value (set dose amount) d(n) in the drawing position n is made as $$D(n) = \text{Round}(f(n)/\text{min\_dose}) \quad (S306).$$

In succession to S309, or S310, the dose set value D(n) in the drawing position n is accommodated in the memory 160 as the dose distribution information 161a (S311).

Next, n=k is judged (S312)

Naturally, because n=0 is made, it is judged No, and n=n+1, N=−N are made (S313).

After this, n=n+1, N=−N, are made, and in S312, S303–S312 are repeated at predetermined times until it is judged to be n=k in S312.

When, according to the dose set value D(n) set as described above, the drawing is conducted, for example, the first scan section and the second scan section in the dose amount mix area as shown in FIG. 11(a), can be formed.

(Specific Structure of the Control System)

In the program memory 162 in FIG. 13, the processing program 163a to conduct the processing of the present example, (in more detail, for example, a series of processing from S101 to S117 of FIG. 21 to FIG. 23 which will be described later), according to the information such as the dose distribution information 161a, the dose amount mix area calculation information 161b, and the dose distribution correction calculation information 161c, the dose distribution correction calculation program 163b (in more detail, for example, a series of processing from S301 to S313 of FIG. 17 described above), in which, to the inclination portion 3b of the groove portion 3, to which position of the drawing line, the dose amount mix area is allotted, and when, corresponding to the formation position of the groove portion 3, the number of the first scan section and the second scan section is changed, the processing including its change processing is calculated by the calculation, and the other processing program 163c are stored. Hereupon, by the memory 160 of the present example, an "accommodation means" can be structured, and by the program memory 162 of the present example and the control section 170, "the control means" can be structured.

In this case, the control means controls in such a manner that, according to the characteristic of the dose distribution, while the drawing amount is calculated, the drawing of the inclination portion 3b and the side wall portion 3a of the groove portion 3 is conducted.

In this case, the control section controls in such a manner that, according to the drawing position measured by the measuring means, the current value of the electronic lens is adjusted, and corresponding to the drawing position, the focal position of the electronic beam is variably controlled, and for the focal position, while the dose amount is calculated according to the dose distribution, the drawing of the inclination portion 3b and the side wall portion 3a of the groove portion 3 is conducted.

Further, the dose distribution information 161a of the memory 160 includes the information relating to the first dose distribution corresponding to the shape of the curved surface portion 2a of the base material 2, and the inclination portion 3b and the side wall portion 3a of the groove portion 3. Then, the dose distribution correction calculation program 163b conducts the calculation for correcting the first dose distribution to the second dose distribution (dose distribution correction calculation information 161c) in which the dose amount corresponding to the first scan section and the second scan section of the dose amount mix area is mixed. By this dose distribution correction calculation program 163b and the control section 170, the "calculation means" in the present invention can be structured.

Further, the control means is provided with the set means 181 for setting the ideal dose distribution or the dose amount mix area: mix_w [%] which will be described later, or the display means 182 by which, for example, the dose information for each line can be displayed.

In the control means having such a structure, the control section 170 conducts, while a predetermined drawing algorithm is conducted by the processing program 163a, when it goes to the routine for calculating the dose amount of the dose amount mix area, the dose distribution correction calculation program 163b, and to the original dose distribution (the first dose distribution), in order to calculate the second dose distribution corrected for forming the first scan section and the second scan section of the dose amount mix area corresponding to the drawing position, referring to some degree of basic information, that is, the dose distribution information 161a, or the table accommodated in the dose amount mix area calculation information 161b, after the corresponding dose distribution correction calculation information 161c is calculated, this calculated dose distribution correction calculation information 161c is accommodated in a predetermined temporary storage area of the memory 160, and according to the dose amount mix area calculation information 161b, the control section 170 conducts the drawing.

Figure 19:
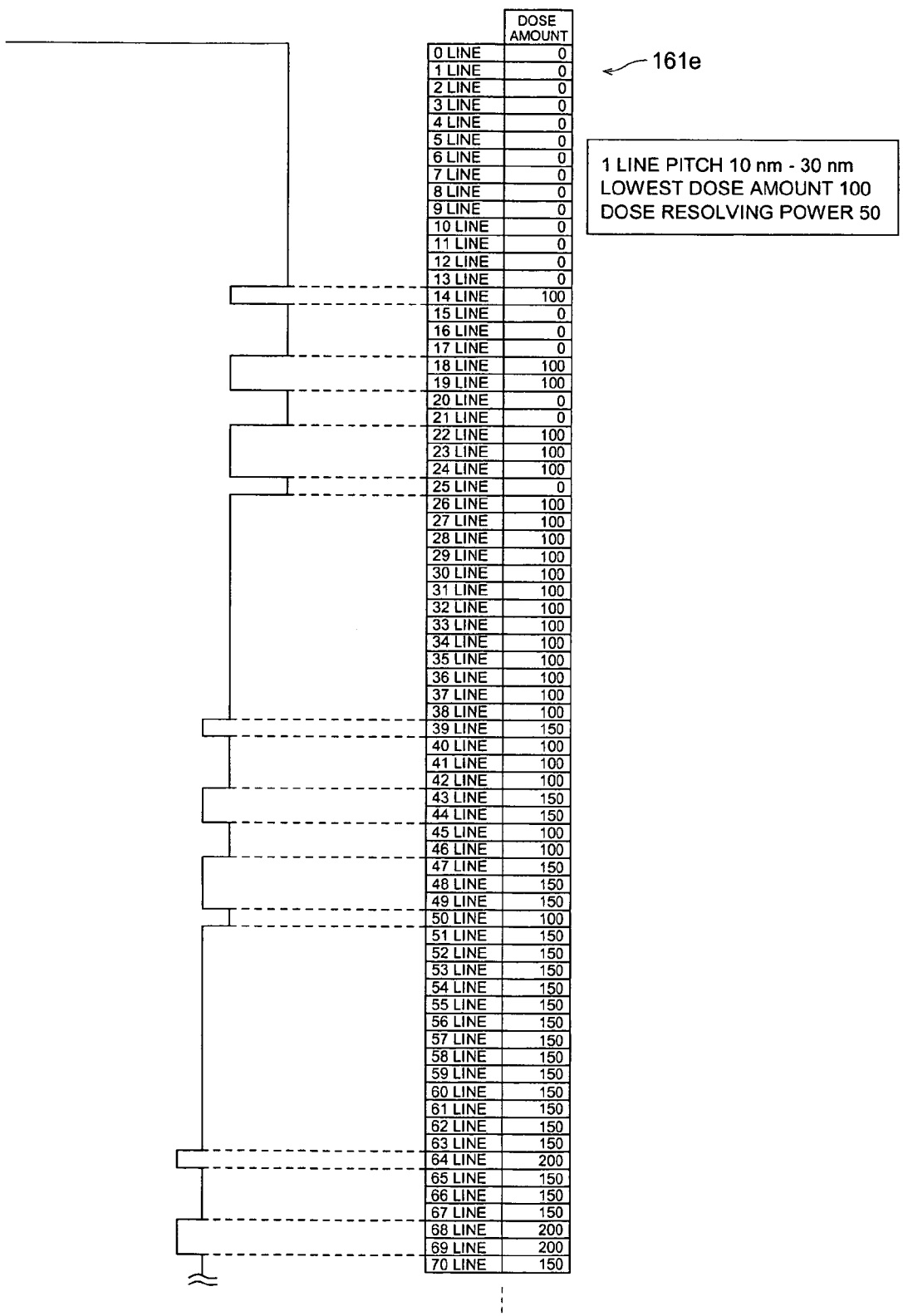
FIG. 19 is an explanatory drawing showing an example of the dose amount distribution for drawing the inclination portion.

Herein, referring to FIG. 19, an example of the table which is accommodated in the dose amount mix area calculation information 161b, specifically, an example of the table relating to the dose distribution of the first scan section and the second scan section of the dose amount mix area, will be described. In FIG. 19, a specific example of the table 161e relating to the dose distribution corresponding to the first scan section and the second scan section of the dose amount mix area, is disclosed. In the example of FIG. 19, to the drawing lines 0–13, the dose amount division area is structured by dose amount 0, and to 14–25 lines, the dose amount division area is structured by dose amount 0 and 100. Specifically, 14 lines, 18–19 lines, and 22–24 lines, form the second scan section of the dose amount mix area which is scanned by the dose amount 100. In the same manner, 15–17 lines, 20–21 lines, and 25 lines form the first scan section of the dose amount mix area by the dose amount 0. Further, to the lines 26–38, the dose amount mix area is structured again by the dose amount 100, and to lines 39–50, the next dose amount mix area is formed by the dose amounts 100 and 150. Specifically, the line 39, 43–44 lines, and 47–49 lines form the second scan section of the dose amount mix area by the dose amount 150. In the same manner, the lines 40–42, 45–46, and line 50 form the first scan section of the dose amount mix area by the dose amount 100. After that, the dose amount division area and the dose amount mix area are formed stepwise by the dose resolving power (dose minimum unit) 50.

Hereupon, in the present example, for example, 1 line pitch is made 10 nm–30 nm, the minimum dose amount is made 100, and the dose resolving power (dose minimum unit) is made 50.

As described above, when the table in which the dose distribution for forming the first scan section and the second scan section of the dose amount mix area is prepared for each line, is used, the correction calculation by the dose distribution correction calculation program 163b and the control section 170 can be simply conducted, and the first scan section and the second scan section of the dose amount mix area can be formed more simply. Hereupon, for the specific processing step when such a table is not used and by the predetermined program, the correction calculation is conducted, a case where the first scan section and the second scan section of the dose amount mix area as shown in FIG. 11(a), are formed, is taken as an example, and will be described in the (processing sequence) described later.

Figure 20:
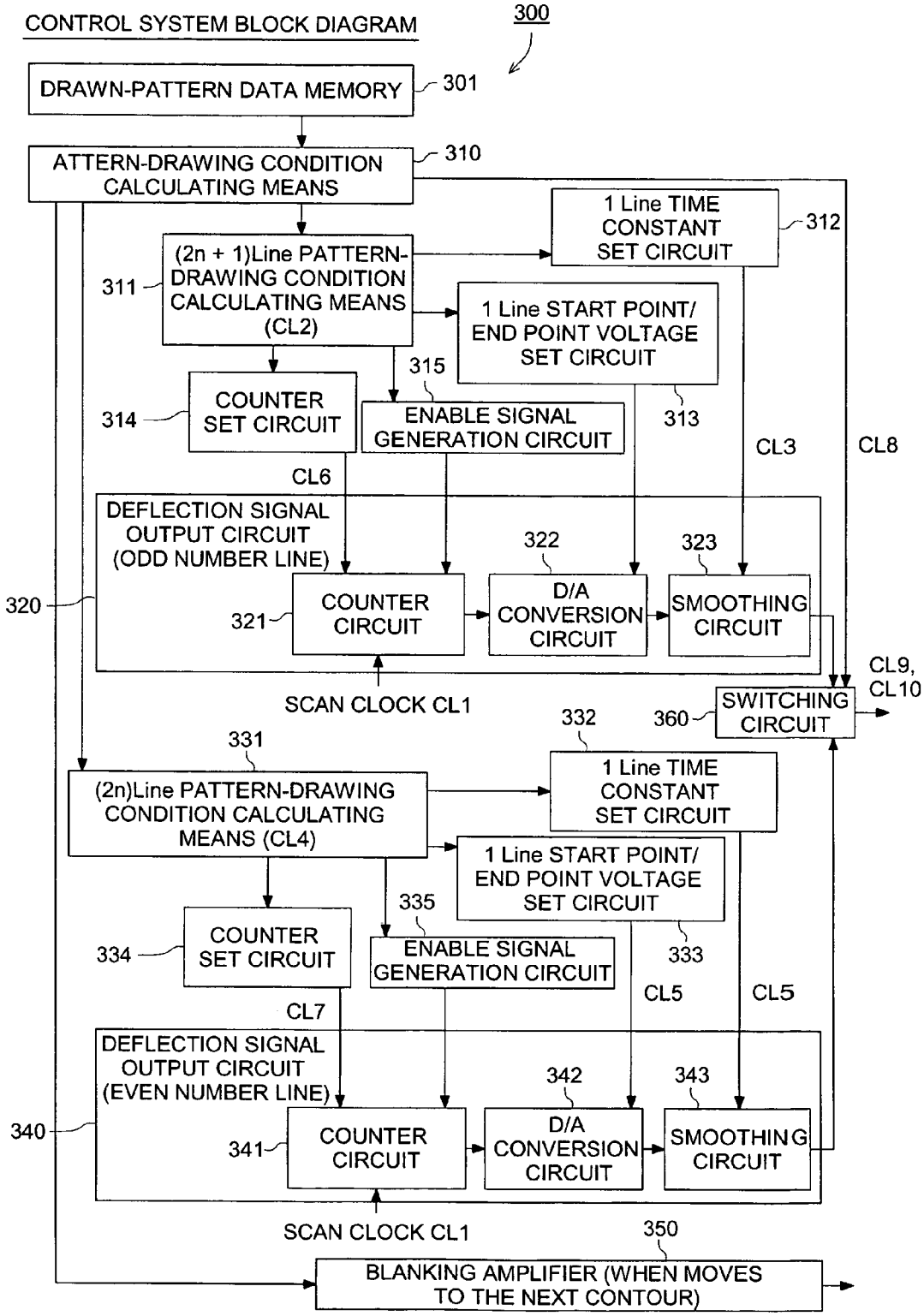
FIG. 20 is a function block diagram showing a detailed structure of a control system for controlling the line drawing to conduct the digital drawing in the electronic beam drawing apparatus according to the present invention.

Next, referring to FIG. 20, when the line is drawn, a specific structure of the control system for conducting each kind of processing will be described. In FIG. 20, a detailed structure of the control system 300 of the electronic beam drawing apparatus in FIG. 1 is disclosed.

Further, the control system 300 is structured by including: a drawing condition calculation means 310 for conducting the calculation of the drawing condition according to the drawing pattern data of the drawing pattern data memory 301; (2n+1) line drawing condition calculation means 311 in which, from the drawing condition calculation means 310, (when it is a (2n+1) line (n=0, 1, 2, . . . ), it is (2n+1), however, when it is (n=1, 2, . . . ), it may also be (2n−1)), that is, (2n+1) line drawing condition calculation means 311 for calculating the drawing condition of the odd number line; time constant set circuit 312 for setting the time constant of 1 line according to (2n+1) line drawing condition calculation means 311; start point/end point voltage set circuit 313 for setting the voltage of the start point and end point of 1 line according to the (2n+1) line drawing condition calculation means 311; counter number set circuit 314 for setting the counter number according to the (2n+1) line drawing condition calculation means 311; enable signal generation circuit 315 for generating an enable signal according to the (2n+1) line drawing condition calculation means 311; and deflection signal output circuit 320 for outputting the deflection signal of the odd number line.

Further, the control system 300 is structured by including: a (2n) line drawing condition calculation means 331 for calculating the drawing condition of (2n) line, that is, even number line from the drawing condition calculation means 310; time constant set circuit 332 for setting the time constant of 1 line according to the (2n) line drawing condition calculation means 331; start point/end point voltage set circuit 333 for setting the voltage of the start point and the end point of 1 line according to the (2n) line drawing condition calculation means 331; count number setting circuit 334 for setting the count number according to the (2n) line drawing condition calculation means 331; enable signal generation circuit 335 for generating the enable signal according to the (2n) line drawing condition calculation means 331; deflection signal output circuit 340 for outputting the deflection signal of the even number line; blanking amplifier 350 for conducting the blanking when it moves to the next contour line according to the (2n) line drawing condition calculation means 331; and switching circuit 360 by which, according to the drawing condition in the drawing condition calculation means 310 and the information from the deflection signal output circuit 320 of the odd number line and the deflection signal output circuit 340 of the even number line, the processing of the odd number line and the processing of the even number line are switched.

The deflection signal output circuit 320 of the odd number line is structured by including: the counter circuit 321 which is a counting means for conducting the count processing according to the scan clock CL1, and an odd number line count signal CL6 from the counter number set circuit 314, and enable signal of the enable signal generating circuit 315; DA converter circuit 322 for conducting the DA converting according to the count timing from the counter circuit 321, and the odd number line drawing condition signal CL3 in the start point/end point voltage set circuit 313; and smoothing circuit 323 for conducting the processing (the processing for removing the high frequency component of the deflection signal)for smoothing the analog signal converted in this DA converter circuit 322.

The deflection signal output circuit 340 of the even number line is structured by including: the counter circuit 341 which is the counting means for conducting the count processing according to the scan clock CL1, even number line count signal CL7 from the counter number set circuit 334 and the enable signal of the enable signal generating circuit 335; DA converter circuit 342 for conducting the DA conversion according to the even number line drawing condition signal CL5 in the start position/end position voltage set circuit 333; and the smoothing circuit 343 for conducting the processing for smoothing the analog signal converted in this DA converter circuit 342.

Hereupon, all of sections structuring these control systems 300 are the structures which can be controlled by the control section 170 (control means) such as the CPU shown in FIG. 1. Further, these control system 300 may also be the structure which respectively forms the control system for the X deflection and the control system for the Y deflection.

Hereupon, further, by the control system 300 including the drawing pattern data memory 310 of the present example, and the drawing condition calculation means 310, a "calculation means" can be structured. This "calculation means" has the function which calculates respective positions of at least 2 points corresponding to the distance corresponding to the time of integer times of the minimum time resolving power of the DA converter, on the scan line to be scanned. In this case, the "control means" of the control section 170, controls so as to almost linearly scan between respective positions calculated by the calculation means, by the electronic beam.

The control system 300 having the structure as described above, generally acts as follows. That is, when the drawing condition calculation means 310 obtains the information necessary for the scan (drawing) from the drawing pattern data memory 301, it conducts the calculation processing of a predetermined drawing condition, and the information relating to the odd number line is transmitted to the (2n+1) line drawing condition calculation means 311, and the information relating to the next side and the even number line is transmitted to the (2n) line drawing condition calculation means 331.

Thereby, for example, the (2n+1) line drawing condition calculation means 311 generates the drawing condition relating to the odd number line, and according to the scan clock CL1 and generated odd number line drawing condition generating signal CL4, outputs the even number line deflection signal CL110 from the deflection signal output circuit 340.

The outputs of these odd number line deflection signal CL9 and the even number line deflection signal CL10 are alternately switched by the switching circuit 360 under the drawing condition calculation means 310. Accordingly, when each side in a certain target field is calculated, each side is linearly drawn (scan) alternately in such a manner that the next side and even number-th side are drawn, and further, the next side and odd number-th side are drawn.

(Processing sequence)

Next, referring to FIGS. 21 to 23, the processing sequence when the base material having the structure shown in FIG. 13(a) is produced by using the electronic beam drawing apparatus in FIG. 1 which can draw 3-dimensionally, will be described.

As shown in FIG. 21, initially, when the processing of an aspheric surface of the distaff line material (base material) is conducted by SPDT (Single Point Diamond Turning: the diamond cutting by the ultra-precise processing machine), the simultaneous processing of the concentric circle mark is conducted (hereinafter, step "S" 101). In this case, it is preferable that, by the optical microscope, for example, the shape of the detection accuracy within ±1 μm is formed.

Next, an alignment mark is marked at, for example, 3 positions by FIB (S102). Herein, it is preferable that the alignment mark of the cross shape has the detection accuracy within ±20 nm in the electronic beam drawing apparatus.

Further, the relative position of the alignment mark with the concentric circle mark is observed and measured by the optical microscope, the position to the center of the aspheric surface structure is measured, and recorded in the data base (DB)(or the memory (hereinafter, the same)) (S103). Hereupon, it is preferable that this measurement accuracy is within ±1 μm, and 3 alignment marks referenced to the center x1 y1, x2 y2, x3 y3 are registered in the data base (DB).

Further, the height of each portion of the master block and the positions of the alignment mark (Xn, Yn, Zn) after resist coating/baking are measured (S104). Herein, the master block (base material) corrected by the center reference: the position table Tb11 (OX, OY, OZ), alignment mark: OA (Xn, Yn, Zn) (any one of them is 3*3 matrix) are registered in the data base (DB).

Next, the other each kind of processing is conducted like that the position of the measuring beam is aligned with the measuring apparatus (height detector) for the inclination surface measurement, and the beam of the electronic line is focused (S105).

In this case, the measuring beam for the height detection is projected to the calibration device which is needle-like for EB (electronic beam) focus (50 nm level), and in a SEM mode, observed by the electronic beam drawing apparatus, and focussed.

Figure 22:
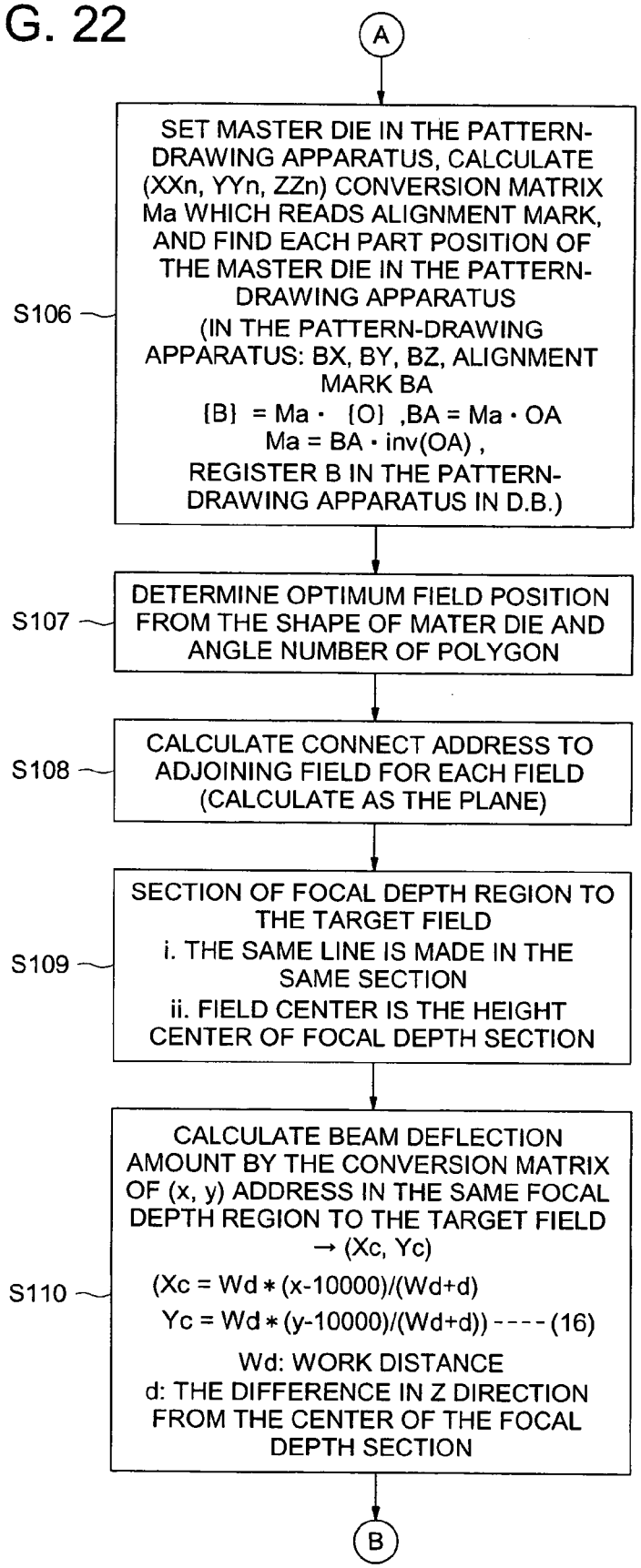
FIG. 22 is a flowchart showing one example of the processing sequence when the base material is drawn in the electronic beam drawing apparatus according to the present invention.

Next, as shown in FIG. 22, the master pattern (base material) is set in the electronic beam drawing apparatus, alignment mark is read (XXn, Yyn, ZZn), and the conversion matrix Ma is calculated, and each section position of the master pattern in the electronic beam drawing apparatus is obtained (S106). In this case, in the electronic beam drawing apparatus, each of values as shown in S106 is registered in the data base (DB).

Further, from the shape of the master pattern (base material), the optimum field position is determined (S107).

Then, for each field, the connection address of the adjoining field is calculated (S108). This is calculated as the plane.

Next, as a division of the same focal depth area in the target field, the same line is made being included in the same division. Further, the center of the field is the height center of the focal depth division (S109). Herein, a value within 50 μm, is made the same focal depth area. Further, it is divided into about one—several portions.

Next, the beam deflection amount is calculated by an (x, y) address conversion matrix (Xc, Yc) (S110). This Xc, Yc are as follows the expression (16) respectively shown. Herein, Wd is a work distance, and d shows the Z direction difference from the center of the focal depth division.

Figure 23:
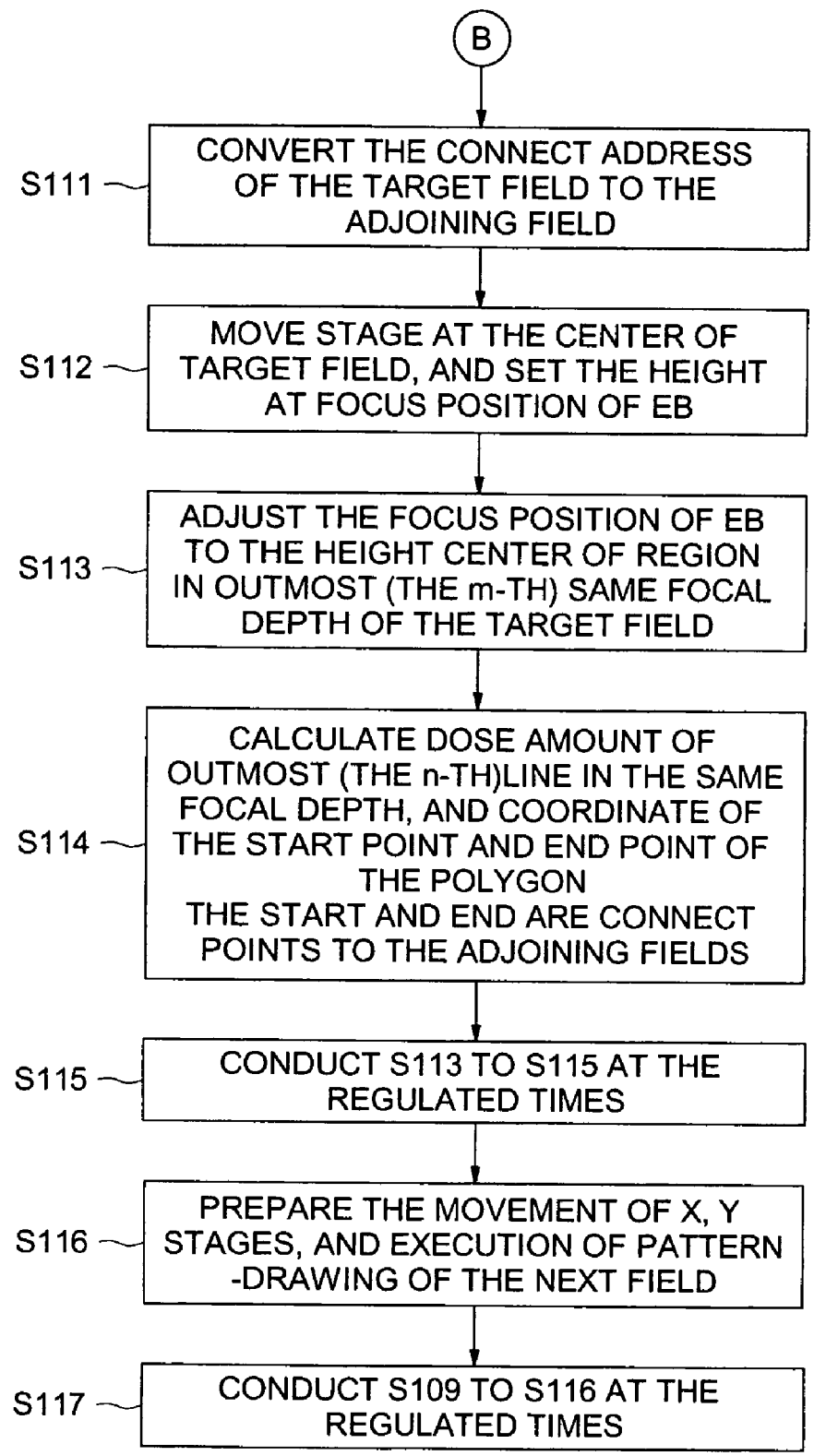
FIG. 23 is a flowchart showing an example of the processing sequence when the base material is drawn in the electronic beam drawing apparatus according to the present invention.

Further, as shown in FIG. 23, the connect address to the adjoining field of the target field is converted (S111). Herein, the connect position calculated in S108, is converted by using the expression (16) in S110.

Then, in the target field, the XYZ stage is moved to the center, and the height is set to the focus position of the EB (electronic beam)(S112). That is, at the XYZ stage, it is set to the field center. Further, while the signal of the measuring apparatus (height detector) is detected, the XYZ stage is moved, and the height position is read.

Further, in the target field, the focus position of the electronic beam (EB) is adjusted to the height center of the outmost (m-th) area in the same focal depth (S113). Specifically, referring to the table, the XYZ stage is moved by an amount of the difference from the height position of the predetermined amount field center.

Next, for the inside of the same focal depth of the target field, the control system conducts the calculation of the dose amount of the outmost (n-th) line and the start point and end point of the line, according to the calculation processing of the present embodiment, and conducts the line drawing. Hereupon, the start point and the end point are made a connect point to the adjoining field (S114).

Hereinafter, the processing from S113 to S115 are conducted in a predetermined number of times (S115).

Next, the XYZ stage is moved, and prepares to conduct the drawing making the next field as the target field (S116).

In this case, the field number, time, and temperature are registered in the data base (DB).

Hereinafter, when the processing from the S109 to S116 is conducted in a predetermined number of times (S117), as shown in FIG. 11(a), the inclination portion 3b of each groove portion 3 can be drawn based on the dose amount mix area in which the distance between the first scan section and the second scan section is constant.

Hereupon, as described above, for example, as shown in FIG. 11(b), when the dose amount mix area is formed on the inclination portion 3b of each groove portion 3 in such a manner that the width of the first scan section and the width of the second scan section are increased as it goes to the direction in which the height of the inclination portion 3b is decreased, for example, as shown in FIG. 16, when the table in which the dose distribution for forming the first scan section and the second scan section is prepared for each line is used, the correction calculation can be simply conducted, and the drawing relating to the first scan section and the second scan section of the dose amount mix area can be conducted.

Figure 24:
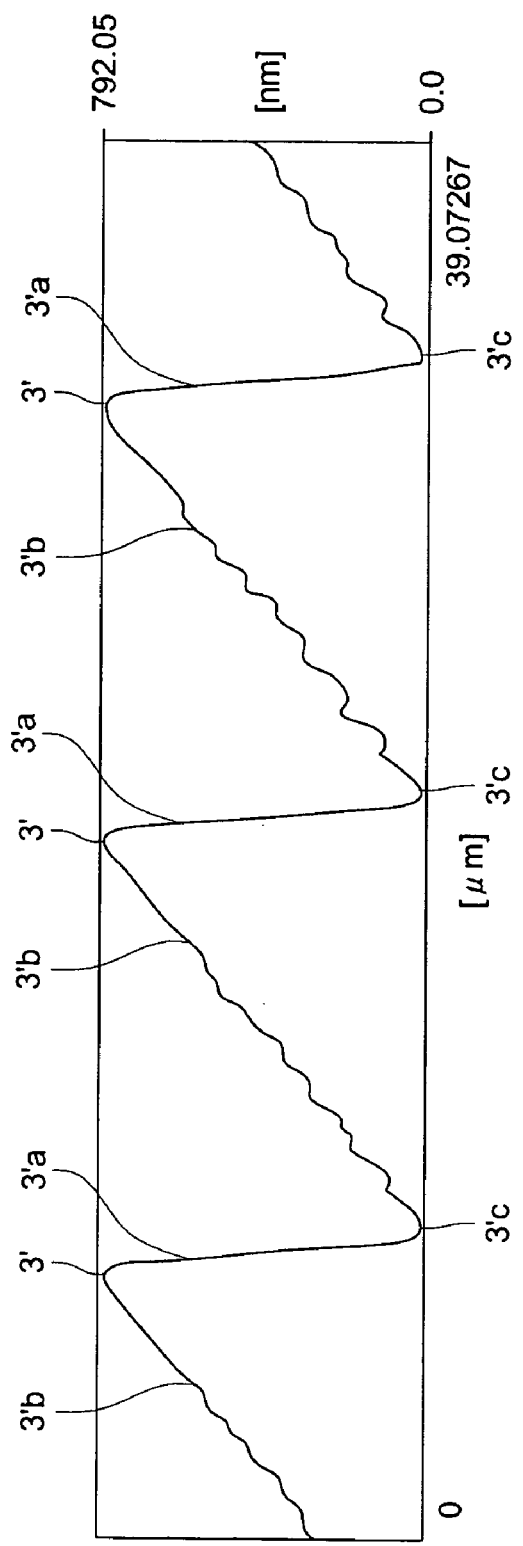
FIG. 24 is a view showing a cross-sectional shape after the development of the base material drawn in the conventional electronic beam drawing apparatus.
Figure 25:
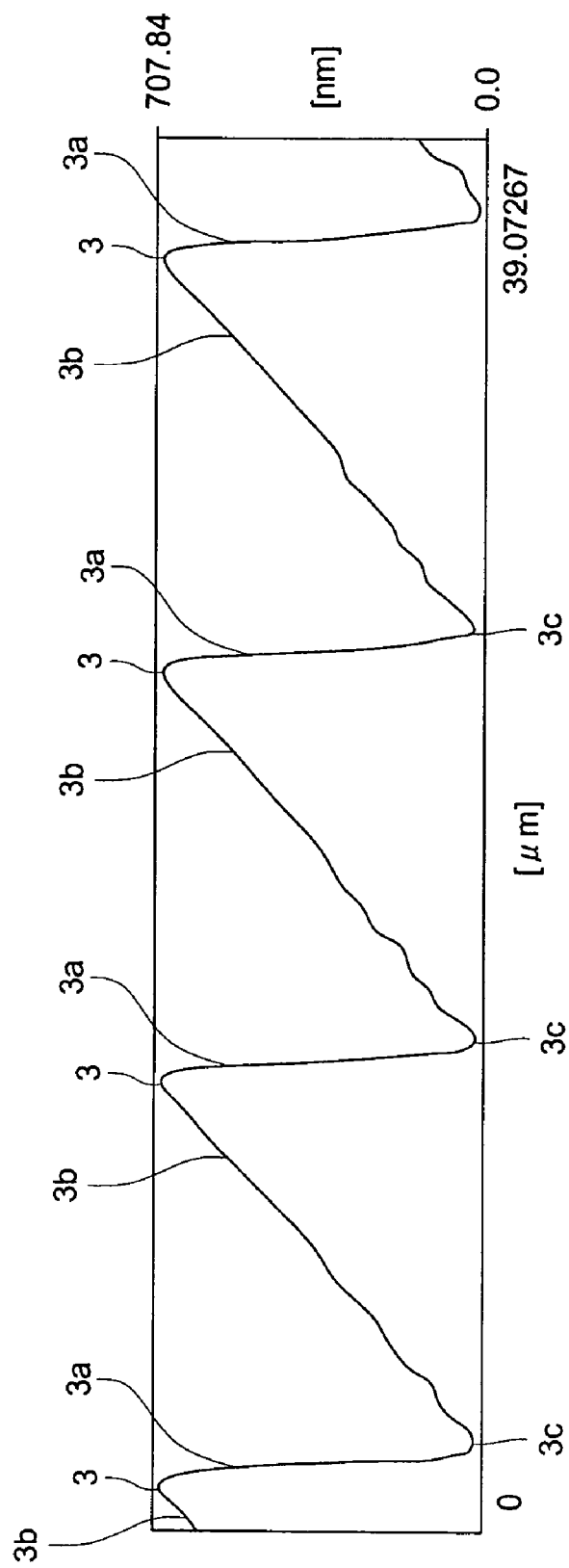
FIG. 25 is a view showing a cross-sectional shape after the development of the base material drawn in the electronic beam drawing apparatus according to the present invention.

In FIG. 15 and FIG. 24, the set dose distribution in the conventional electronic beam drawing apparatus and the sectional shape of the base material after the drawing/development which is measured by the scan type probe microscope are shown, and on the one hand, in FIG. 16 and FIG. 25, the set dose distribution in the electronic beam drawing apparatus according to the present invention, and the sectional shape of the base material after the drawing/development which is measured by the scan type probe microscope are shown.

Hereupon, the dose distribution shown in FIG. 15 and FIG. 16 shows a case where the one surface on which the groove portion 3 is formed, is a plane, and the dose amount and the dose position are shown absolutely as an example.

Further, as shown in FIG. 24 and FIG. 25, the groove portion 3', 3 has the side wall portion 3'a, 3a, and the inclination portion 3'b, 3b, and it has a valley portion 3'c, 3c between the side wall portion 3'a, 3a, and the inclination portion 3'b, 3b. Further, the horizontal axis in these views shows the positions along the sectional direction of a plurality of groove portions (unit: μm), and the vertical axis shows the position along the height direction of the groove portion (unit: nm).

As shown in FIG. 15, in the conventional electronic beam drawing apparatus, the drawing of the base material is conducted according to the set dose distribution which is obtained by approximating the ideal dose distribution by the minimum dose resolving power (dose minimum unit) of the apparatus, that is, the set dose function D(n). Then, the shape of the side wall portion 3'a, and the inclination portion 3'b, of the groove portion 3' which are obtained after the drawing/development, is as shown in FIG. 24, on its inclination portion 3'b, a plurality of step differences resulted from the minimum dose resolving power of the electronic beam drawing apparatus are formed.

On the one hand, as shown in FIG. 16, in the electronic beam drawing apparatus according to the present invention, the drawing of the base material is conducted according to the dose distribution correction calculation information 161c after the correction calculation, which will be described later, on the base of the table accommodated in the dose amount mix area calculation information 161b, is conducted, on the set dose function D(n). In this case, on the inclination portion 3b of the groove portion 3, the scan of the electronic beam of the dose amount according to the dose amount division areas 301, 302, 303, and the dose amount mix areas MIX 12, MIX 23 is conducted. Hereupon, in the dose amount mix areas, the scan of a plurality of the first scan section and second scan section is conducted. Then, the shape of the side wall portion 3a and the inclination portion 3b obtained after the drawing/development, is, as shown in FIG. 25, formed in such a manner that the inclination portion 3b is more gentle as compared to the inclination portion 3'b of the groove portion 3' shown in FIG. 24.

Herein, the detail in which the inclination portion 3b shown in FIG. 25 is formed more gentle as compared to the inclination portion 3'b of the groove portion 3' shown in FIG. 24, will be described as follow.

Generally, when the electronic beam is irradiated onto the base material, in the inside of the base material, the diffusion of the electronic beam is not a little generated, and in the vicinity area, the effect just as the portion is drawn by the electronic beam is exerted. This is made to call, in the present invention, "the vicinity effect" by the electronic beam. In this connection, in the present invention, when the electronic beam scans the inclination portion 3b of the groove portion 3 according to the dose amount mix area, between a plurality of the first scan section and the second scan section, the diffusion of the electronic beam is generated, and between these plurality of the first scan section and the second scan section, the "vicinity effect" by this electronic beam is generated. Accordingly, when this is developed, the first scan section and the second scan section are practically not strict binary shape. Further, as described above, because the width of each of the first scan section and the second scan section constituting the dose amount mix area is structured smaller than the diameter of the electronic beam, when this is drawn by the electronic beam, because, by the overlap of the drawing area by the electronic beam, a portion which is drawn covering a plurality of times (for example, 2–3 times) is generated in the first scan section and the second scan section, when this is developed, the first scan section and the second scan section become as the result the inclination surface shape having the intermediate height. This fact is the important main point in the present invention.

That is, as this result, between the stepwise dose amount division areas 301, 302, 303, for scanning the inclination portion 3b, when the dose amount mix areas MIX 12, MIX 23 for forming the intermediate height are provided, the more gentle inclination surface than a case where it is scanned by only dose amount corresponding to the conventional dose amount division areas 301, 302, 303, is structured.

Hereupon, as described above, when the duty ratio of the first scan section in 1 pitch of the first scan section and the second scan section forming the dose amount mix area is made small as it goes to the side in which the height of the inclination surface portion 3b is lowered, the more gentle inclination surface can be structured.

THE SECOND EXAMPLE

Next, according to FIG. 26 and FIG. 27, the second example of the electronic beam drawing method, production method of the moldings, and electronic beam drawing apparatus according to the present invention, will be described. Hereupon, in the following, the explanation, relating to the practically same structure as the first example, will be omitted, and only the different part will be described.

In the first example, although a case where the dose amount division area which is stepwise in the sectional direction (inclination direction) of the inclination portion 3b of the groove portion 3, and the first scan section and the second scan section of the dose amount mix area are structured, is described with an example, in the present embodiment, a case where the first scan section and the second scan section of the dose amount mix area are formed in the scan direction of the electronic beam, will be described.

That is, the characteristic of the base material in the present example, is in an aspect that, in order to form the first scan section and the second scan section of the dose amount mix area in the scan direction of the electronic beam, when the drawing line (line in the scan direction) which is scanned by the electronic beam, is drawn, the blanking division is provided, and the blanking division is made the second scan section of the dose amount mix area, and the line drawing portion is made the first scan section of the dose amount mix area.

A specific structure of the base material in the present example will be described below. In FIG. 26, a partial enlarged drawing of the dose distribution 200 for forming the inclination portion of the groove portion formed on one surface of the base material in the present example, is shown.

As shown in FIG. 26, the dose distribution 200 for forming the inclination portion of the groove portion of the present example has not a large difference from the dose distribution 300 in the first example, when viewed from the sectional direction.

However, when this is viewed from the above, the dose amount mix area MIX drawn by the first dose amount and the second dose amount (herein, the second dose amount>the first dose amount, the second dose amount–the first dose amount=the dose minimum unit) in the scan direction of the electronic beam (in the up-and-down direction in the drawing), is formed of the first scan section (drawn by the first dose amount) corresponding to the blanking section BK, and the second scan section (drawn by the second dose amount) corresponding to the other section. Hereupon, the slanting line area in the same drawing, corresponds to the second scan sections BJ1–BJ3, in the sectional direction of the dose amount mix area 200.

On the one hand, in adjoining dose amount division areas 201, 202, as usual, the scan of the electronic beam is respectively conducted by the first dose amount and the second dose amount, and the step-wise inclination surface is formed.

In the same manner, also for the inclination portion of the groove portion which is in the other position, the dose amount mix area is provided between adjoining dose amount division areas, and a plurality of the first scan section and the second scan section are arranged.

Hereupon, as described above, the width of each of the first scan section and the second scan section of the first scan section and the second scan section forming the dose amount mix area is respectively formed smaller than the diameter of the electronic beam.

As described above, also in the case where the first scan section and the second scan section of the dose amount mix area are formed in the scan direction of the electronic beam, in the same manner as the base material in the first example, when this is drawn by the electronic beam, in the dose amount mix area, the diffusion of the electronic beam is generated, and in between the first scan section and the second scan section forming the dose amount mix area, because the "vicinity effect" due to this electronic beam is generated, when this is developed, a part drawn in the dose amount mix area does not actually become the strict binary shape. Further, as described above, because the width of the first scan section and the second scan section forming the dose amount mix area is respectively structured smaller than the diameter of the electronic beam, when this is drawn by the electronic beam, because, by the overlap of the drawing area by the electronic beam, a portion drawn over a plurality of times (for example, 2–3 times) is generated, when this is developed, the portion drawn in the dose amount mix area becomes, as the result, an inclination surface having the intermediate height.

As the result, the step difference between the adjoining dose amount division area 201 and dose amount division area 202, by the dose amount mix area MIX having the intermediate height between them, structures the more gentle inclination surface, as compared to the step difference between inclination portions of the conventional groove portion.

Hereupon, as described above, in the case where the duty ratio of the first scan section in the first scan section and the second scan section of the dose amount mix area is decreased as it goes to the side in which the height of the inclination portion is lowered, because the height of the first scan section in the dose amount mix area can be decreased stepwise, the more gentle inclination surface can be structured.

(Structure of the Control System of the Electronic Beam Drawing Apparatus)

Next, referring to FIG. 27, the specific structure of the control system to conduct the drawing on each of areas of the drawing line, by the first dose amount and the second dose amount, corresponding to the dose amount mix area as described above, will be described.

Figure 27:
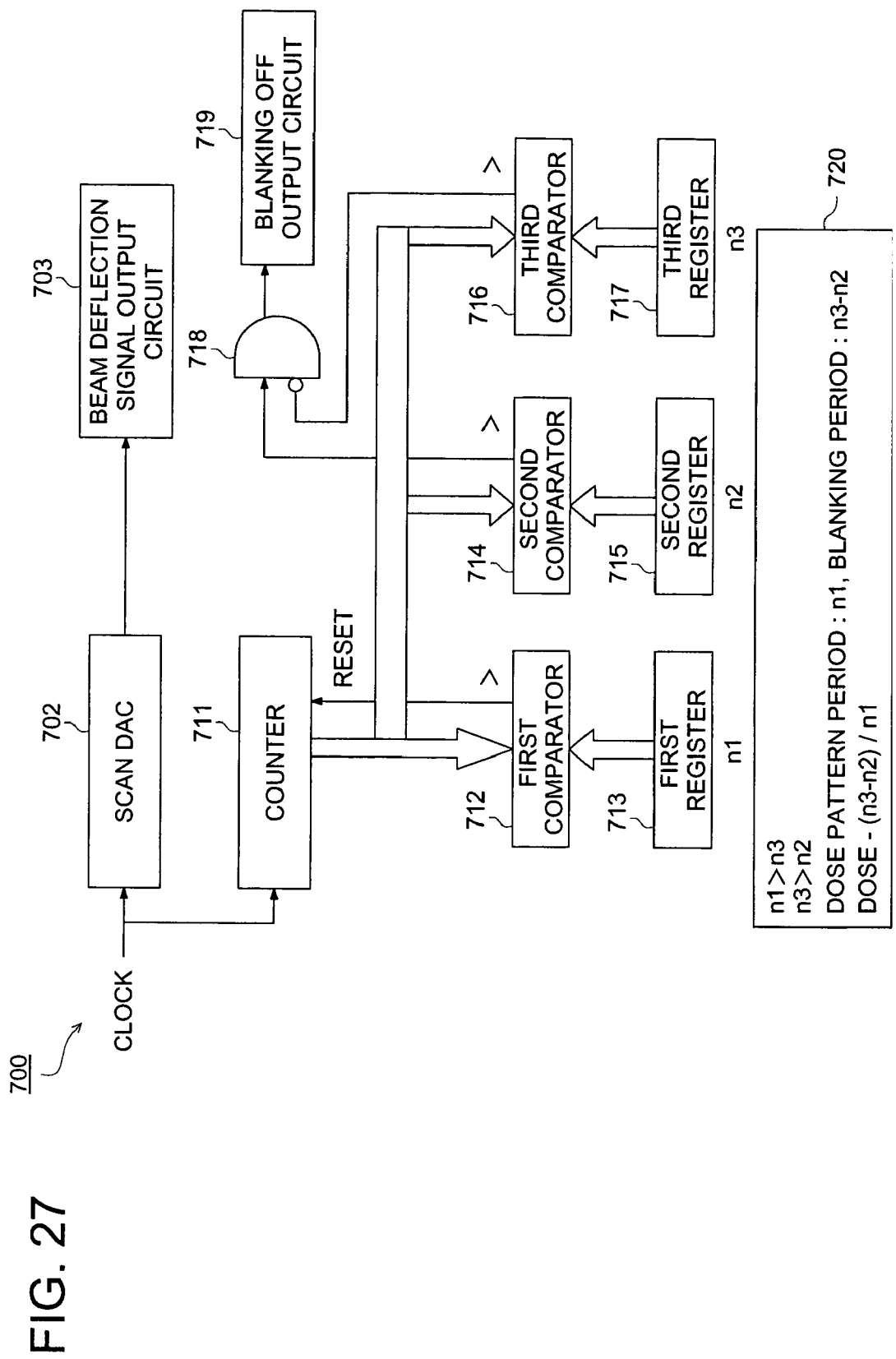
FIG. 27 is a function block diagram showing a detailed structure of the control system for conducting the line drawing in which a blanking section is provided, in the electronic beam drawing apparatus according to the present invention.

The control system 700 in the present example is assembled, for example, in the control circuit 100 in FIG. 1, and when, according to the dose amount mix area, the drawing is conducted, the mode switching control is conducted in which 2 modes for periodically providing the blanking (according to the dose amount mix area, the first scan section and the second scan section are formed for each predetermined interval), (for example, the first mode to conduct the line drawing by the second dose amount, the second mode to conduct the line drawing by the first dose amount by the blanking) are used, and it is structured by including: as shown in FIG. 27, according to a predetermined clock (signal)to scan the electronic beam on the surface of the base material, a scan DAC 702 which is the DA converter to convert the digital signal into the analog signal; and a beam deflection signal output circuit 703 to generation-output the beam deflection signal according to the analog signal converted by this scan DAC 702; a counter 711 to count clocks of the clock (signal), the first register 713 in which the information relating to the dose pattern period n1, is accommodated; the second register 715 in which, the information relating to n2 when the blanking period for forming the blanking section is n3−n2 (herein, as shown in a symbol 720, n1>n3, n3>n2), is accommodated; the third register 717 in which the information relating to n3 is accommodated; the first comparator 712 by which the count values counted by the counter 711, and the information accommodated in the first register 713 are compared, and the reset of the counter 711 can be conducted; the second comparator 714 by which the count values counted by the counter 711, and the information accommodated in the second register 715 are compared; the third comparator 716 by which the count values counted by the counter 711, and the information accommodated in the third register 717 are compared; a logical gate 718 to calculate the logical product of the comparison result compared by the second comparator 714, and the comparison result compared by the third comparator 717; and a blanking off signal output circuit 719 to generation-output the blanking off signal by which, according to the result outputted from the logical gate 718, it is made blanking off for a predetermined period.

Hereupon, by the above-described scan DAC 702 and beam deflection signal output circuit 703, the "beam deflection control system" can be structured, and by the counter 711, the first comparator 712, the first register 713, the second comparator 714, the second register 715, the third comparator 716, the third register 717, logical gate 718, and blanking off output circuit 719, "the blanking control system which is the mode switching means" can be structured.

In the control system 700 having the structure as described above, by the deflection signal from the beam deflection signal output circuit 703 according to the clock, the drawing of the specific drawing line (drawing line) is conducted.

In this case, according to the clock, it goes to the count value of n2 which is n3>n2, and when the counter 711 outputs the count value, the second comparator 714 makes, for example, the output signal "L" level to "H" level, and outputs the "H" level signal, and inputs it into one input of the logical gate 718.

Next, according to the clock, it goes to the count value of n3 which is n3>n2, and when the counter 711 outputs the count value, the third comparator 716 makes, for example, the output signal "L" level to "H" level, and outputs the "H" level signal, and inputs it into the other input of the logical gate 718.

During this, when the one input of the logical gate 718 is the "L" level, and the other input is the "L" level, or the one input is the "H" level and the other input is the "L" level, because the logical gate 718 outputs "H", it becomes "blanking on (period)" and the line drawing is conducted in the second dose amount.

On the one hand, when the one input of the logical gate 718 is the "H" level, and the other input is the "H" level, or the one input is the "L" level and the other input is the "H" level, because the logical gate 718 outputs "L", during this, it becomes "blanking off)" and the line drawing is conducted in the first dose amount.

On the other hand, according to the clock, it goes to the count value of n1 which is n1>n3>n2, and when the counter 711 outputs the count value, the first comparator 712 outputs the signal, and resets the counter 711.

In this manner, the "blanking off" and "blanking on" are repeated for each n1 period, for example, in an area of the dose amount mix area in FIG. 27, the blanking section BK is provided to the drawing line, and the so-called binary pattern in the drawing line direction by the first scan section drawn by the first dose amount, and the second scan section drawn by the second dose amount, can be formed.

As described above, also by forming the binary pattern in the drawing line direction, the dose amount mix area can be provided on the dose distribution for forming the inclination portion of the groove portion.

Hereupon, in the present embodiment, the blanking section BK is constant, however, for example, it may also be the structure in which the blanking section is changed for each drawing line.

THE THIRD EXAMPLE

Next, According to FIG. 28, the third example of the electronic beam drawing method and the production method of the base material according to the present invention, will be described. Hereupon, in the following, the description is omitted relating to the practically same structure as the first example and second example, and relating to only the different part, it will be described.

In the first example, a case where the dose amount division area and the first scan section and the second scan section of the dose amount mix area are formed in the sectional direction (inclination direction) of the inclination portion 3b of the groove portion 3, is exemplified, and in the second example, a case where the first scan section and the second scan section of the dose amount mix area are formed in the scan direction of the electronic beam, is exemplified, however, in the present example, a case where they are combined, and the dose amount division area and the first scan section and the second scan section of the dose amount mix area are formed in the sectional direction (inclination direction) of the inclination portion of the groove portion, and further, in the first scan section of this dose amount mix area, the first scan section and the second scan section are formed also in the scan direction of the electronic beam, will be described.

In more details, the dose amount division area and the first scan section and the second scan section of the dose amount mix area are formed in the sectional direction (inclination direction) of the inclination portion of the groove portion, and further, when the drawing line (line in the scan direction) scanned by the electronic beam in the first scan section of this dose amount mix area is drawn, the blanking section is provided, and this blanking section is made the second scan section in the first scan section of the dose amount mix area, and the line drawing part is made the first scan section in the first scan section of the dose amount mix area.

Specifically, as shown in FIG. 28, the dose distribution 400 for drawing the inclination portion of the groove portion of the present example, is not particularly changed as compared to the dose distribution 300 when it is viewed from the sectional direction.

However, when this is viewed from above, the first scan section and the second scan section which draw in the first dose amount and the second dose amount (herein, the second dose amount>the first dose amount, the second dose amount−the first dose amount=the dose minimum unit) in the scan direction (the up-and-down direction in the drawing) of the electronic beam in the dose amount mix area MIX of the dose distribution 400, are formed corresponding to the blanking section BK.

On the one hand, in the dose amount division areas 401 and 402, the scan of the electronic beam is respectively conducted in the first dose amount and the second dose amount as usual, and the stepwise inclination surface is formed.

In the same manner, also for the inclination portion of the groove portion at another position, the dose amount mix area is provided between the adjoining dose amount division areas, and a plurality of the first scan section and the second scan section are arranged.

Hereupon, as described above, the width of each of the first scan section and the second scan section which form the dose amount mix area is respectively structured so as to be smaller than the diameter of the electronic beam.

As described above, also when the first scan section and the second scan section of the dose amount mix area are formed in the scan direction of the electronic beam, in the same manner as the base material in the first example and the second example, when this is drawn by the electronic beam, the diffusion of the electronic beam is generated in the dose amount mix area, and because, in between the first scan section and the second scan section forming the dose amount mix area, the "vicinity effect" by the electronic beam is generated, when this is developed, a part drawn in the dose amount mix area practically does not become a strict binary shape. Further, as described above, because the width of the first scan section and the second scan section which form the dose amount mix area is, respectively structured so as to be smaller than the diameter of the electronic beam, when this is drawn by the electronic beam, because a part which is drawn covering a plurality of times (for example, 2–3 times) by the overlap of the drawing area by the electronic beam, when this is developed, a part which is drawn in the dose amount mix area becomes, as the result, an inclination surface having the intermediate height.

As the result of this, the step difference between the adjoining dose amount division area 401 and the dose amount division area 402 is structured to a more gentle inclination surface by the dose amount mix area having the intermediate height of them, as compared to the step difference between inclination portions of the conventional groove portion.

Hereupon, as described above, when the duty ratio of the first scan section in 1 pitch of the first scan section and the second scan section of the dose amount mix area MIX is decreased as it goes to the side in which the height of the inclination portion is reduced, because the height of the first scan section in the dose amount mix area MIX can be lowered stepwise, the more gentle inclination surface can be structured.

THE FOURTH EXAMPLE

Figure 29:
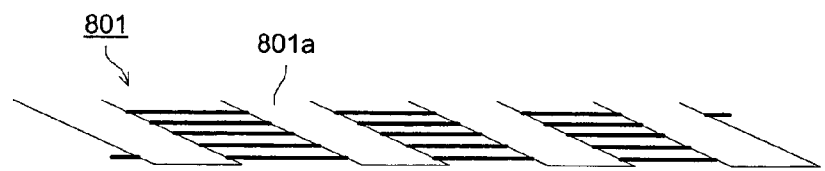
FIGS. 29(a) to 29(e) are explanatory drawings showing the dose amount distribution for drawing the pattern on the inclination portion of the groove portion of the base material in the fourth example.
Figure 29:
Figure 29:
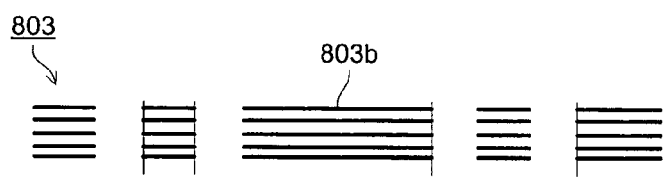
Figure 29:
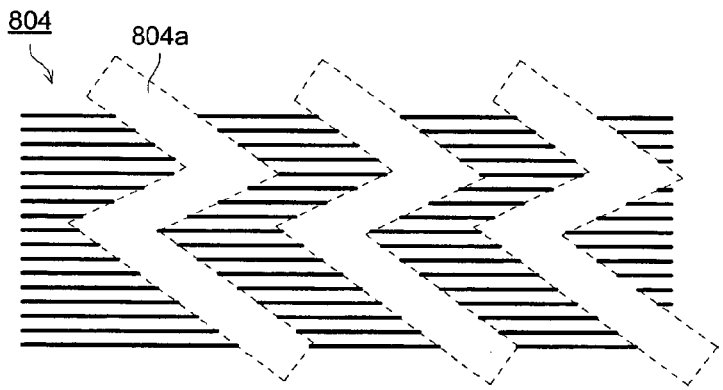
Figure 29:
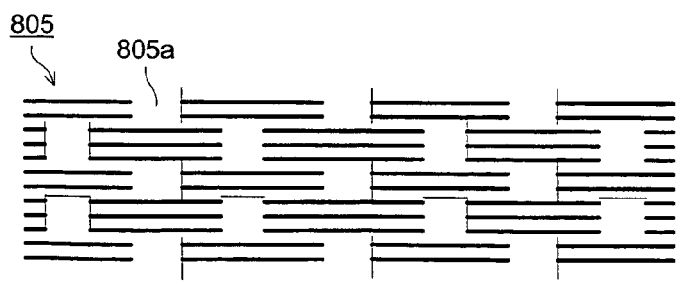

Next, according to FIG. 29, the fourth example of the electronic beam drawing method according to the present invention, and the production method of the base material will be described. Hereupon, in the present example, a case where, in the dose distribution for drawing the inclination portion of the groove portion, by providing the blanking section of various patterns in the drawing line in the scan direction of the electronic beam in the first scan section of the dose amount mix area, various patterns of the first scan section and the second scan section are formed, will be described.

For example, the dose amount mix area 801 shown in FIG. 29(A), is structured so that the blanking section 801a positions in the skewed direction.

The dose amount mix area 802 shown in FIG. 28(B), is structured in such a manner that respective blanking sections 802a, 802a, are arranged zigzag, and they are not adjoined to each other.

The dose amount mix area 803 shown in FIG. 29(C), is structured in such a manner that the length of the first scan section 803b is different corresponding to the position.

The dose amount mix area 804 shown in FIG. 29(D), is structured in such a manner that, when the blanking section 804a is formed slantingly being inclined, its inclination direction is changed by a constant line group.

The dose amount mix area 805 shown in FIG. 29(E) is structured in such a manner that the position of the blanking section 805a is changed for each of a plurality of line groups.

Even when it is the structure in which the blanking section is provided by each kind of above-described drawing patterns, in the same manner as the first to third example, when this is drawn by the electronic beam, the diffusion of the electronic beam is generated in the dose amount mix area of the groove portion, and because, in between the first scan section and the second scan section forming the dose amount mix area, the "vicinity effect" by this electronic beam is generated, when this is developed, a part drawn in the dose amount mix area is not practically the strict binary shape. Further, as described above, because the width of the first scan section and the second scan section forming the dose amount mix area is, respectively, structured so as to be smaller than the diameter of the electronic beam, when this is drawn by the electronic beam, because a part-drawn covering a plurality of times (for example, 2–3 times) by the overlap of the drawing areas by the electronic beam, is generated, when this is developed, a part drawn in the dose amount mix area, as the result of that, is the inclination surface having the intermediate height.

As the result of this, the step difference between the adjoining dose amount division area 201 and the dose amount division area 202 is structured as the more gentle inclination surface, by the dose amount mix area having these intermediate heights, as compared to the step difference between the inclination portions of the conventional groove portion.

The Second Embodiment

The second embodiment to attain the second object, will be described below.

As shown in FIG. 9, when, on the base material 2, the groove portion shape or the step difference portion of the binary pattern is drawn concentrically (hereinafter, this is called the circular pattern) on at least one surface, each pattern constituting this circular pattern is drawn by approximating to polygon by the electronic beam drawing apparatus. In this polygonal approximation, the characteristic of the second embodiment is in a fact that, initially, the dose amount is set to a value of 1-a predetermined number-th of the dose amount which is originally required, and while the polygon is shifted in the circumferential direction by a predetermined number of times, when, each of that time, it is drawn repeatedly, the step difference portion of the ideal circular pattern which is closer to the circle is formed after the developing processing. Further, when each pattern constituting the circular pattern is drawn by approximating to the polygon by the electronic beam drawing apparatus, by setting the break point between fields to the position passing each apex of the polygon, there is no case where the connect portion between fields positions at each side of the polygon, and the connect portion between fields is made not conspicuous.

That is, in the base material in the present embodiment, because the step difference portion of the ideal circular pattern which is closer to the circle, is formed, further, the connect portion between fields at the drawing is not conspicuous, when the base material becomes an optical lens which is the final product form, the lowering of its diffraction efficiency or the lowering of the product value can be avoided.

(Additional Description)

Figure 30:
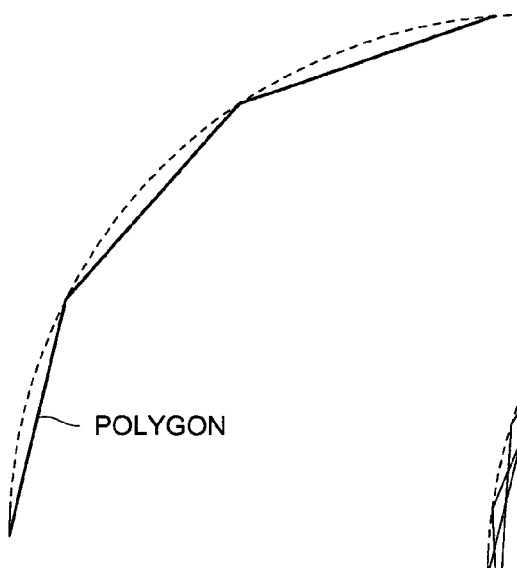
FIGS. 30(a), and 30(b) are explanatory drawings showing a characteristic of the second embodiment of the present invention.
Figure 30:
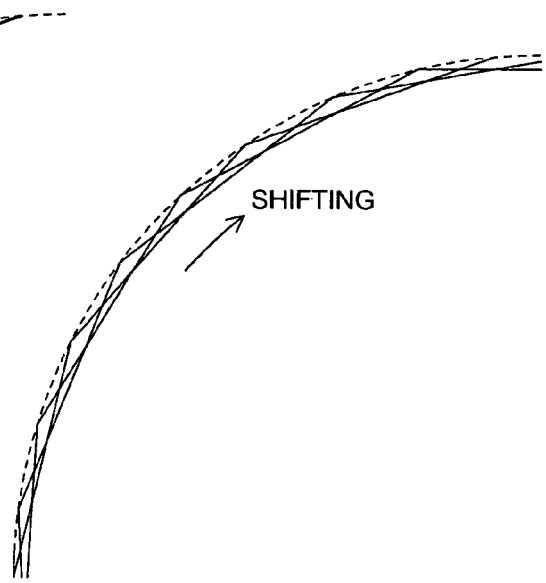
Figure 31:
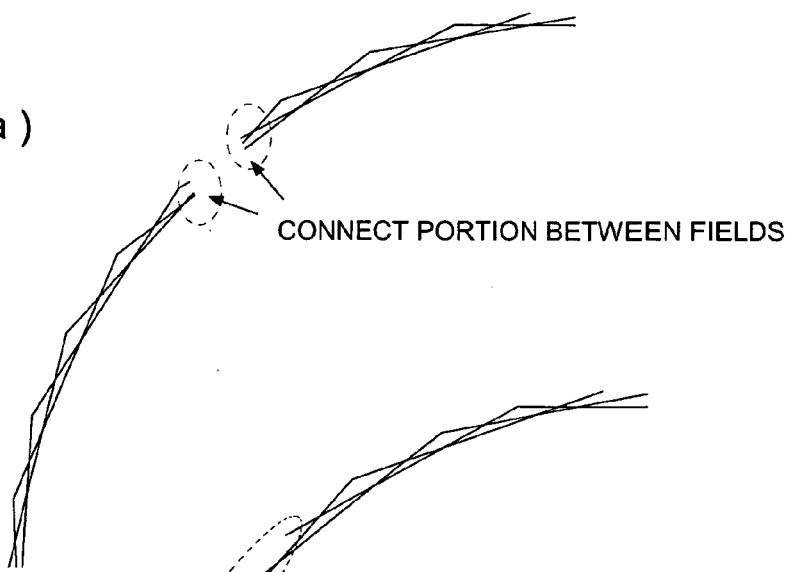
FIGS. 31(a), and 31(b) are explanatory drawings showing a characteristic of the second embodiment of the present invention.
Figure 31:
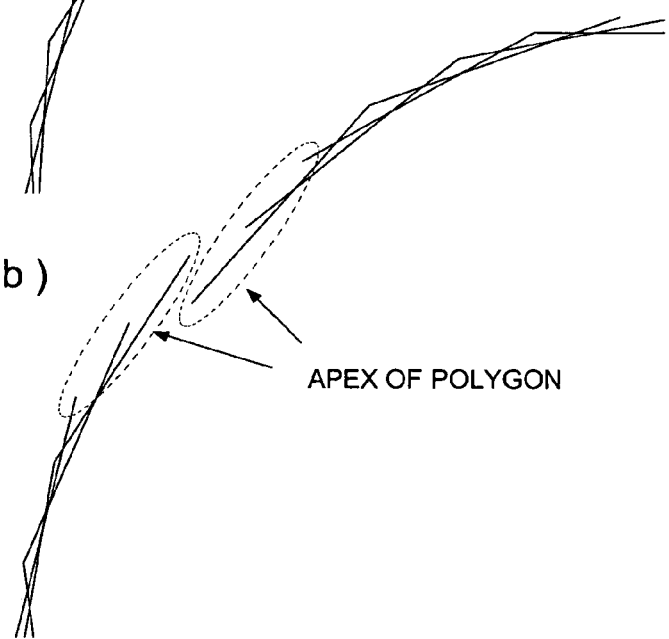

The above-described characteristic will be illustrated, and described. The dotted line portion of FIG. 30(*a*) shows a circular arc of a part of the circular pattern, and the solid line portion shows a part of the polygon to which this circular pattern is approximated. FIG. 30(*b*) shows the characteristic of the second embodiment, and shows an example in which the polygon is shifted 3 times in the circumferential direction. In the present example, the dose amount is set to a value of 1-third of the dose amount set for drawing the polygon of FIG. 30(*a*). That is, when the polygon is drawn 3 times while it is shifted in the circumferential direction with the 1-third dose amount, the circular pattern which is closer to the circle can be drawn in a predetermined depth. Then, when the connect portion between fields shown in FIG. 31(*a*), is set to the positions of apexes of the polygon as shown in FIG. 31(*b*), the connect portion is not conspicuous.

Figure 32:
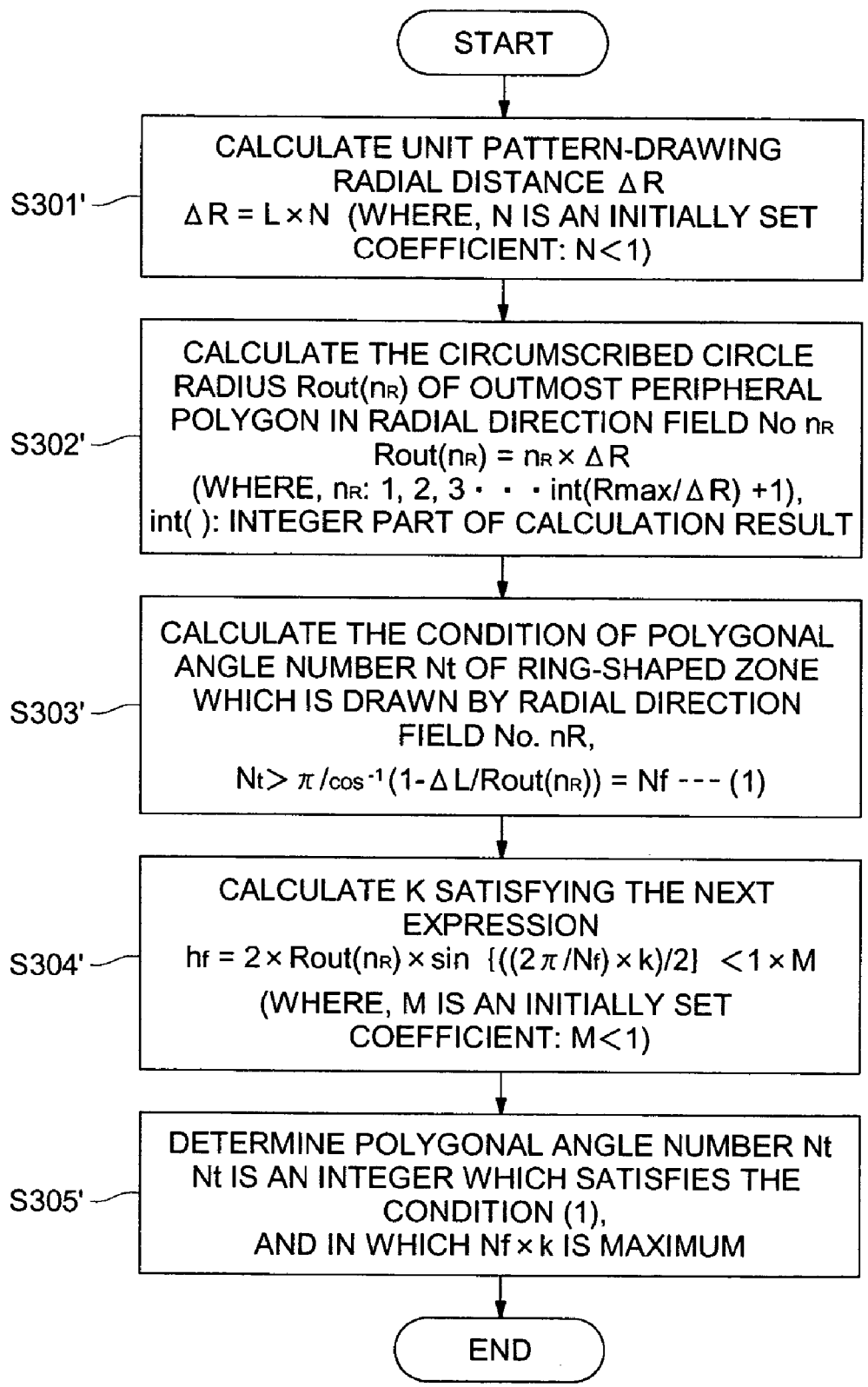
FIG. 32 is a flowchart showing an example of the processing sequence to determine the number of angles of the polygon when the circle-drawing is approximated by the polygon, in the electronic beam drawing apparatus according to the present invention.
Figure 33:
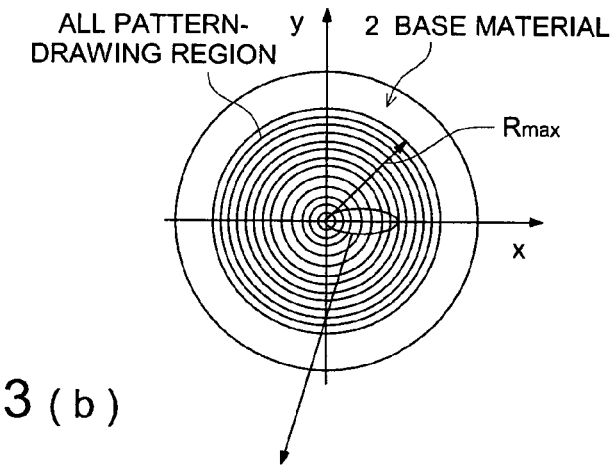
FIGS. 33(a), 33(b), 33(c), and 33(d) are explanatory drawings for explaining an example of the processing sequence to determine the number of angles of the polygon when the circle-drawing is approximated by the polygon, in the electronic beam drawing apparatus according to the present invention.
Figure 33:
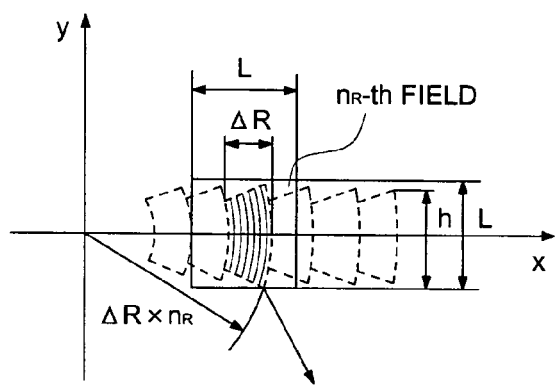
Figure 33:
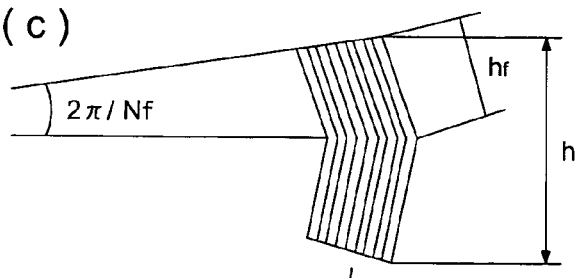
Figure 33:
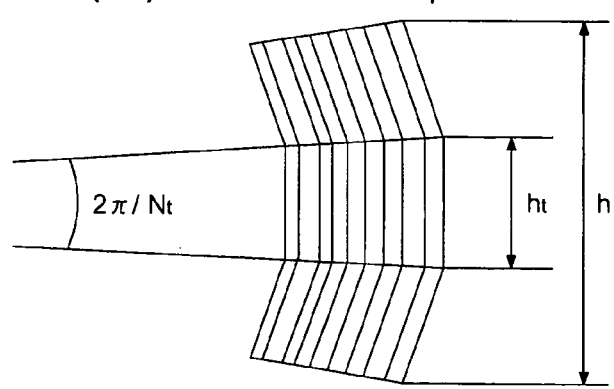

Herein, according to a flowchart shown FIG. 32, referring to the illustration shown in FIG. 33, a flow of the processing relating to "the determination of the field position on the circumferential surface" and the "optimum polygonal angle number calculation of the circular arc which is drawn in the field" will be described.

Hereinafter, each kind of parameters are defined as follows.

Maximum drawing radius: $R_{max}$

Maximum possible scan area size: L×L 1 dot size: $\Delta L \times \Delta L$

Herein, the maximum drawing radius: $R_{max}$ indicates, as shown in FIG. 33(A), the maximum radius in all drawing area of the base material 2.

Initially, the unit drawing radial distance $\Delta R$ is calculated from the following expression (S301'). This unit drawing radial distance $\Delta R$ is, as shown in FIG. 33(B), the drawing distance relating to the radial direction (x axis direction) in each of fields. Further, a sign N is a ratio to the field size L of the unit drawing radial distance $\Delta R$ in the radial direction which is previously set. $\Delta R = L \times N$ (where, N is a coefficient which is initially set: N<1).

Next, the circumscribed circle radius $R_{out}(n_R)$ of the outmost peripheral polygon in the $n_R$ field (the field Non$_R$ in the radial direction) is calculated by the following expression (S302'). This circumscribed circle radius $R_{out}(n_R)$ is, as shown in FIG. 33(B), the maximum circumscribed circle radius in the drawing area of the $n_R$-th field in the radial direction (x axis direction).

$R_{out}(n_R) = n_R \times \Delta R$ (Where, $n_R = 1, 2, 3, \ldots$, int $(R_{max}/\Delta R)+1$, herein, int(x) is an integer part of the calculation result of (x)).

Next, the condition of the angle number Nt of the polygon of each of circular patterns (ring-shaped zone) which is drawn in the $n_R$ field (the radial direction field Non$_R$) is calculated by the following expression (S303').

$$Nt > \pi/A \cos(1-\Delta 1/R out(n_R)) = n_f \qquad (1)$$

Herein, the above expression (1) will be described.

Figure 34:
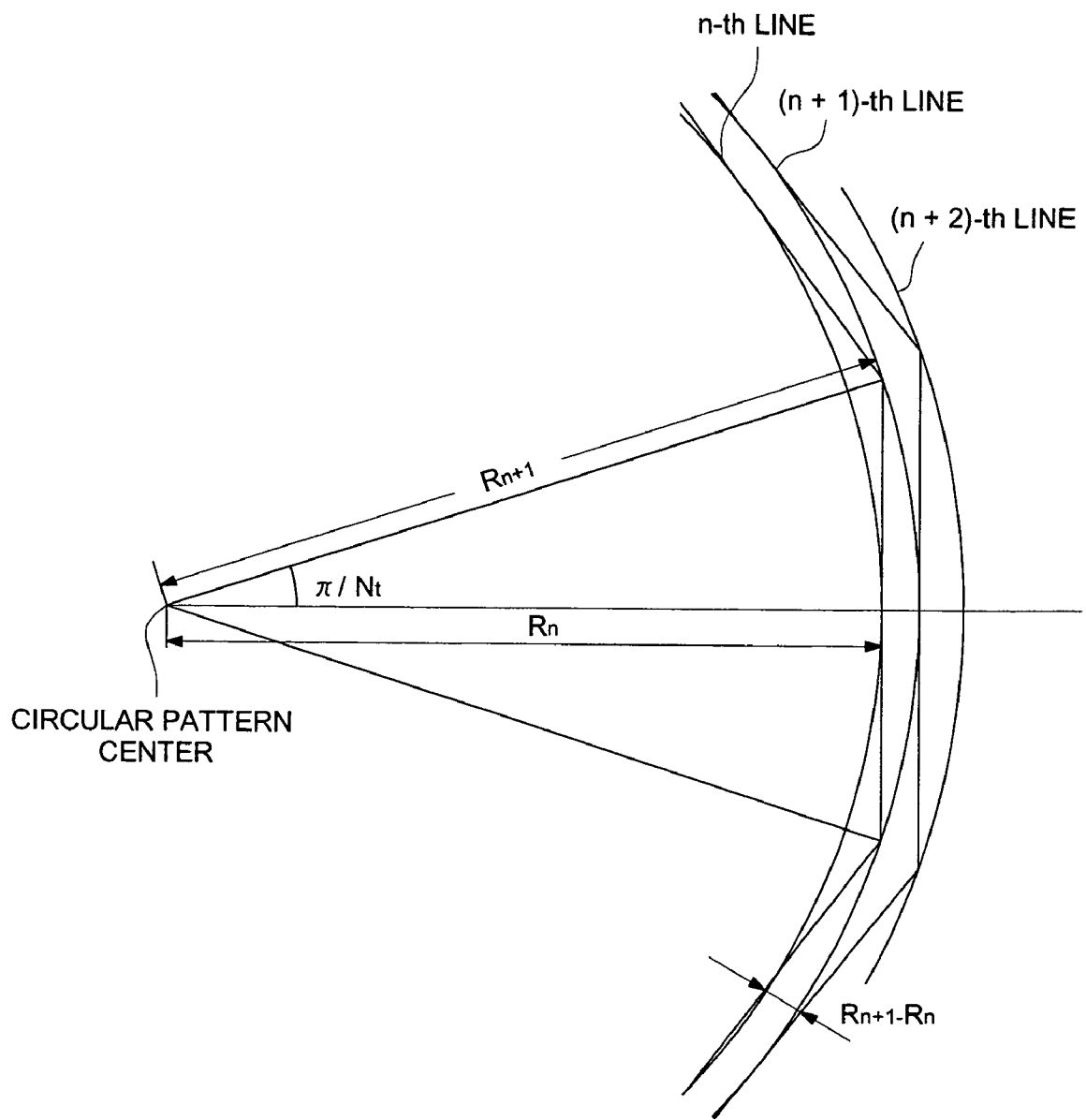
FIG. 34 is an explanatory drawing for explaining an example of the processing sequence to determine the number of angles of the polygon when the circle-drawing is approximated by the polygon, in the electronic beam drawing apparatus according to the present invention.

In the present invention, in the case where each pattern is drawn repeatedly and being superimposed, when the drawing lines of each of patterns are superimposed between adjoining patterns, the fluctuation is generated in the total dose amounts (actually, given dose amount), further, in order to avoid a problem that, by the influence by the vicinity effect, a desired shape can not be obtained as the result, so that the drawing lines of each of patterns are not superimposed between adjoining patterns, the angle number of the polygon is determined so that the distance between adjoining polygons is smaller than the minimum movement distance unit of the electronic beam. That is, as shown in FIG. 34, when the radius of the circle which circumscribes each polygon (angle number Nt) is $R_{n+1}$, and the radius of the circle which is inscribed is $R_n$, the difference between them may be smaller than the minimum movement distance unit of the electronic beam.

Initially, when the difference between the radius $R_{n+1}$ of the circle which circumscribes the polygon (angle number Nt) and the radius $R_n$ of the inscribed circle is expressed in the expression, it is as follows.

$$R_{n+1}-R_n<R_{n+1}(1-\cos(\pi/Nt)) \quad (2)$$

Herein, because $R_{n+1}-R_n$ is the minimum movement distance unit of the electronic beam, that is, not larger than 1 dot size $\Delta L$ of the electronic beam, and $R_{n+1}$ can be respectively replaced with $Rout(n_R)$, the expression (2) can be expressed as follows.

$$\Delta L<Rout(n_R)(1-\cos(\pi/Nt)) \quad (3)$$

Further, when the expression (3) is transformed, $$1-\cos(\pi/Nt)>\Delta L/Rout(n_R)$$

$$\cos(\pi/Nt)<1-\Delta L/Rout(n_R)$$

$$\pi/Nt<\cos^{-1}(1-\Delta L/Rout(n_R))$$

$$Nt/\pi>1/\cos^{-1}(1-\Delta L/Rout(n_R))$$

$$Nt>\pi/\cos^{-1}(1-\Delta L/Rout(n_R))=N_f \quad (1)$$

Thereby, the expression (1) is introduced.

Hereupon, the angle number Nf satisfies the minimum condition of the angle number of the polygon of each circular pattern (ring-shaped zone), and ideally, it is preferable that the circular pattern is approximated by the polygon of the larger angle numbers. Accordingly, the maximum angle number which can be obtained in 1 field is defined as Nt=k×Nf (where, nf is an integer), and this Nf is calculated. Initially, this k is calculated by the following expression (S304').

$$hf=2\times Rout(n_R)\times\sin\{(2\pi/Nt)/2\}<L\times M \quad (4)$$

When the expression (4) is transformed, $$hf=2\times Rout(n_R)\times\sin\{(2\pi/Nt)\times k/2\}<L\times M \quad (5)$$

Herein, M is an initialized coefficient: M<1.

Further, hf corresponds to the length of one side of the polygon when the angle number of the polygon is Nf, and as can clearly be seen from FIGS. 33(B), (C), it has the relationship of $$L\times M=h>hf.$$

Accordingly, as shown in also FIGS. 33(C), (D), because Nt>Nf, then ht<hf, when the expression (5) is satisfied, even when the angle number of the polygon is Nt, the drawing area is positively settled in 1 field.

Then, the angle number Nt of the polygon is determined (S305'). Hereupon, in this case, when the value of k is selected so that Nt satisfies the conditional expression (1), and k×Nf is the maximum integer, the angle number Nt of the polygon is determined.

In this manner, from the calculated angle number Nt of the polygon, the connect portion of each field is set to the position which passes each apex of the polygon. Then, for each field, the connect address of the adjoining field is calculated. The calculation is conducted on the assumption that the curved portion 2a of the base material 2 is a plane. Hereupon, the lines constituting the polygon are respectively settled in the same field.

Figure 35:
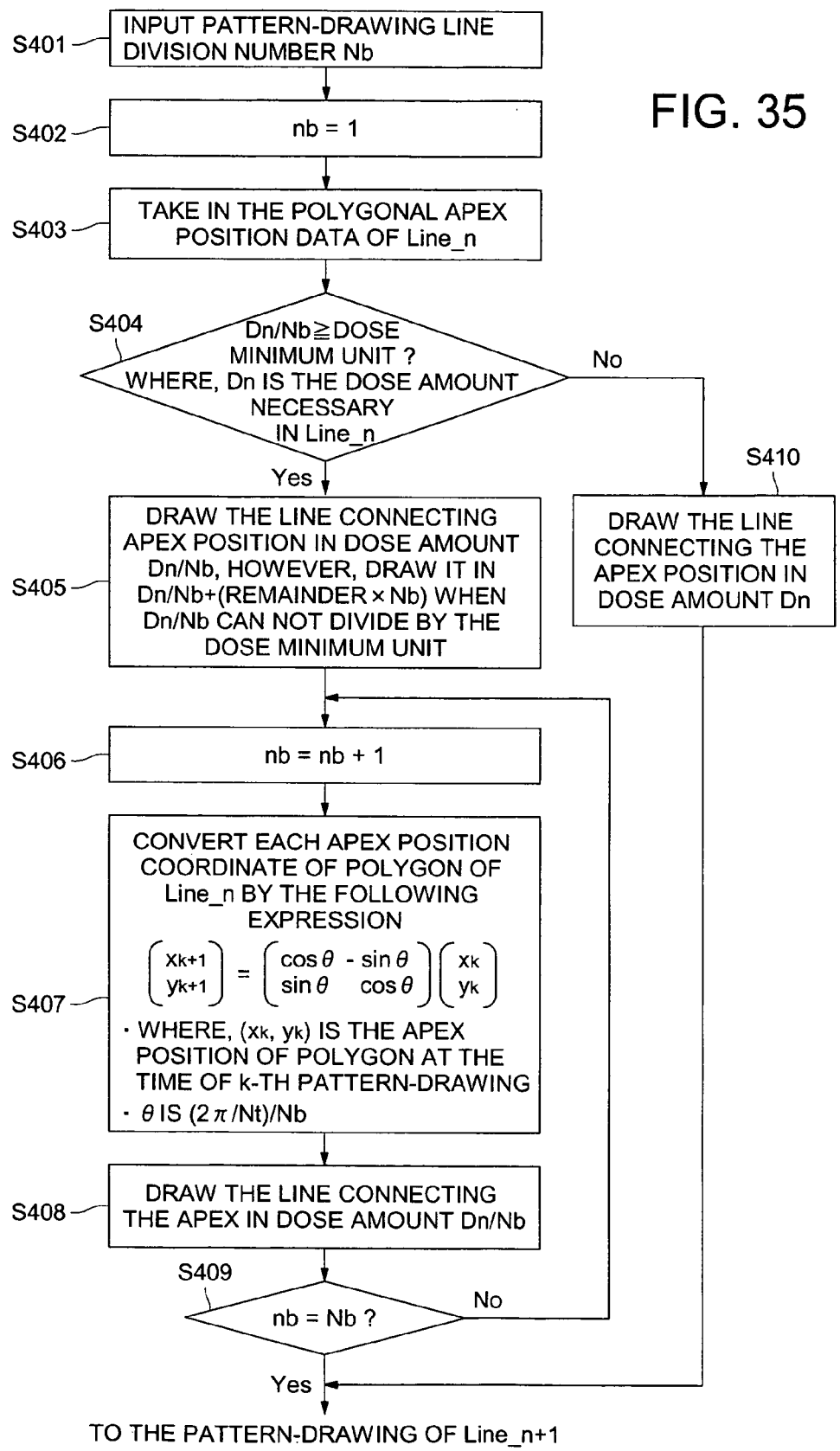
FIG. 35 is a flowchart showing an example of the processing sequence to draw the polygon when the circle-drawing is approximated by the polygon, in the electronic beam drawing apparatus according to the present invention.
Figure 36:
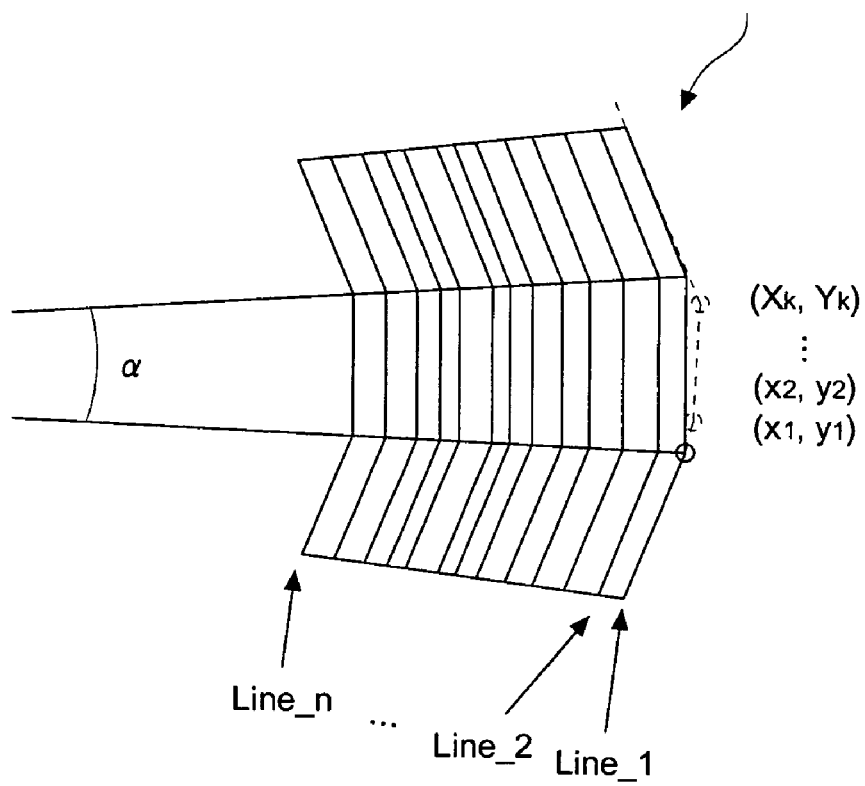
FIG. 36 is an explanatory drawing for explaining an example of the processing sequence to draw the polygon when the circle-drawing is approximated by the polygon, in the electronic beam drawing apparatus according to the present invention.

Next, referring to the flowchart shown in FIG. 35, "the flow of the processing to draw by superimposing a predetermined number of times while the polygon is shifted in the circumferential direction" will be described. Hereupon, the processing described below is a matter in which the control section 170 in FIG. 1 conducts, based on the dose distribution information 161a of the shape storage table 161 of the memory 160, polygonal apex position information 161b, dose correction value information 161c, according to the processing program 163a of the program memory 162, dose amount calculation program 163c and polygonal apex position calculation program 163d.

The drawing line division number Nb is previously inputted by using the set means 181 (S401). Hereupon, as this drawing line division number Nb, an arbitrary value is inputted, and the information is accommodated in the dose correction value information 161c of the memory 160. This drawing line division number Nb corresponds to "a predetermined number" of the present invention, and indicates a predetermined number described as above. That is, when the polygon is drawn, it is a number to define that the value of a what part the original dose amount is made, or what number of times the polygon is drawn by being shifted and superimposed.

When the polygon is initially drawn, initially nb=1 is inputted (S402). This nb is a numeric value expressing the number of drawing times of the polygon, and initially 1 is inputted.

Next, as shown in FIG. 19, each apex position coordinate data of the polygon in the drawing line_n (where, n is an arbitrary natural number) is taken in (S403). However, initially, each apex position coordinate data $((x_1, Y_1)-(X_k, Y_k))$ of the polygon in the drawing line_1 is taken in. Hereupon, each apex position coordinate data of this polygon is accommodated in the polygon apex position information 161b of the memory 160.

Next, it is judged whether Dn/Nb≧the dose amount minimum unit (S404). (where, Dn is the dose amount necessary in Line_n).

Herein, when Dn/Nb≧the dose amount minimum unit (S404, Yes), the line connecting to the apex position is drawn by the dose amount Dn/Nb (S405). (where, when Dn/Nb can not be divided by the dose amount minimum unit, it is drawn by Dn/Nb+(remainder×Nb).)

Next, in order to advance the second drawing, nb expressing the drawing number of times is substituted by nb=nb+1 (S406).

Herein, each apex position coordinate of the polygon of the drawing Line_n is transformed by the following expression (S407).

$$\begin{bmatrix} X_{k+1} \\ Y_{k+1} \end{bmatrix} = \begin{bmatrix} \cos\theta & -\sin\theta \\ \sin\theta & \cos\theta \end{bmatrix} \begin{bmatrix} X_k \\ Y_k \end{bmatrix}$$

(Where, $(X_k, Y_k)$ is each apex position coordinate of the polygon at k times drawing; and θ is (2π/Nt)/Nb.)

Then, the line connecting the apex after transformation is drawn by the dose amount Dn/Nb (S408).

Herein, it is judged whether the drawing times nb reaches the drawing line division number Nb (S409).

Herein, when nb<Nb (S409, No), the sequence advances to S406 to conduct the next drawing.

Then, when the drawing times nb reaches the drawing line division number Nb (S409, Yes), the sequence advances to the drawing of the next line Line_n+1 (S409).

Hereupon, in the above-described S404, when Dn/Nb<the dose amount minimum unit (S404, No), the drawing line division number Nb is made 1, and the line connecting the apex position is drawn by the dose amount Dn (S410).

Then, the sequence advances to the drawing of the next drawing line Line_n+1 (S409).

Hereinafter, until the drawing for the all drawing lines is completed, the processing from the S402 to S410 is repeated.

(Specific Structure of the Control System)

Figure 37:
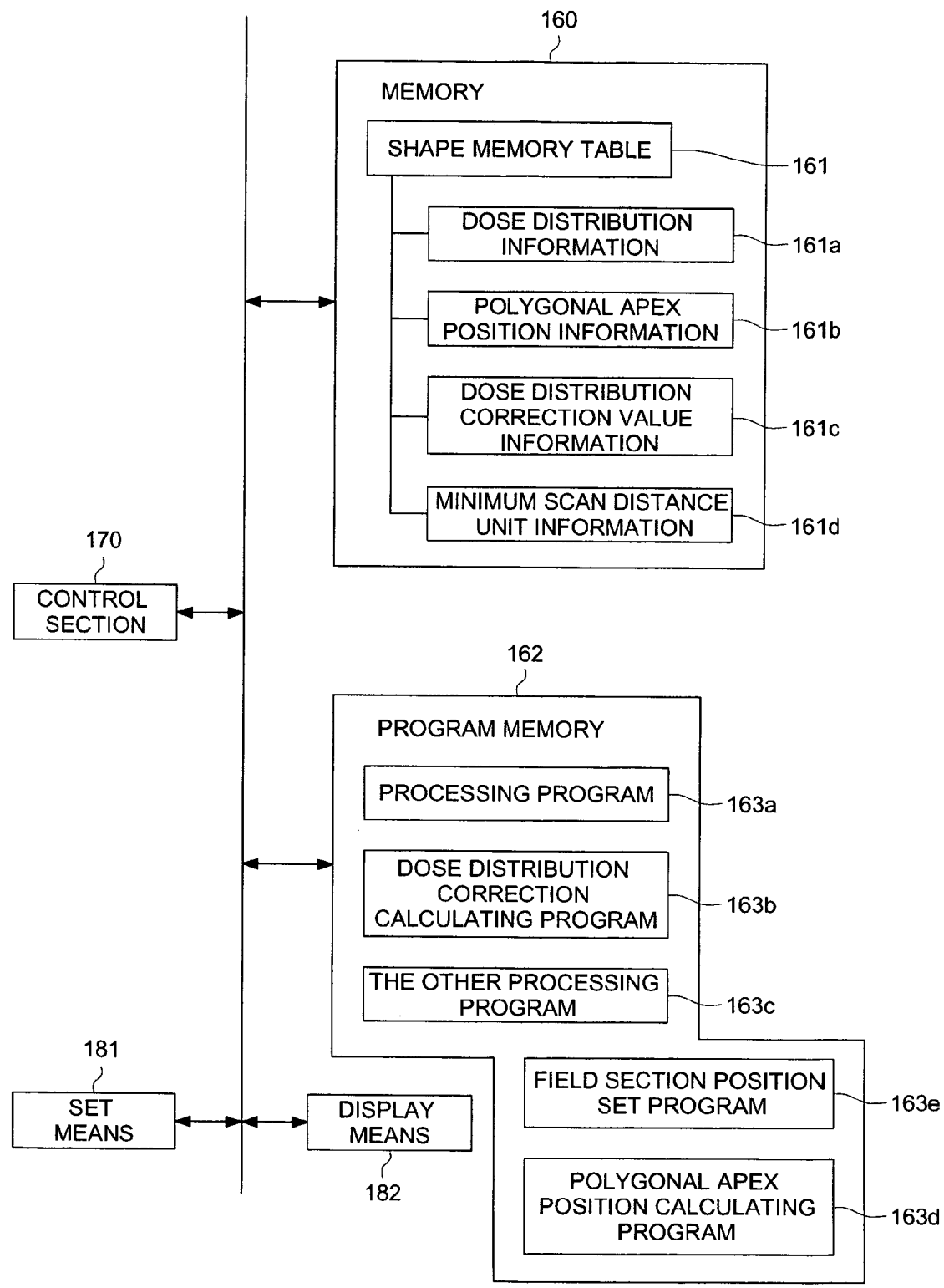
FIG. 37 is a function block diagram showing the detail of the control system to calculate and control the dose amount, number of angles of the polygon, coordinate position of each of apexes of the polygon, for conducting the circle-drawing, in the electronic beam drawing apparatus according to the present invention.

In FIG. 37, the function block diagram of the control system to control the present example, is disclosed.

The memory 160 of the electronic beam drawing apparatus 1 shown in FIG. 1 has the shape memory table 161 as shown in FIG. 37, and in this shape memory table 161, the dose distribution information 161a in which the dose distribution corresponding to the drawing position when, for example, on the curved surface portion 2a of the base material 2, the inclination portion 3b and the side wall portion 3a of the groove portion 3 are formed as desired for each pitch L, is previously defined, and the polygonal apex position information 161b in which the information relating to the coordinate position of each apex of the polygon, which is necessary when the circular pattern consisting of the groove portion 3 formed for each pitch L is approximated to the polygon and line drawn, is previously defined, and simultaneously, the dose correction value information 161c in which the predetermined number for setting the original dose amount introduced by the dose distribution information 161a to the value of a predetermined number-th, is defined, and in the same manner, the minimum scan distance unit information 161d in which the information relating to the minimum scan distance unit of the electronic beam of the apparatus is previously defined, are accommodated.

Further, in the program memory 162, a processing program 163a (in more details, a program to conduct a series of processing from S101 to S119 in FIGS. 38–40 which will be described later), to conduct the drawing processing, and when the circular pattern is approximated by the polygon and the line drawing is conducted, the polygonal angle calculation program 163b (in more details, a program to conduct a series of processing from S301 to S305 of FIG. 32) to calculate the angle number of the polygon based on the information relating to the minimum scan distance unit of the electronic beam of the apparatus defined by the minimum scan distance unit information 161d, and on the base of the dose distribution information defined by the dose distribution information 161a and dose correction value information 161c, the dose amount calculation program 163c for calculating the dose amount (a value in which the original dose amount is made one-predetermined number-th) when the polygon is drawn, the polygonal apex position calculation program 163d for calculating the coordinate position for each drawing of each apex of the polygon (in more details, a program to conduct the conversion processing of each apex coordinate position in S407 of FIG. 35), or a field section position set program 163e for setting the section of the field to the position passing each apex of the polygon, is accommodated.

In the structure as described above, the control section 170, when the circular pattern is approximated by the polygon and the line drawing is conducted, initially, on the base of the minimum scan distance unit information 161d to be accommodated in the memory 160, according to the polygonal angle number calculation program 163b, calculates the angle number of the polygon, and next, on the base of the dose distribution information 161a and the dose correction value information 161c to be accommodated in the memory 160, according to the dose amount calculation program 163c, calculates the dose amount when the polygon is drawn, simultaneously, on the base of the polygonal apex position information 161b to be accommodated in the memory 160, according to the polygonal apex position calculation program 163d, while conducts the processing by which the polygon is shifted in the circumferential direction for each predetermined angle, draws it a predetermined number of times by superimposing the polygon in the dose amount. Herein, the control section 170 sets the section between fields when the polygon is drawn, according to the field section position set program 163e, at any time, at the position which passes each apex of the polygon. Under such a control, the circular pattern consisting of the inclination portion 3b, side wall portion 3a and groove portion 3c of the groove portion 3, is drawn.

Further, to the control section 170, the set means 181 for setting the predetermined number, and the display means 182 for displaying a set image plane therefor, are also connected.

Hereupon, the control section 170 and the dose amount calculation program 163c structure the "dose amount set means" of the present invention. Further, by the control section 170 and the polygon calculation program 163b, the "angle number set means" of the present invention is structured. Further, by the control section 170 and the field section position set program 163e, the "field position set means" of the present invention is structured. Further, by the set means 181, the "predetermined number set means" of the present invention is structured.

Herein, the control system 300 shown in FIG. 20 in the first embodiment can apply as the specific structure of the control system for conducting each kind of processing when each drawing line is linearly drawn by approximating the circular drawing in the present example by a regular polygon. Therefore, referring to FIG. 20, the specific structure of the control system in the present example will be described below.

The drawing pattern data memory 301 in the control system 300 in the present embodiment is structured as the drawing pattern storing means for storing the data relating to various data necessary (corresponding to the radius of the circle) for, for example, approximating to the regular polygon (including an indefinite polygon) when the circle is drawn, (for example, relating to the circle of a certain radius k mm, the information corresponding to each circle such as the division number n by the polygon, the coordinate information of the position of each side and the position of each point, and the multiple value of the clock number, and further, the position in Z direction), various data necessary for linearly approximating when drawing various curved lines, not limited to the circle drawing, and the data relating to each kind of drawing pattern (rectangular, triangle, polygon, vertical line, lateral line, slanting line, disc, circumference, triangle periphery, circular arc, sector, ellipsis).

Further, the control system 300 is structured by including: the drawing condition calculating means 310 for calculating the drawing condition according to the drawing pattern data of the drawing pattern data memory 301; (2n+1) line drawing line calculation means 311 for calculating, from the drawing condition calculating means 310, (when it is (n=0, 1, 2, . . . ), it is (2n+1), when (n=1, 2, . . . ), it may be (2n−1).) that is, the drawing condition of the odd number line; the time constant set circuit 312 for setting the time constant of 1 line according to the (2n+1) line drawing condition calculation means 311; the start point/end point voltage set circuit 313 for setting the voltage in the electron gun power source section 102 relating to the start point and end point of 1 line according to the (2n+1) line drawing line calculation means 311; the counter number set circuit 314 for setting the counter number of the line according to the (2n+1) line drawing condition calculation means 311; the enable signal generating circuit 315 for generating the enable signal according to the (2n+1) line drawing condition calculation means 311; and the deflection signal output circuit 320 for outputting the deflection signal of the odd number line. Hereupon, the line described here, indicates each side constituting the polygon.

Further, the control system 300 is structured by including: the (2n) line drawing condition calculation means 331 for calculating the drawing condition of (2n) line, that is, the even number line from the drawing condition calculating means 310; the time constant set circuit 332 for setting the time constant of 1 line according to the (2n) line drawing condition calculation means 331; the start point/end point voltage set circuit 333 for setting the voltage in the electron gun power source section 102 relating to the start point and end point of 1 line according to the (2n) line drawing condition calculation means 331; the counter number set circuit 334 for setting the counter number of the line according to the (2n) line drawing condition calculation means 331; the enable signal generation circuit 335 for generating the enable signal according to the (2n) line drawing condition calculation means 331; the deflection signal output circuit 340 for outputting the deflection signal of the even number line; the blanking amplifier 350 for conducting the blanking when moves to the next contour line, according to the (2n) line drawing condition calculation means 331; and the switching circuit 360 for switching the processing of the odd number line and the processing of the even number line, according to the drawing condition in the drawing condition calculating means 310, and the information from the deflection signal output circuit 320 of the odd number line and the deflection signal output circuit 340 of the even number line.

The odd number line deflection signal output circuit 320 is structured by including: the counter circuit 321 which is the counting mean for conducting the count processing according to the scan clock CL1, odd number line count signal CL6 from the counter number set circuit 314, and enable signal of the enable signal generation circuit 315; the DA conversion circuit 322 for conducting the DA conversion according to the count timing from the counter circuit 321, and odd number line drawing condition signal CL3 in the start point/end point voltage set circuit 313; and the smoothing circuit 323 for conducting the processing by which the analog signal converted in this DA conversion circuit 322 is smoothed (the processing for removing the high frequency component of the deflection signal).

The even number line deflection signal output circuit 340 is structured by including: the counter circuit 341 which is the counting means for conducting the count processing, according to the scan clock CL1, even number line count signal CL7 from the counter number set circuit 334, and the enable signal of the enable signal generation circuit 335; the DA conversion circuit 342 for conducting the DA conversion according to the count timing from the counter circuit 341, and the even number line drawing condition signal CL5 in the start point/end point voltage set circuit 333; and the smoothing circuit 343 for conducting the processing by which the analog signal converted in this DA conversion circuit 342 is smoothed.

Figure 3:
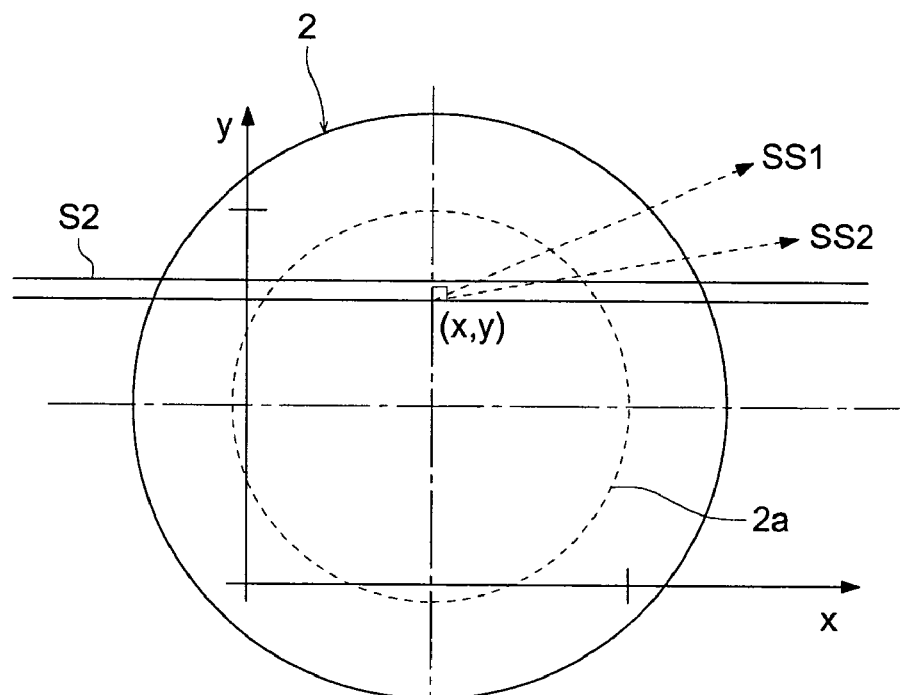
FIGS. 3(a) to 3(c) are explanatory drawings for explaining a method for measuring the surface height of the base material.
Figure 3:
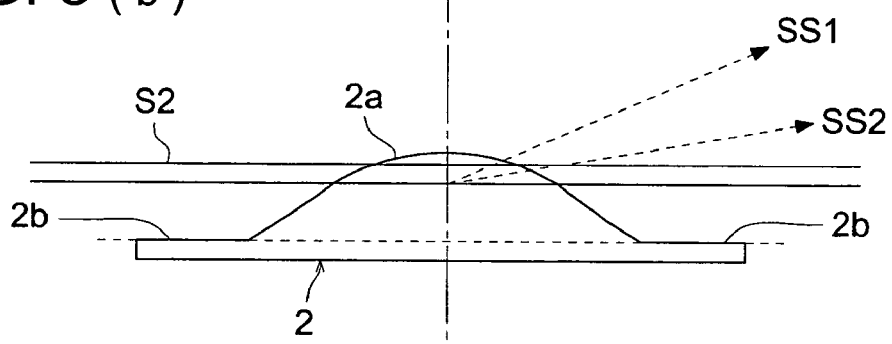
Figure 3:
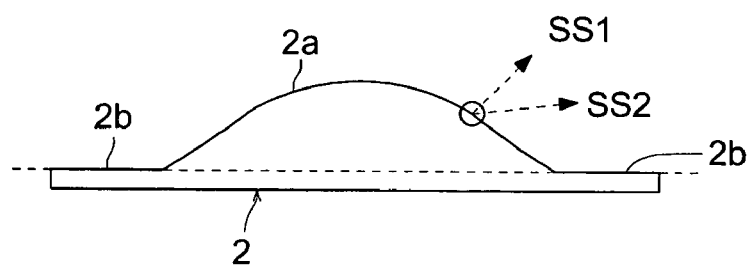

Hereupon, each section constituting these control systems 300 is the structure in which any one of them can be controlled by the control section 170 shown in FIG. 3. Further, these control systems 300 may be the structure which forms respectively the control system for X deflection and the control system for Y deflection.

Hereupon, by the control system 300 including the drawing pattern data memory 301 and the drawing condition calculation means 310, the "calculation means" can be structured. This "calculation means" has a function by which each position of at least 2 points corresponding to the distance ("the minimum movement distance unit of the electronic beam" of the present invention), is calculated, which is corresponding to the time of the integer times of the minimum time resolving power regulated by the clock number of each of DA converters (high speed D/A converters 114a–114c) connecting to each of deflection sections (molding deflection section 112a, subsidiary deflection section 112b, main deflection section 112c), on the scan line to be scanned. In this case, the control system 170 controls between respective positions calculated by the calculation means in such a manner that they are almost linearly scanned by the electronic beam. Further, in the same manner, the "calculation means" of another mode of the present invention has a function, on the scan line which is scanned almost circularly, by which each apex position of the polygon in which the distance corresponding to the time of integer times of the minimum time resolving power regulated by the clock number of the DA converter (high speed D/A converters 114a–114c) is a side, is calculated. Further, in the same manner, the control means scans almost linearly by the electronic beam between respective positions calculated by the calculation means.

The control system 300 having the above-described structure almost acts as follows. That is, when the drawing condition calculation means 310 obtains the information necessary for the scan (drawing) by the linear approximation from the pattern data memory 301, it conducts the calculation processing of a predetermined drawing condition, and for example, in each of sides when, for example, one circle is approximated to each side of the regular polygon, the information relating to the first side, and the odd number-th line is transmitted to the (2n+1) line drawing condition calculation means 311, and respectively the information relating to the next side, and even number-th line is transmitted to the (2n) line drawing condition calculation means 331.

Thereby, for example, the (2n+1) line drawing condition calculation means 311 generates the drawing condition elating to the odd number line, and according to the scan clock CL1 and generated odd number line drawing condition generation signal CL2, outputs the odd number line deflection signal CL9 from the deflection signal output circuit 320.

On the one hand, the (2n) line drawing condition calculation means 331 generates the drawing condition relating to the even number line, and according to the scan clock CL1 and generated even number line drawing condition generation signal CL4, outputs the even number line deflection signal CL10 from the deflection signal output circuit 340.

The outputs of these odd number line deflection signal CL9 and even number line deflection signal CL10 are alternately switched by the switching circuit 360 under the drawing condition calculation means 310. Accordingly, when, a certain circle is approximated to the regular polygon, and each side is calculated, each side is alternately linearly drawn (scan) in such a manner that, when a certain side, and the odd number-th side are drawn, the next side and the even number-th side are drawn, and further, the next side and the odd number-th side are drawn.

Then, when, for a certain circular pattern, the first drawing is completed, after that, the above-described drawing processing is repeated until it reaches a predetermined number of times. Then, when the drawing covering a predetermined number of times is completed, the drawing condition calculation means 310 transmits to that effect to the blanking amplifier 350, and conducts the processing to accelerate to draw the next circular pattern.

(For the Processing Sequence)

Next, referring to FIGS. 38 to 40, the processing sequence when the base material having the diffractive structure in which a plurality of groove portions are formed concentric circularly, is made by using the electron beam drawing apparatus having the above-described structure, will be described.

Figure 38:
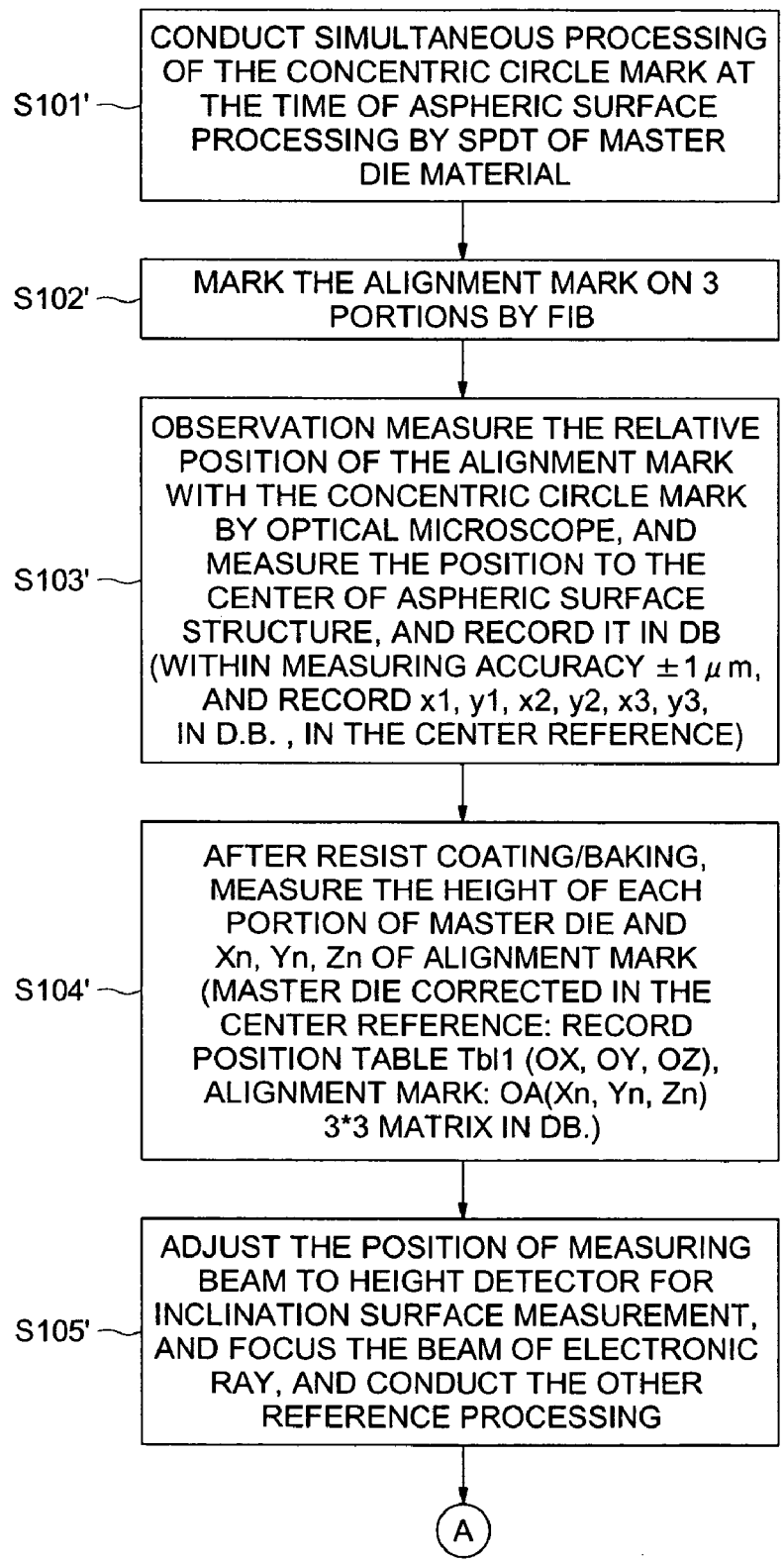
FIG. 38 is a flowchart showing an example of the processing sequence when the base material is drawn, in the electronic beam drawing apparatus according to the present invention.

As shown in FIG. 38, initially, when the mother die material (base material) is aspheric surface-processed, by SPDT (single Point Diamond Turning: diamond cutting by the ultra-precise processing machine), the simultaneous processing of the concentric circular mark is conducted (step, hereinafter, "S" 101'). In this case, it is preferable that, by the optical microscope, the shape of the detection accuracy, for example, within ±1 μm is formed.

Next, by FIB, the alignment mark is marked, for example, at 3 positions (S102'). Herein, it is preferable that the cross-shaped alignment mark has the detection accuracy within ±20 nm in the electron beam drawing apparatus.

Further, the relative position of the alignment mark with the concentric circle mark is observation-measured by the optical microscope, and the position to the center of the aspheric surface structure is measured, and recorded in the data base (DB) (or the memory (hereinafter, the same) (S103'). Hereupon, it is preferable that this measurement accuracy is within ±1 μm, and 3 alignment mark positions of the center reference, x1y1, x2y2, x3y3, are registered in the data base (DB).

Further, the height of each portion of the master die (base material) after the resist coating/baking and the position of the alignment mark (Xn, Yn, Zn) are measured (S104'). Herein, the master die (base material) corrected in the center reference: position table Tb11 (OX, OY, OZ), and alignment mark: OA(Xn, Yn, Zn) (all of them are 3*3 matrix), are registered in the data base (DB).

Next, other than that, each kind of preparing processing is conducted like as that, to the measuring apparatus (height detector) for the inclination surface measurement,—of the position of the measurement beam is adjusted, and the beam of the electron ray is focused (S105').

In this case, the measurement beam for the height detection is projected to the correcting device which is needle-like (50 nm level) for EB (electronic beam) focus, and in the SEM mode, it is observed by the electronic beam drawing apparatus, and focused.

Figure 39:
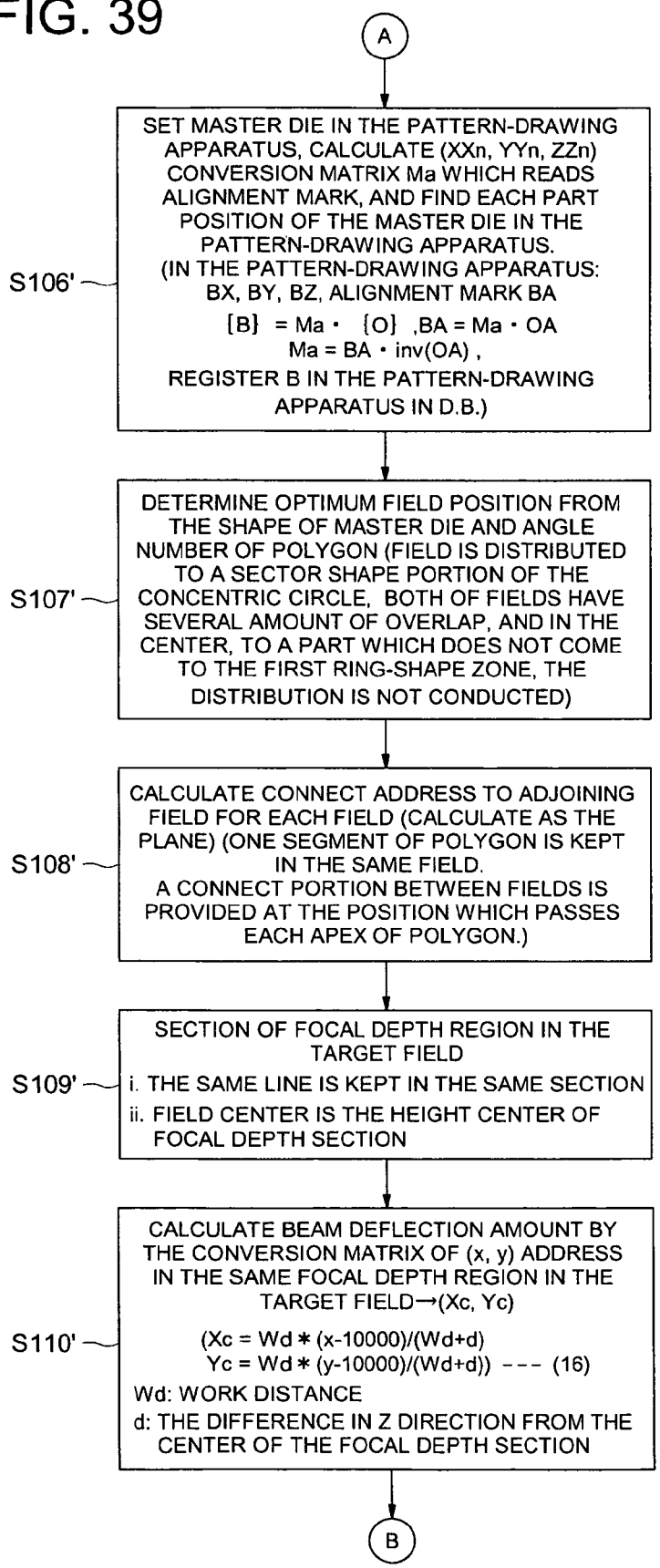
FIG. 39 is a flowchart showing an example of the processing sequence when the base material is drawn, in the electronic beam drawing apparatus according to the present invention.

Next, as shown in FIG. 39, the master die (base material) is set in the electronic beam drawing apparatus, the alignment marks are read (XXn, YYn, ZZn), and transformation matrix Ma is calculated, and each portion position of the master die in the electronic beam drawing apparatus is found (S106'). In this case, in the electronic beam drawing apparatus, each of values as shown in S106' is registered in the data base (DB).

Further, the optimum field position is determined from the shape of the master die (base material) and the "angle number of the polygon when the circular pattern is approximated by the polygon and line-drawn" which will be described later (S107'). Hereupon, it is presumed that the field is distributed to the sector shape of the concentric circle. Further, it is presumed that mutual fields are made to have some overlaps. Further, it is presumed that, to a portion which does not come to the first ring-shaped zone in the center, the field is not distributed.

From the angle number Nt of the polygon calculated according to the present embodiment, the connect portion of each field is set to the position which passes each apex of the polygon. Then, for each field, the connect address of the adjoining field is calculated (S108'). This calculation is calculated on the assumption that the curved surface portion 2a of the base material 2 is a plane. Hereupon, the line segments constituting the polygon are respectively accommodated in the same field.

Next, as a section of the same focal depth area in the target field, the same line is entered into the same section. Further, the center of the field is the height center of the focal depth section (S109'). Herein, a value within the height of 50 μm is made the same focal depth range. Further, it is divided into 1—about several portions.

Next, the beam deflection amount is calculated by the conversion matrix (Xc, Yc) of (x, y) address in the same focal depth area in the target field (S110'). This Xc, Yc are respectively the same as the illustrated expression (16). Herein, Wd is the work distance, and d indicates the Z direction deflection from the center of the focal depth section.

Figure 40:
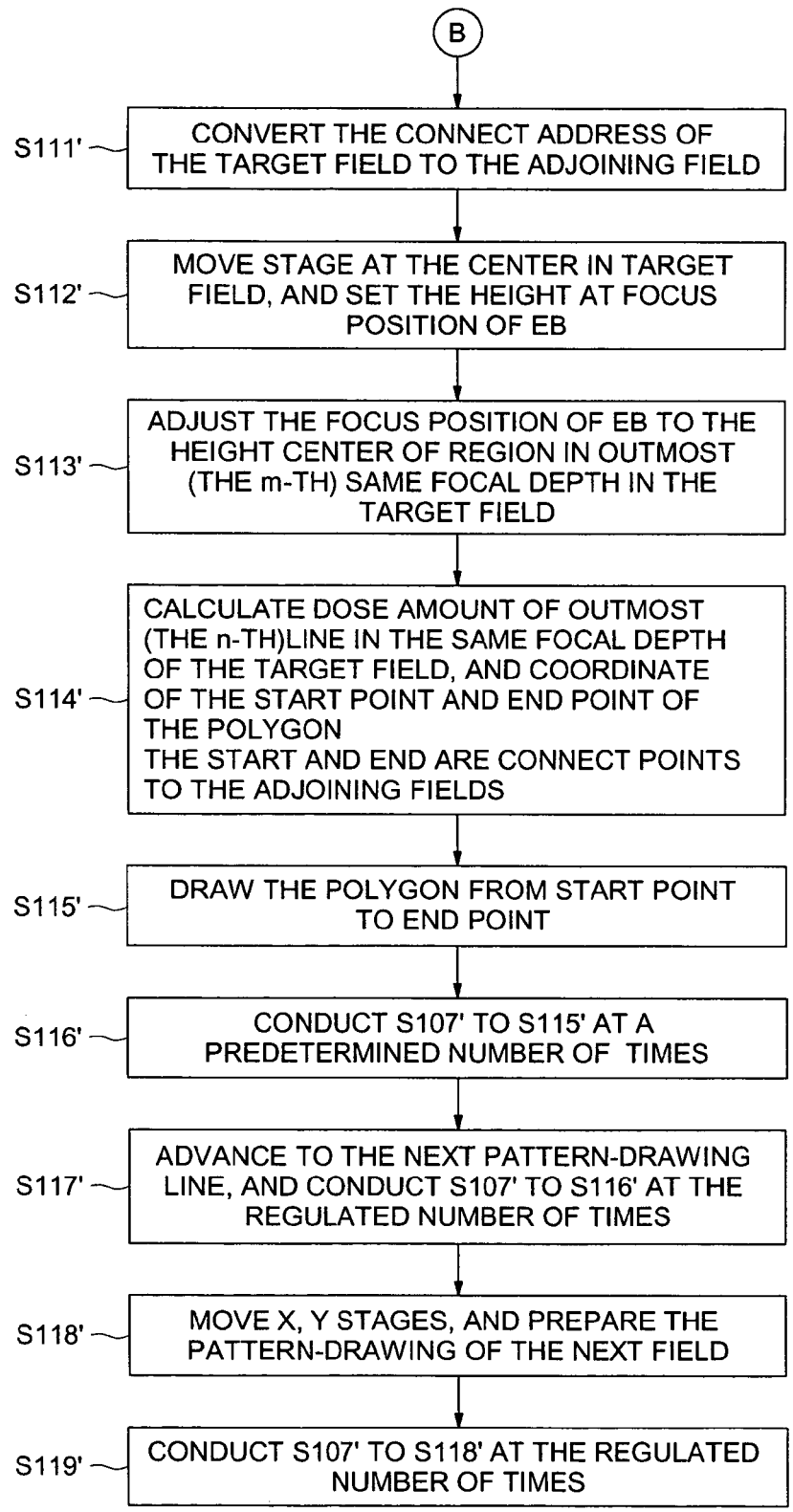
FIG. 40 is a flowchart showing an example of the processing sequence when the base material is drawn, in the electronic beam drawing apparatus according to the present invention.

Further, as shown in FIG. 40, the connect address of the target field and adjoining field is converted (S111'). Herein, the connect position calculated in S108' is converted by using the expression (16) of S110'.

Then, to the center in the target field, the XYZ stage is moved, and the height is set at the focus position of the EB (electronic beam) (S112'). That is, it is set at the field center at the XYZ stage. Further, while the signal of the measuring apparatus (height detector) is detected, the XYZ stage is moved and the height position is read.

Further, to the height center of the area in the same focal depth of the outmost side (m-th), the focus position of the electronic beam (EB) is adjusted (S113'). Specifically, referring to the table B, the XYZ stage is moved a predetermined amount by the difference from the height position of the field center.

Next, as to within the same focal depth in the target field, the dose amount of the outmost side (n-th) line, and the coordinate of the start point and end point of the polygon is calculated. Hereupon, the start (start point) and end (end point) are made connect points to the adjoining field (S114'). In this case, the start point and end point are made integer, and the dose amount is expressed by the numerical value in which the coefficient determined by the maximum dose amount determined by the radial position (incident angle) and the position of the grating is multiplied by the maximum dose amount. Hereupon, when the circular drawing is conducted as in the present example, the dose amount is made one-a predetermined number-th of a predetermined dose amount.

Then, from the start point to the end point of the line which is a part of the polygon existing in the field, the drawing is conducted by the dose amount of the value of one-a predetermined number-th of the original dose amount (S115').

Hereupon, relating to the subsequent to this, as will be described, while the polygon is shifted in the circumferential direction by the predetermined number of times, each time, the drawing processing is conducted by superimposing on the different position. That is, in order to draw the first polygon as described above, after a part of the polygon existing in the field is drawn, the position of the polygon is shifted by a predetermined angle in the circumferential direction, and the second time drawing, that is, a part of the polygon drawn at the first time, is drawn, and this is repeatedly conducted until it reaches a predetermined number of times. That is, the processing from S107 to S115 is repeatedly conducted by a predetermined number of times (S116').

In the manner described above, after the drawing processing for one drawing line is completed, the preparation for the next drawing line is conducted, and the processing from S104 to S116 is conducted again. This is repeated by the regulated number of times (the number of the drawing lines existing in the field) (S117') Then, when the drawing processing is conducted for all drawing lines, the XYZ stage is moved, and prepared for the next field drawing (S118'). In this case, the field number, time, and temperature are registered in the data base (DB) Then, when the processing from S107 to S118 is conducted by the regulated number of times (the number of fields set in the master die), the drawing for all fields is completed (S119').

As described, according to the present embodiment, in the case where the groove shape, or the step difference portion of the binary pattern is concentric circularly drawn, when the circular pattern of the step difference portion is drawn by approximating by the polygon by the electronic beam drawing apparatus, initially, the dose amount is set to a value of one-a predetermined number-th of the dose amount which is originally required, and while the polygon is shifted by a predetermined number of times in the circumferential direction, and each time, when it is drawn by superimposing, by the influence of the vicinity effect, the formation of the step difference portion of the ideal circular pattern which is nearer to the circle can be obtained consequentially after the development processing. Further, in the case where the circular pattern is drawn by approximating by the polygon by the electronic beam drawing apparatus, when the section between fields is set at the position which passes each apex of the polygon, the connect portion between fields can be made not conspicuous.

Accordingly, in the case where, on at least one surface of the base material, the groove shape, or the step difference portion of the binary pattern is concentric circularly drawn, also when the circular pattern of the step difference portion is drawn by approximating by the polygon by the electronic beam drawing apparatus, the problem of the lowering of the diffraction efficiency and the lowering of the product value can be avoided from being generated in the optical lens as the final product.

Hereupon, the specific structure of the base material, electronic beam drawing method, and electronic beam drawing apparatus, described in the present embodiment, are shown as an example of the present invention, and the present invention is not limited to this. For example, in the base material, one surface of the base material may also be the concave-like curved surface shape or plane, without being limited to the convex-like curved surface shape. Further, the diffractive structure may also be a binary pattern. Further, the base material may also be structured by the glass material. Further, for example, in the electronic beam drawing method, in a flow of a series of drawing processing shown in FIGS. 32, 35, and from FIG. 38 to FIG. 40, it may also have the structure in which, respectively, each of steps is replaced. Further, for example, in the electronic beam drawing apparatus, it may be allowed, specifically, even when it has another structure, or when it has the same function, or it is an apparatus in which a part of functions is extracted.

The Third Embodiment

Figure 41:
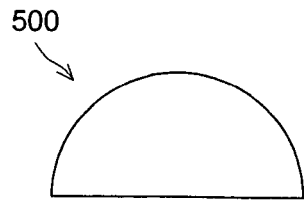
FIGS. 41(a) to 41(d) are explanatory drawings for explaining the processing sequence of the whole when a molding die for the molding is formed by using the base material according to the present invention.
Figure 41:
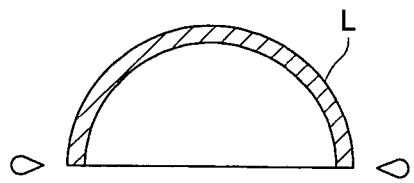
Figure 41:
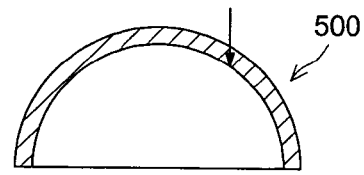
Figure 41:
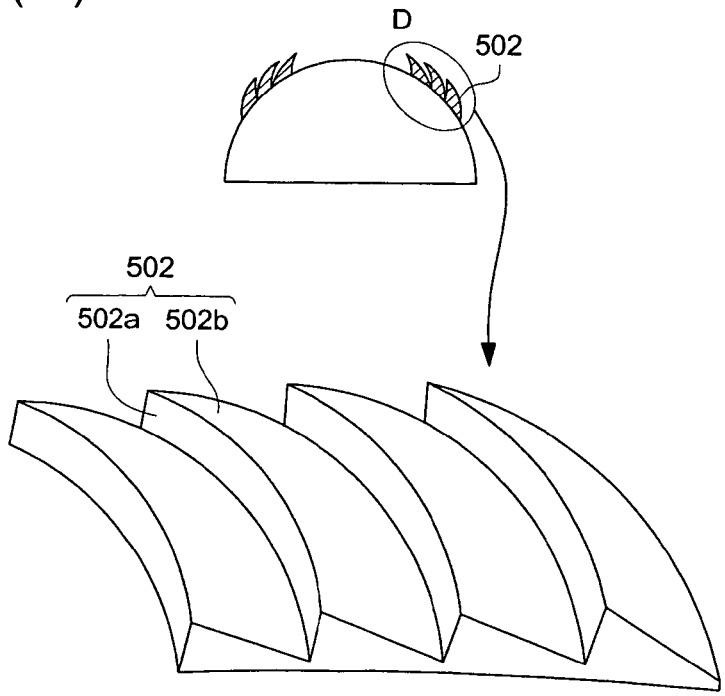
Figure 42:
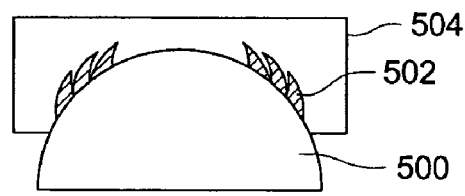
FIGS. 42(a) to 42(c) are explanatory drawings for explaining the processing sequence of the whole when a molding die for the molding is formed by using the base material according to the present invention.
Figure 42:
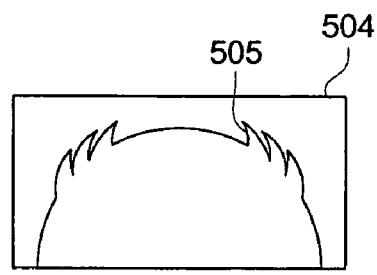
Figure 42:
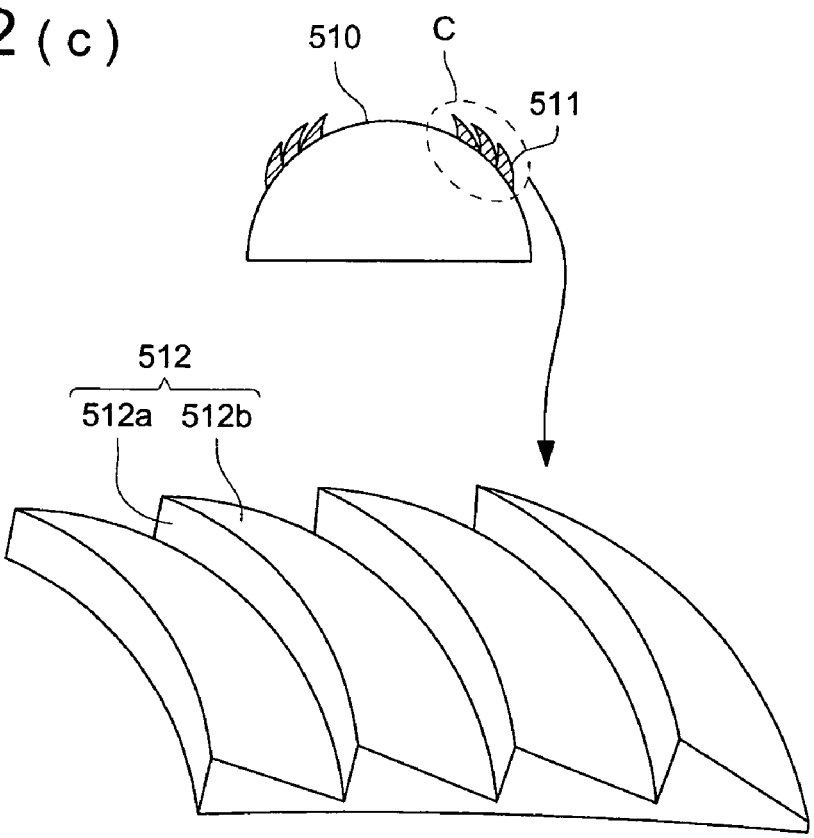

Next, referring to FIG. 41 to FIG. 42, an embodiment of the molding die according to the present invention will be described. Hereupon, in the first and second embodiments, an embodiment of the electronic beam drawing method, production method of the base material, and electronic beam drawing apparatus according to the present invention is disclosed, however, in the present embodiment, the molding die according to the present invention, specifically, a process to produce the molding die for producing the optical lens such as the optical element as the base material by the injection molding will be described.

Initially, the aspheric surface processing of the molding die (electroless Nickel or the like) is conducted by the machining (processing process). Next, as shown in FIG. 41(A), the base material 2000 having the semi-spherical surface is resin-molded by the molding die (resin molding process). Further, after the base material 500 is washed, drying is conducted.

Next, as shown in FIG. 41(B), the processing on the surface of the base material 500 of resin is conducted (resin surface processing process), specifically, the positioning of the base material 500 is conducted, and while the resist L is dropped, the spinner is rotated, and the spin coat is conducted. Further, pre-pake is also conducted.

After the spin coating, the film thickness measurement of the resist film is conducted, and the resist film is evaluated (resist film eveluation process). Then, as shown in FIG. 41(C), the positioning of the base material 500 is conducted, and while, respectively, the base material 500 is controlled in the X, Y, Z axis, as in the first to the second embodiments, the curved surface portion having a plurality of groove portions is drawn by the three-dimensional electronic beam (drawing process).

Next, the surface smoothing processing of the resist film L on the base material 500 is conducted (surface smoothing process). Further, as shown in FIG. 41(D), while positioning of the base material 200 is conducted, the development processing is conducted (development process). Furthermore, the surface hardening processing is conducted.

Next, the process to evaluate the resist shape is conducted by the SEM observation or film thickness measurement unit (resist shape evaluation process).

Further, after that, etching processing is conducted by dry etching.

In this case, when D portion of the groove portion 502 is enlarged, a plurality of groove portions formed of the inclination portion 502b and side wall portion 502a are formed. In the inclination portion of this groove portion, according to the embodiment 1, the dose amount mix area is provided between the adjoining dose amount section areas, and because, according to the dose amount mix area, the inclination step for making the step difference due to the difference of the dose amounts between the adjoining dose amount section areas the inclination surface is conducted, the gentle inclination without the step difference can be formed. Further, because the duty ratio of the first scan section in 1 pitch of the first scan section and the second scan section constituting the dose amount mix area is changed corresponding to the inclination angle of the inclination portion, even in a portion in which the inclination angle becomes steep as it goes to the peripheral portion of this groove portion, the gentle inclination without the step difference can be formed. Further, because the circle drawing processing by the embodiment 2 is conducted, when the side wall portion 502a is viewed from the above, it is the more ideal circle, and there is no case where the connect portion between fields is conspicuous.

Next, in order to make the molding die 504 for the base material 500, as shown in FIG. 42(A), after the molding die electrocasting pre-processing is conducted, the electrocasting processing is conducted, and as shown in FIG. 42(B), a processing to release the base material 500 from the molding die, is conducted. Then, for the separated molding die 504, the surface processing is conducted (molding die surface processing process). Then, the molding die 504 is evaluated.

In this case, when B portion is shown by being enlarged, in the molding die 504, the concave portion 505 is formed so that it corresponds to the groove portion of the base material 500, and in each of these concave portions 505, the inclination portion 512b is formed so that it corresponds to the inclination portion 502b of the base material 500.

In this manner, after the evaluation, by using the molding die 504, as shown in FIG. 42(C), the molded object is produced by the injection molding. After that, the molded object is evaluated.

In this case, as shown in FIG. 42(C), in the injection molded object 510 which is the final molding base material, the structure which is the same as the base material of the first to the fourth embodiment is completed, and a plurality of groove portions 511 are formed on the curved surface portion. Then, when C portion is shown by being enlarged, the groove portion formed of the side wall portion 512a and inclination portion 512b is structured, and this inclination portion 512b forms the gentle inclination having no step difference. Further, when the side wall portion 512a is viewed from the above, it becomes the more ideal circle, and the connect portion between fields is not conspicuous.

As described above, according to the present embodiment, when the optical element (for example, lens) is formed as the base material of the first to fourth embodiments, corresponding to the case where the diffraction lattice is drawn on the curved surface by using the drawing apparatus, the dose amount mix area is provided between the dose amount section areas to which the dose distribution for drawing the inclination portion of the groove portion adjoins, and according to the dose amount mix area, because the inclination-step by which the step difference due to the difference of the dose amount between adjoining dose amount section areas is made the inclination surface, is conducted, as the shape of the molding die, for the inclination portion of the groove portion, the gentle inclination having no step difference can be formed. Because the optical element can be produced by the injection molding by using the molding die, the reduction of the cost necessary for the production can be attained.

As described above, according to the electronic beam drawing method, production method of the base material, molding die for forming the base material, and electronic beam drawing apparatus in the present embodiment, when the groove portion as the diffraction lattice is formed on the base material, in order to draw the inclination surface, the dose amount mix area in which these 2 dose amounts are mixed and drawn is provided between portions drawn by 2 dose amounts which are different in the minimum dose resolving power unit, and when the inclination surface drawn according to the dose amount mix area is developed, the step difference, conventionally, due to the minimum dose resolving power which is determined by the minimum time resolving power of the D/A converter of the electronic beam drawing apparatus, is eliminated, and the gentle inclination can be formed. Further, when the molding die is produced by using this base material, because the base material can be produced by the injection molding, the reduction of the cost necessary for the production can be attained.

Hereupon, for the electronic beam drawing method, production method of the base material, molding die for forming the base material, and electronic beam drawing apparatus, their several specific embodiments are described as examples, however, they can be variously modified for the embodiments described in this description, without departing from the spirit and scope of the present invention.

For example, in the above-described embodiments, the case where the base material of the optical element of the optical lens is directly drawn, is described, however, when the forming die (molding die) for forming the optical lens of the resin by the injection molding is processed, the above-described principle, processing sequence, and processing method may also be used.

Further, in the above-described embodiment, the sequence in which the drawing of the inclination portion and side wall portion of the groove portion and the drawing by the dose amount mix area are conducted by a series of scans is described, however, not limited to such a sequence, initially, after the drawing of the groove portion is conducted, the drawing by the dose amount mix area may also be conducted.

Further, as the final molded base material, it may be allowed when it has the groove portion-like diffraction lattice on one surface and on each groove portion, has the inclination surface drawn by the above-described dose amount mix area, and it is arbitrary whether the other surface is formed as the optical element provided with the ordinary plane, or the surface having the polarizing plate function, or wavelength plate function.

Further, as the base material, it may also be allowed even when it does not have the curved surface portion, or it is the material on which the plane or inclination surface is formed.

In addition to that, not limited to the above-described electronic beam drawing apparatus, it may also be allowed even in the case where the apparatus is structured in such a manner that, by a plurality of respective electronic beams, they are respectively independent and multiple-drawings can be conducted. For example, it may also be the structure formed in such a manner that, while one drawing line on the base material is drawn, the other drawing line can be drawn.

Further, it may also be a structure in which the processing program processed in the electronic beam drawing apparatus of each embodiment described above, described processing, or the whole of the data (each kind of tables) in the memory or each part, is recorded in the information recording medium. As this information recording medium, for example, ROM, RAM, semiconductor memory such as the flash memory, and integrated circuit may be used, and further, it may be used by structuring in such a manner that the information is recorded in another medium, for example, a hard disk.

Further, various stages are included in the above-described embodiments, and by the adequate combination in the disclosed plurality of construction requirements, various inventions can be extracted. That is, it is needless to say that both of each of embodiments described above, or an example by the combination of any one of them and any one of each of modified examples is also included. In this case, even when specifically not described in the present embodiment, relating to the action and effect clear from each structure disclosed in each of embodiments and modified examples, naturally, also in the present example, the action and effect can be attained. Further, it may also be the structure in which several construction requirements are deleted from all construction requirements disclosed in the embodiments.

Then, in the description hitherto, only one example of the embodiment of the present invention is disclosed, and it can be appropriately modified and/or changed in a predetermined range, however, each embodiment is to exemplify, and not limited.

Then, as described above, according to the electronic beam drawing method, production method of the base material, molding die for forming the base material, and electronic beam drawing apparatus according to the present invention, when the groove portion as the diffraction lattice is formed on the base material, in order to draw its inclination surface, the dose amount mix area in which these 2 dose amounts are mixed and drawn between portions which are drawn by 2 dose amounts different in the minimum dose resolving power unit, is provided, and when the portion drawn according to the dose amount mix area is developed, the step difference, conventionally, due to the minimum dose resolving power determined by the minimum time resolving power of the D/A converter of the electronic beam drawing apparatus can be formed to the gentle inclination surface. Further, when the molding die is produced by using this base material, because the base material can be produced by the injection molding, the reduction of the cost necessary for the production can be attained.

Further, according to the present embodiment, when the optical element (for example, an optical lens) as the base material of the first embodiment is produced, initially, according to the method described in the first embodiment, the diffraction lattice is circularly drawn on the curved surface portion of the base material which is a base pattern, by the electronic beam drawing apparatus, and further, after the predetermined surface processing is conducted, when the etching processing is conducted by the dry etching, the basic pattern of the base material is obtained, and when the electro-casting processing is conducted on the basis of this basic pattern, the diffraction lattice formed on the surface of the base material is transferred on the molding die, and because, by using this molding die, the optical element can be produced by the injection molding, the reduction of the cost necessary for the production of the optical element can be attained.

Hereupon, in the production method of the base material described in the present embodiment, an example of the present invention is exemplified, and the present invention is not limited this. Further, other than the present invention, for example, the base material which is the basic pattern, is structured by the resin material, or glass material, when the'shape is transferred on the metallic glass, the molding die is obtained, and by using this molding die, the optical element may also be produced by the molding.

As described above, according to the electronic beam drawing method, production method of the base material, molding die for forming the base material, and electronic beam drawing apparatus, according to the present invention, in the case where the groove portion shape or the step difference portion of the binary pattern is concentric circularly drawn on at least one surface of the base material, when the circular pattern of the step difference portion is drawn by approximating by the polygon by the electronic beam drawing apparatus, initially, the dose amount is set to a value of one-predetermined number-th of the originally required dose amount, and while the polygon is shifted in the circumferential direction a predetermined number of times and at each time, when it is drawn by being superimposed, by the influence of the vicinity effect, eventually, after the development processing, the formation of the step difference portion of the ideal circular pattern closer to the circle, can be obtained, and further, in the case where the circular pattern is drawn by approximating by the polygon by the electronic beam drawing apparatus, when the section between field is set at the position which passes each apex of the polygon, because the connect portion between fields can be made non-conspicuous, it can be avoided that a problem of the lowering of the diffraction efficiency, or the lowering of the product value is generated in the optical lens which is the final product.

What is claimed is:

1. A pattern drawing method for drawing a desired pattern on a base material by irradiating an electronic beam onto the base material, said method comprising:
    scanning a first region of the base material with the electronic beam in a first dose amount;
    scanning a boundary region continuous with the first region with the electronic beam alternately in the first dose amount and in a second dose amount; and
    scanning a second region continuous with the boundary region with the electronic beam in the second dose amount.

2. The pattern drawing method of claim 1, wherein at least one surface of the base material comprises a curved surface having groove sections formed thereon with a predetermined pitch;
    wherein each groove section includes a side wall and an inclined section extending from a top of the side wall to a bottom of a side wall of an adjacent groove section; and
    wherein the inclined section comprises at least one of each of the first region, the boundary region and the second region.

3. The pattern drawing method of claim 1, wherein a difference between the fist dose amount and the second dose amount is a minimum adjustable dose amount based on a minimum clock of a D/A converter for driving an electronic beam gun for irradiating the electronic beam.

4. The pattern drawing method of claim 1, wherein in the boundary region, areas scanned with the electronic beam in the first dose amount are alternated in a sub scanning direction with areas scanned with the electronic beam in the second dose amount.

5. The pattern drawing method of claim 1, wherein in the boundary region, each of a number of areas scanned with the electronic beam in the first dose amount and a number of areas scanned with the electronic beam in the second dose amount is adjusted in accordance with a desired inclination angle.

6. The pattern drawing method of claim 1, wherein in the boundary region, a duty ratio of a first area scanned with the electronic beam in the first dose amount and a second area scanned with the electronic beam in the second dose amount within one pitch of the first area is adjusted in accordance with a desired inclination angle.

7. The pattern drawing method of claim 1, wherein in the boundary region, both (i) each of a number of first areas scanned with the electronic beam in the first dose amount and a number of second areas scanned with the electronic beam in the second dose amount, and (ii) a duty ratio of a first area scanned with the electronic beam in the first dose amount and a second area scanned with the electronic beam in the second dose amount within one pitch of the first area, are adjusted in accordance with a desired inclination angle.

8. The pattern drawing method of claim 1, wherein in the boundary region, areas scanned with the electronic beam in the first dose amount are alternated in a main scanning direction with areas scanned with the electronic bean in the second dose amount.

9. The pattern drawing method of claim 8, wherein in the boundary region, positions of the areas scanned with the electronic beam in the second dose amount in the main scanning line are staggered with respect to positions of areas scanned with the electronic beam In the second dose amount in adjacent main scanning lines.

10. The pattern drawing method of claim 8, wherein in the boundary region, the areas scanned with the electronic beam in the first dose amount are alternated on a main scanning line with the areas scanned with the electronic beam in the second dose amount.

11. The pattern drawing method of claim 10, wherein in the boundary region, positions of the areas scanned with the electronic beam in the second dose amount in the main scanning line almost align with positions of areas scanned with the electronic beam in the second dose amount in adjacent main scanning lines.

12. The pattern drawing method of claim 10, wherein in the boundary region, positions of the areas scanned with the electronic beam in the second dose amount in the main scanning line are different from positions of areas scanned with the electronic beam in the second dose amount in adjacent main scanning lines.

13. The pattern drawing method of claim 1, wherein in the boundary region, widths of areas scanned with the electronic beam in the first dose amount and widths of areas scanned with the electronic beam in the second dose amount are smaller than a diameter of the electronic beam.

14. A pattern drawing apparatus, comprising:
   a drawing section to draw a desired pattern on a base material by irradiating an electronic beam to the base material;
   a storing section to store dose amount information including a first dose amount and a second dose amount;
   a control section to control the drawing section based on the dose amount distribution information to scan a first region of the base material with the electronic beam in the first dose amount, to scan a boundary region continuous with the first region with the electronic beam alternately in the first dose amount and the second dose amount, and to scan a second region continuous with the boundary region with the electronic beam in the second dose amount.

15. The pattern drawing apparatus of claim 14, wherein the storing section stores information corresponding to a shape of the base material; and
   wherein the pattern drawing apparatus further comprises a calculating section to calculate the dose amount distribution information for the boundary region based on the information corresponding to the shape of the base material.

16. The pattern drawing apparatus of claim 14, wherein the drawing section comprises:
   an electronic beam emitting section to emit an electronic beam;
   an electronic lens to adjust a focus point of the electronic beam;
   a stand to support the base material; and
   a measuring section to measure a drawing position on the base material;
   wherein the control section controls the focus point of the electronic beam in accordance with the drawing position by adjusting an electric current of the electronic lens.

17. The pattern drawing apparatus of claim 14, wherein a difference between the fist dose amount and the second dose amount is a minimum adjustable dose amount based on a minimum clock of a D/A converter for driving an electronic beam gun for irradiating the electronic beam.

* * * * *